United States Patent
Zhu et al.

(10) Patent No.: US 11,754,442 B2
(45) Date of Patent: Sep. 12, 2023

(54) LIGHT-RECEIVING APPARATUS WITH CYCLE SETTING ACCORDING TO PHOTON COUNT DETERMINATIONS

(71) Applicant: Sony Semiconductor Solutions Corporation, Kanagawa (JP)

(72) Inventors: Hongbo Zhu, Tokyo (JP); Kazuki Hizu, Kanagawa (JP); Takafumi Takatsuka, Kanagawa (JP); Yusuke Oike, Kanagawa (JP); Jun Ogi, Kanagawa (JP); Yoshiaki Tashiro, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/428,408

(22) PCT Filed: Mar. 6, 2020

(86) PCT No.: PCT/JP2020/009871
§ 371 (c)(1),
(2) Date: Aug. 4, 2021

(87) PCT Pub. No.: WO2020/179928
PCT Pub. Date: Sep. 10, 2020

(65) Prior Publication Data
US 2022/0155153 A1    May 19, 2022

(30) Foreign Application Priority Data

Mar. 7, 2019 (JP) .................................. 2019-041786
Mar. 5, 2020 (JP) .................................. 2020-038225

(51) Int. Cl.
*G01J 1/44*     (2006.01)
*G01J 11/00*   (2006.01)
(Continued)

(52) U.S. Cl.
CPC ................. *G01J 1/44* (2013.01); *G01J 11/00* (2013.01); *H01L 31/02027* (2013.01);
(Continued)

(58) Field of Classification Search
CPC ............ H01L 31/07; H01L 31/021161; H01L 31/02327; H01L 31/035272;
(Continued)

(56) References Cited

U.S. PATENT DOCUMENTS

2010/0181491 A1    7/2010 Karim
2012/0057059 A1    3/2012 Eldesouki et al.
(Continued)

FOREIGN PATENT DOCUMENTS

CN    103402059 A    11/2013
CN    104702861 A    6/2015
(Continued)

OTHER PUBLICATIONS

International Search Report (PCI/ISA/210), International Application No. PCT/JP2020/009871, dated May 27, 2020.
(Continued)

*Primary Examiner* — Jennifer D Bennett
(74) *Attorney, Agent, or Firm* — Michael Best & Friedrich LLP

(57) ABSTRACT

A light-receiving apparatus (1a) includes a counting unit (11), a setting unit (12), and an acquiring unit (13). The counting unit is configured to measure a detection number of times that represents the number of times incidence of a photon to a light-receiving element has been detected within an exposure period and to output a counted value. The setting unit is configured to set a cycle of updating time information in accordance with an elapsed time during the exposure period. The acquiring unit is configured to acquire
(Continued)

the time information indicating a time at which the counted value reaches a threshold before the exposure period elapses.

20 Claims, 82 Drawing Sheets

(51) Int. Cl.
    *H03K 23/58*     (2006.01)
    *H01L 31/02*     (2006.01)
    *G02B 5/20*     (2006.01)

(52) U.S. Cl.
    CPC ........ *H03K 23/58* (2013.01); *G01J 2001/448* (2013.01); *G02B 5/20* (2013.01)

(58) Field of Classification Search
    CPC ......... H01L 31/02027; H01L 27/14627; H01L 27/1464; H01L 27/1461; H01L 27/1463; H01L 27/14623; H04N 5/37455; G01J 11/00; G01J 1/44; G01J 2001/448; H03K 23/58; G02B 5/20; G01S 7/4816; G01S 17/08; G01S 17/89; G01S 17/931

See application file for complete search history.

(56) References Cited

U.S. PATENT DOCUMENTS

| | | |
|---|---|---|
| 2012/0057152 A1 | 3/2012 | Eldesouki et al. |
| 2012/0075615 A1* | 3/2012 | Niclass .................. G01S 7/489 |
| | | 356/5.01 |
| 2015/0163429 A1 | 6/2015 | Dai et al. |
| 2020/0036918 A1* | 1/2020 | Ingle ................. H01L 27/14625 |
| 2021/0051279 A1* | 2/2021 | Tochigi ............. H01L 27/14643 |

FOREIGN PATENT DOCUMENTS

| | | |
|---|---|---|
| CN | 108291961 A | 7/2018 |
| JP | 2014081253 A | 5/2014 |
| JP | 2019009768 A | 1/2019 |
| WO | 2017/042993 A1 | 3/2017 |

OTHER PUBLICATIONS

Notification of Transmittal of the International Search Report and the Written Opinion of the International Searching Authority, or the Declaration (PCT/ISA/220), International Application No. PCT/JP2020/009871, dated Jun. 9, 2020.
Written Opinion of the International Search Authority (PCT/ISA/237), International Application No. PCT/JP2020/009871, dated Jun. 9, 2020.
Chinese Office Action for related Chinese Application No. 202080013323.8 dated May 27, 2023.

* cited by examiner

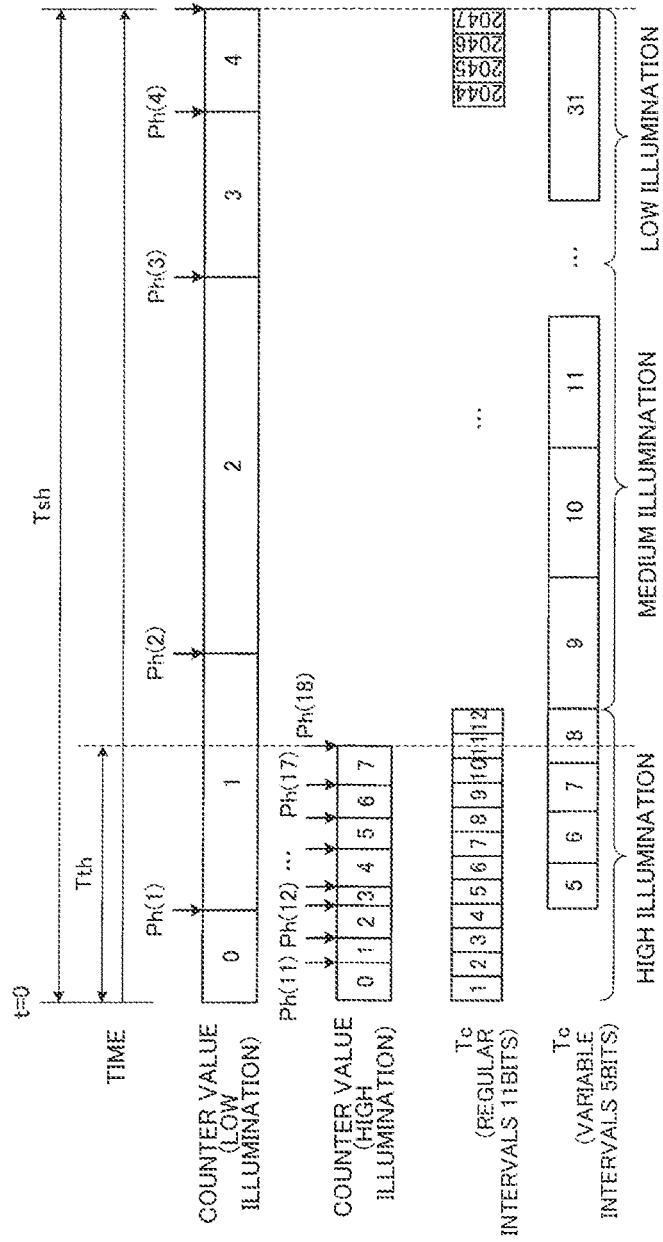

LIGHT-RECEIVING APPARATUS WITH CYCLE SETTING ACCORDING TO PHOTON COUNT DETERMINATIONS

TECHNICAL FIELD

The present invention relates to a light-receiving apparatus.

BACKGROUND ART

A photon measurement sensor that counts photons incident to a photoelectric conversion element is known. In addition, in a photon measurement sensor, a configuration for performing a count for each incident photon is known. As a method of enlarging a dynamic range of such a photon measurement sensor, a method of converting a luminance value using a time at which a count number has reached a threshold is effective and luminance value prediction using time information is being proposed.

CITATION LIST

Patent Literature

[PTL 1]
US 2012/0057059A1
[PTL 2]
US 2015/0163429A1

SUMMARY

Technical Problem

However, with the method of making a prediction based on the time at which a count number of a photon has reached a threshold, a long shutter time must be set aside in order to enable measurement when dark. Therefore, the number of bits of a memory for storing time information increases and, accordingly, circuit area increases.

An object of the present disclosure is to provide a light-receiving apparatus capable of reducing the number of bits when performing photon measurement.

Solution to Problem

A light-receiving apparatus according to the present disclosure includes: a counting unit configured to measure a detection number of times that represents the number of times incidence of a photon to a light-receiving element has been detected within an exposure period and to output a counted value; a setting unit configured to set a cycle of updating time information in accordance with an elapsed time during the exposure period; and an acquiring unit configured to acquire the time information indicating a time at which the counted value reaches a threshold before the exposure period elapses.

BRIEF DESCRIPTION OF DRAWINGS

FIG. 3 is a diagram for schematically explaining generation of a time code Tc by a time code generating unit according to the first embodiment.

DESCRIPTION OF EMBODIMENTS

Hereinafter, embodiments of the present disclosure will be described in detail based on the accompanying drawings. It should be noted that, in the following embodiments, same or similar parts will be denoted by similar reference signs and redundant descriptions thereof will be omitted.

Figure 1:
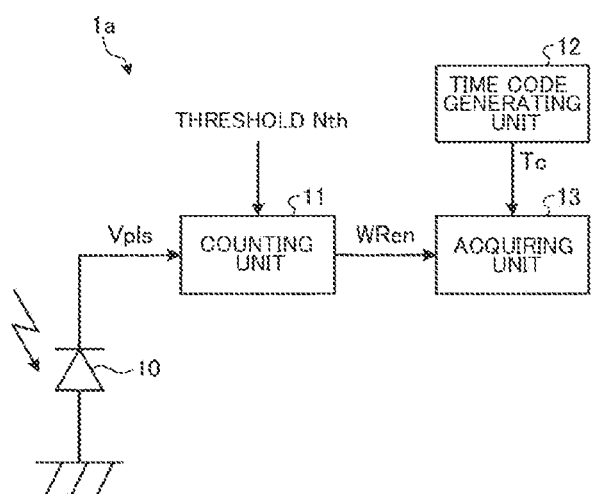
FIG. 1 is a diagram showing a schematic configuration example of a light-receiving apparatus according to a first embodiment.

Hereinafter, embodiments of the present disclosure will be described in the following order.
1. First Embodiment
1-1. Outline of first embodiment
1-2. Configuration applicable to first embodiment
1-3. Processing for generating time code Tc according to first embodiment
1-4. Configuration example of counter applicable to first embodiment
1-4-1. First example of counter
1-4-2. Second example of counter
1-4-3. Third example of counter
1-4-4. Fourth example of counter
1-4-5. Fifth example of counter
1-4-6. Sixth example of counter
1-4-7. Seventh example of counter
1-4-8. Eighth example of counter
1-4-9. Ninth example of counter
1-4-10. Tenth example of counter
1-5. Arrangement of TC generating unit and pixel circuit applicable to first embodiment
1-5-1. First arrangement example according to first embodiment
1-5-2. Second arrangement example according to first embodiment
1-5-3. Third arrangement example according to first embodiment
1-5-4. Fourth arrangement example according to first embodiment 1-5-5. Fifth arrangement example according to first embodiment
1-5-6. Sixth arrangement example according to first embodiment
1-6. First modification of first embodiment
1-7. Second modification of first embodiment
1-8. Third modification of first embodiment
1-9. Data processing applicable to first embodiment and respective modifications thereof
2. Second Embodiment
2-1. Outline of configuration applicable to second embodiment
2-2. Explanation of principle of second embodiment
2-3. Arrangement of LC generating unit and pixel circuit applicable to second embodiment
2-3-1. First arrangement example according to second embodiment
2-3-2. Second arrangement example according to second embodiment
2-3-3. Third arrangement example according to second embodiment
2-3-4. Fourth arrangement example according to second embodiment
2-3-5. Fifth arrangement example according to second embodiment
2-3-6. Sixth arrangement example according to second embodiment
2-4. First modification of second embodiment
2-5. Second modification of second embodiment
2-6. Third modification of second embodiment
2-7. Fourth modification of second embodiment
3. Third Embodiment
4. Fourth Embodiment
4-1. First example according to fourth embodiment
4-2. Second example according to fourth embodiment
4-3. Third example according to fourth embodiment
4-4. Fourth example according to fourth embodiment
4-5. Fifth example according to fourth embodiment
4-6. Sixth example according to fourth embodiment
5. Fifth Embodiment
5-1. First modification of fifth embodiment
5-2. Second modification of fifth embodiment
5-2-1. Output of photoelectric conversion element
5-2-2. First example of configuration of synthesizing unit
5-2-3. Second example of configuration of synthesizing unit
5-2-4. Third example of configuration of synthesizing unit
5-2-5. Fourth example of configuration of synthesizing unit
5-2-6. Fifth example of configuration of synthesizing unit
5-2-7. Sixth example of configuration of synthesizing unit
5-2-8. Seventh example of configuration of synthesizing unit
5-2-9. Eighth example of configuration of synthesizing unit
6. Sixth Embodiment
7. Seventh Embodiment 1. First Embodiment 1-1. Outline of First Embodiment A first embodiment of the present disclosure will now be described. FIG. 1 is a diagram showing a schematic configuration example of a light-receiving apparatus according to the first embodiment. In FIG. 1, a light-receiving apparatus 1a according to the first embodiment includes a pixel 10, a counting unit 11, a time code generating unit 12, and an acquiring unit 13. The light-receiving apparatus 1a counts the number of photons that are incident to the pixel 10 within a designated exposure period Tsh (for example, a shutter period). Based on a counted photon number, illuminance in the exposure period Tsh can be obtained.

The pixel 10 converts incident light into an electric signal by photoelectric conversion and outputs the converted electric signal. More specifically, the pixel 10 includes a photoelectric conversion element that converts light into an electric charge by photoelectric conversion and a signal processing circuit that reads the electric charge from the photoelectric conversion element and outputs the read electric charge as an electric signal. In the present disclosure, the pixel 10 converts a photon incident to the photoelectric conversion element into an electric signal and outputs a pulse Vpls in accordance with the incidence of the photon. In the present disclosure, a single photon avalanche diode is used as the photoelectric conversion element included in the pixel 10. Hereinafter, a single photon avalanche diode will be referred to as a SPAD. A characteristic of a SPAD is that when a negative voltage large enough to generate avalanche multiplication is applied to a cathode, an electron generated in accordance with incidence of one photon causes avalanche multiplication and a large current flows. Utilizing this characteristic of a SPAD enables the incidence of one photon to be detected with high sensitivity.

Hereinafter, unless otherwise noted, "an incidence of a photon to the photoelectric conversion element included in the pixel 10" will be described "an incidence of a photon to the pixel 10".

The counting unit 11 counts the pulse Vpls output from the pixel 10 within a designated exposure period Tsh. For example, the counting unit 11 starts counting the pulse Vpls at a start time point of the exposure period Tsh. The counting unit 11 outputs a write signal WRen that instructs the number Ncnt of the counted pulse Vpls to be written at a predetermined timing. For example, the counting unit 11 outputs the write signal WRen that instructs writing when the number Ncnt exceeds a threshold Nth before the exposure period Tsh ends. In addition, for example, the counting unit 11 outputs the write signal WRen that instructs writing at an end time point of the exposure period Tsh when the number Ncnt does not exceed the threshold Nth even at the end of the exposure period Tsh.

Hereinafter, the write signal WRen that instructs writing will be described as a write signal WRen(W).

The write signal WRen is supplied to the acquiring unit 13. For example, a default state of the write signal WRen is a low state, and the acquiring unit 13 is instructed to perform writing when a transition is made from the low state to a high state.

On the other hand, the time code generating unit 12 generates a time code Tc which is initialized at a start timing of the exposure period Tsh and of which a value varies depending on a cycle of a designated sampling frequency. For example, with a value of "0" as an initial value, the time code generating unit 12 generates the time code Tc of which the value increases by 1 every cycle. The time code Tc generated by the time code generating unit 12 is supplied to the acquiring unit 13.

The cycle of the designated sampling frequency at which the time code Tc is generated is, in other words, a cycle at which the time code Tc is updated. Hereinafter, this cycle will be referred to as an update cycle.

For example, the acquiring unit 13 includes a memory, acquires the time code Tc having been supplied from the time code generating unit 12 at timing where the write signal WRen had made a transition from the low state to the high state, and writes the acquired time code Tc into the memory.

Figure 2A:
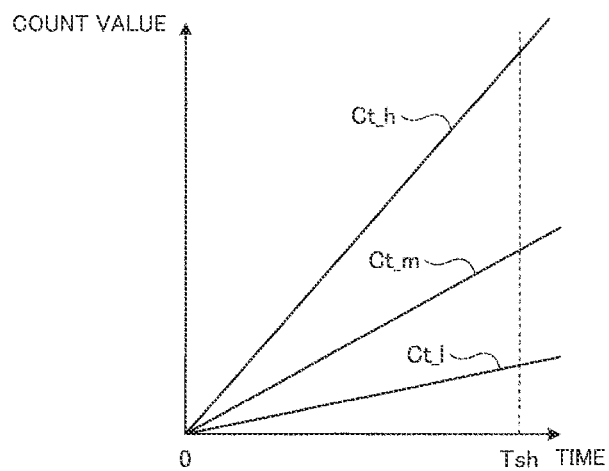
FIG. 2A is a diagram for explaining prediction of a photon number that is applicable to the first embodiment.
Figure 2B:
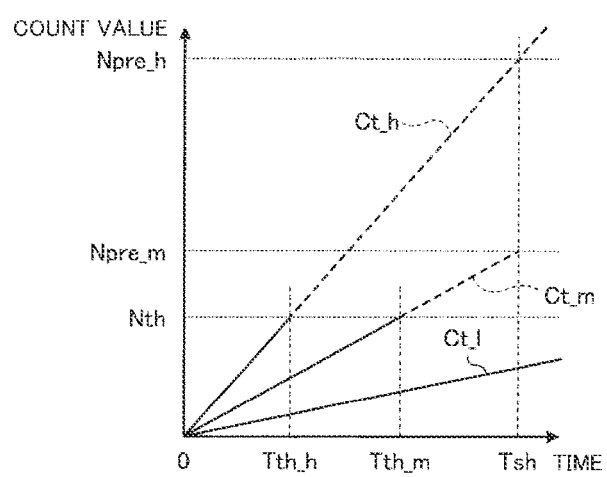
FIG. 2B is a diagram for explaining prediction of a photon number that is applicable to the first embodiment.

Based on the time code Tc and the threshold Nth, the number of photons to be incident with respect to the pixel 10 during the exposure period Tsh can be predicted. FIGS. 2A and 2B are diagrams for explaining prediction of a photon number that is applicable to the first embodiment. FIG. 2A is a diagram showing an example of a relationship between a count value of a photon number and time. When illuminance is constant within the exposure period Tsh, the count value varies in a relationship of a linear function with respect to time. Let us consider a straight line Ct_m that indicates a time transition of the count value in FIG. 2A in a case illuminance is more or less medium (medium illumination). A straight line Ct_h that indicates a time transition of the count value when the illumination is higher than medium illumination (high illumination) has a steeper gradient than the straight line Ct_m. On the other hand, a straight line Ct_l that indicates a time transition of the count value when the illumination is lower than medium illumination (low illumination) has a more gradual gradient than the straight line Ct_m.

FIG. 2B is a diagram showing an example of a case where the threshold Nth is added to FIG. 2A described above. In FIG. 2B, times at which the count value reaches the threshold Nth at high illumination and medium illumination are respectively represented by a time Tth_h and a time Tth_m. Since the count value has a relationship of a linear function with respect to time, count values at high illumination and medium illumination during the exposure period Tsh can be predicted based on the threshold Nth, the time Tth_h, and the time Tth_m. Hereinafter, count values having been predicted with respect to high illumination and medium illumination will be respectively denoted as predicted count values Npre_h and Npre_m.

In principle, the predicted count value Npre when a count value reaches the threshold Nth after a time Tth has elapsed after the start time point of the exposure period Tsh can be calculated according to equation (1) below.

$$Npre = Nth \times (Tsh/Tth) \quad (1)$$

Therefore, the predicted count values Npre_h and Npre_m in the case of high illumination and medium illumination described above can be calculated using equations (2) and (3) below.

$$Npre\_h = Nth \times (Tsh/Tth\_h) \quad (2)$$

$$Npre\_m = Nth \times (Tsh/Tth\_m) \quad (3)$$

On the other hand, in the example shown in FIG. 2B, the straight line Ct_l has not reached the threshold Nth within the exposure period Tsh. In this case, the count value at the end time point of the exposure period Tsh can be assumed to be a predicted count value Npre_l based on the straight line Ct_l.

In addition, in the state shown in FIG. 2B, at a time point where the count value reaches the threshold Nth, counting by the counting unit 11 can be aborted. In the example shown in FIG. 2B, as indicated by dotted lines denoted by straight lines Ct_h' and Ct_m', counting by the counting unit 11 after a time at which the respective count values reach the threshold Nth is aborted.

In FIGS. 2A and 2B, illumination of a region (including the straight line Ct_h) between a Y axis (an axis of the count value) and the straight line Ct_h is assumed to be high illumination, illumination of a region (including the straight line Ct_m) between the straight line Ct_h and the straight line Ct_m is assumed to be medium illumination, and a region between the straight line Ct_m and an X axis (an axis of time) is assumed to be low illumination.

In this case, the straight line Ct_h in FIG. 2A and the time Tth_h in FIG. 2B indicate a boundary between high illumination and medium illumination, and the straight line Ct_m in FIG. 2A and the time Tth_m in FIG. 2B indicate a boundary between medium illumination and low illumination. In descriptions both above and hereinafter, high illumination will be representatively shown by the straight line Ct_h or the time Tth_h and medium illumination will be representatively shown by the straight line Ct_m or the time Tth_m. In a similar manner, the predicted count values Npre_h and Npre_m respectively representatively show the predicted count value Npre at high illumination and medium illumination.

In other words, in FIG. 2B, when the count value reaches the threshold Nth within the time Tth_h from the start time point of the exposure period Tsh, high illumination is assumed. After the time Tth_h elapses from the start time point of the exposure period Tsh, when the count value reaches the threshold Nth within the time Tth_m after exceeding the time Tth_h, medium illumination is assumed. In addition, after the time Tth_m elapses from the start time point of the exposure period Tsh, when the count value reaches the threshold Nth before the end time point of the exposure period Tsh after exceeding the time Tth_m or when the count value does not reach the threshold Nth even after the end time point of the exposure period Tsh arrives, low illumination is assumed.

The acquiring unit 13 acquires the time Tth_h or the time Tth_m as the time code Tc from the time code generating unit 12 and writes the time code Tc into the memory. Since the threshold Nth and the exposure period Tsh are, for example, designated and fixed values, by reading the time Tth_h or the time Tth_m from the memory and executing a calculation in accordance with equation (1) described above, the predicted count value Npre_h or the predicted count value Npre_m can be calculated.

In this case, at high illumination, the number of photons incident to the pixel 10 per unit time is larger than at low illumination. Therefore, in the time code generating unit 12, the update cycle can conceivably be determined in accordance with the number of photons incident to the pixel 10 per unit time at high illumination. Accordingly, counting of a photon number at high illumination can be executed with high accuracy.

As shown in FIG. 2B, in the case of low illumination, counting of a photon number must be performed until the exposure period Tsh ends. On the other hand, in the case of high illumination, since the counted photon number reaches the threshold Nth at the time Tth_h before the exposure period Tsh ends, counting after the time Tth_h can be aborted. Therefore, performing counting of photon numbers according to a same update cycle at both low illumination and high illumination throughout the exposure period Tsh results in performing wasteful counting particularly at low illumination. For example, the number of bits of a memory for writing the time code Tc that is included in the acquiring unit 13 increases.

In consideration thereof, in the first embodiment, the update cycle at which the time code generating unit 12 generates the time code Tc is made variable and the update cycle is changed in accordance with an elapsed time in the exposure period Tsh. More specifically, the time code generating unit 12 sets a shortest update cycle at the start time point of the exposure period Tsh and extends the update cycle in accordance as time elapses from the start time point towards the end time point of the exposure period Tsh. Accordingly, a time interval at which the time code Tc changes can be extended in accordance as time elapses in the exposure period Tsh.

FIG. 3 is a diagram for schematically explaining generation of the time code Tc by the time code generating unit 12 according to the first embodiment. In FIG. 3, the passage of time, an example of a count value in the case of low illumination, an example of a count value in the case of high illumination, an example of the time code Tc in the case of regular intervals, and an example of the time code Tc in the case of variable intervals are respectively shown from top to bottom. In this case, for the sake of description, it is assumed that the counter included in the counting unit 11 is a 3-bit counter and that the threshold Nth is 8. In other words, when the photon number detected in the pixel 10 reaches 8, the counter of the counting unit 11 overflows.

In the case of low illumination, there is a possibility that the count value does not exceed the threshold Nth within the exposure period Tsh. In the example shown in FIG. 3, at low illumination, four photons Ph(1) to Ph(4) are counted within the exposure period Tsh and the photon number does not reach the threshold Nth.

On the other hand, in FIG. 3, in the case of high illumination, seven photons Ph(11), Ph(12), . . . , Ph(17) are counted within the exposure period Tsh and the counter overflows upon a time point of a next detection of an eighth photon Ph(18). Therefore, the timing of detection of the eighth photon Ph(18) is the time Tth at which the count value exceeds the threshold Nth. When the counter overflows, using the write signal WRen, the counting unit 11 instructs the acquiring unit 13 to write the time code Tc having been generated by the time code generating unit 12.

A case where the time code generating unit 12 generates the time code Tc at regular intervals according to a constant update cycle will now be considered. In the example shown in FIG. 3, the time code Tc is reset at the start time point of the exposure period Tsh, the time code Tc is generated at regular intervals as the exposure period Tsh elapses, and the time code Tc with a value of "2047" is generated at the end time point of the exposure period Tsh. In other words, the counting unit 11 has a counter that is capable of counting 11 bits.

In this case, at high illumination, the time code Tc corresponding to the time Tth has a value of "11" and the value "11" is written into the memory by the acquiring unit 13. On the other hand, in the case of low illumination at which the count value does not reach the threshold Nth within the exposure period Tsh, counting must be continued until the end time point of the exposure period Tsh. In this case, a value of "2047" of the time code Tc at the end time point of the exposure period Tsh is to be written into the memory by the acquiring unit 13. Therefore, when the time code generating unit 12 generates the time code Tc at regular intervals in the example shown in FIG. 3, the acquiring unit 13 requires a memory having a bit width of 11 bits.

By comparison, in the first embodiment, the time code generating unit 12 changes the update cycle in accordance as the exposure period Tsh elapses and generates the time code Tc at variable intervals. In this case, the time code generating unit 12 generates the time code Tc at a shortest update cycle within the exposure period Tsh at the start time point of the exposure period Tsh. The update cycle is extended as the exposure period Tsh elapses, and the time code Tc is generated at a longest update cycle within the exposure period Tsh at the end time point of the exposure period Tsh.

More specifically, the time code generating unit 12 according to the first embodiment classifies illumination into, for example, three stages including high illumination, medium illumination, and low illumination, and generates the time code Tc at intervals in accordance with respectively different update cycles. In other words, if the update cycles corresponding to high illumination, medium illumination, and low illumination are respectively denoted by update cycles $f_h$, $f_m$, and $f_l$, the update cycles $f_h$, $f_m$, and $f_l$ have a relationship expressed as $f_h > f_m > f_l$.

The time code generating unit 12 generates the time code Tc at intervals according to the update cycle $f_h$ at high illumination from the start time point of the exposure period Tsh to a first time point of the exposure period Tsh. The time code generating unit 12 generates the time code Tc at intervals according to the update cycle $f_m$ at medium illumination from the first time point to a second time point at which a predetermined time has lapsed from the first time point. Furthermore, the time code generating unit 12 generates the time code Tc at intervals according to the update cycle $f_l$ at low illumination from the second time point to the end time point of the exposure period Tsh.

In the example shown in FIG. 3, the time code generating unit 12 according to the first embodiment resets the time code Tc at the start time point of the exposure period Tsh, assigns values "1" to "8" of the time code Tc to high illumination, assigns values "9" to "16" of the time code Tc to medium illumination, and assigns values "17" to "31" of the time code Tc to low illumination. In this manner, by making the update cycle f for generating the time code Tc variable, the memory included in the acquiring unit 13 only needs to have a bit width of, for example, 5 bits.

Specifically, in the example shown in FIG. 3, at high illumination, the time code Tc corresponding to the time Tth has a value of "8" and the value "8" is written into the memory by the acquiring unit 13. On the other hand, at low illumination, while counting is continued until the end time point of the exposure period Tsh, since the intervals of the time code Tc is longer than at high illumination, the value "31" of the time code Tc at the end time point of the exposure period Tsh is written into the memory of the acquiring unit 13.

According to equation (1) described earlier, the predicted count value Npre increases rapidly as the time Tth that represents an elapsed time from the start time point of the exposure period Tsh approaches 0 and becomes positive infinity when the time Tth is 0. Therefore, during a period in which the time Tth is extremely short, the predicted count value Npre assumes an extremely large value and the predicted count value Npre within the period assumes a realistically meaningless value. This means that the time code Tc during this period is unnecessary. Therefore, the time code generating unit 12 preferably sets a shortest update cycle at a time point where a predetermined time has elapsed from the start time point of the exposure period Tsh and extends the update cycle in accordance as time elapses from the time point towards the end time point of the exposure period Tsh. The predetermined time for setting the update cycle can be, for example, a time where it is presumed that the predicted count value Npre corresponding to predetermined illumination (for example, desired maximum illumination) is obtained after the start of the exposure period Tsh.

In the example shown in FIG. 3, for example, the time code generating unit 12 ignores time codes Tc with a smaller value than "5" among the time codes Tc at variable intervals that are shown at the bottom. The time code generating unit 12 is not limited thereto and may start generation of the time code Tc from a position of the time code Tc="5". For example, the time code generating unit 12 sets a shortest update cycle at a time point where the predetermined time described above has elapsed from the start time point of the exposure period Tsh and extends the update cycle in accordance as time elapses from the time point towards the end time point of the exposure period Tsh.

As described above, in the light-receiving apparatus 1a according to the first embodiment, the time code Tc that is acquired when the photon number detected in the pixel 10 reaches the threshold Nth within the exposure period Tsh is generated at intervals in accordance with the update cycle that changes as the exposure period Tsh elapses. Therefore, a bit width of the memory into which the time code Tc is to be written can be kept small. Accordingly, a circuit area can be reduced.

1-2. Configuration Applicable to First Embodiment

Figure 4:
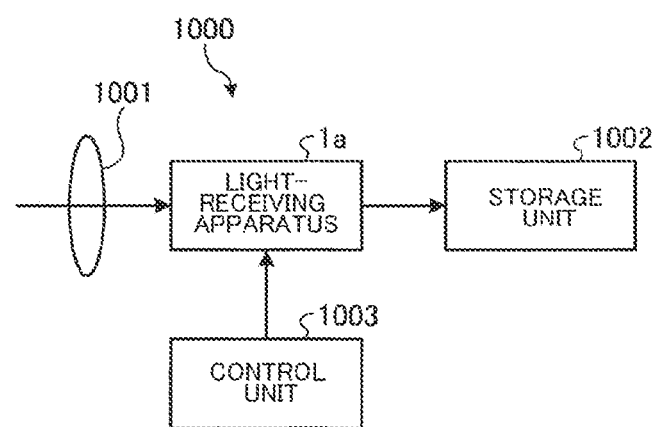
FIG. 4 is a block diagram schematically showing an example configuration of an electronic device to which the light-receiving apparatus according to the first embodiment has been applied.

Next, an example of a configuration that is applicable to the light-receiving apparatus 1a according to the first embodiment will be described. FIG. 4 is a block diagram schematically showing an example configuration of an electronic device to which the light-receiving apparatus 1a according to the first embodiment has been applied. In FIG. 4, an electronic device 1000 includes an optical system including a lens 1001, the light-receiving apparatus 1a, a storage unit 1002, and a control unit 1003. The optical system guides light incident to the lens 1001 to a light-receiving surface of the pixel 10 in the light-receiving apparatus 1a.

The storage unit 1002 includes a storage medium such as a memory that stores data and a control unit that controls read and write with respect to the storage medium. The storage unit 1002 stores output data that is output from the light-receiving apparatus 1a.

The control unit 1003 controls the light-receiving apparatus 1a and causes the light-receiving apparatus 1a to execute an operation for outputting the output data described above. For example, the control unit 1003 is capable of indicating the start time point and the end time point of the exposure period Tsh (a length of the exposure period Tsh) to the light-receiving apparatus 1a. In addition, for example, the control unit 1003 is capable of outputting a reference signal with respect to the update cycle for generating the time code Tc to the light-receiving apparatus 1a. Furthermore, for example, the control unit 1003 is capable of indicating a timing for switching the intervals of the time code Tc among high illumination, medium illumination, and low illumination to the light-receiving apparatus 1a.

Figure 5:
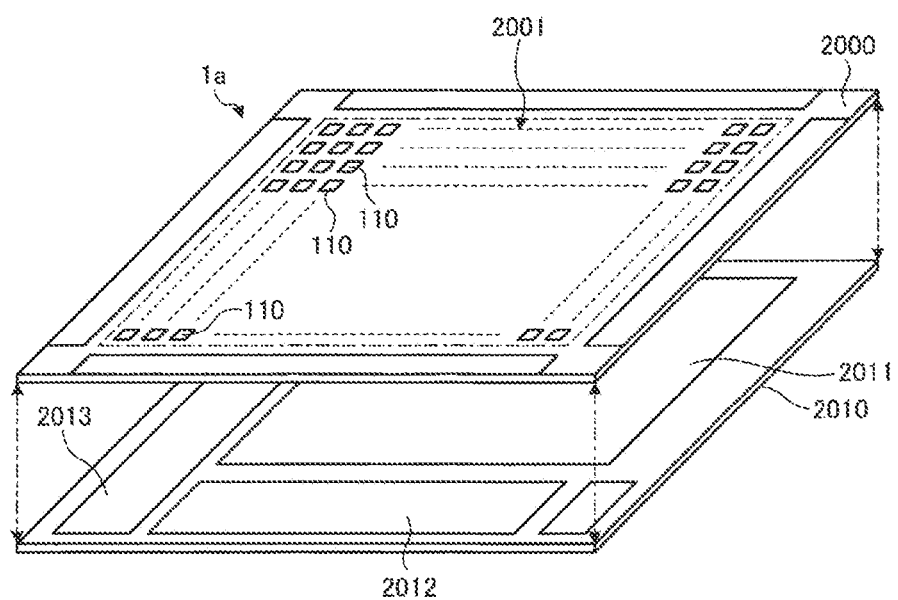
FIG. 5 is a schematic diagram showing an example of a configuration of a device that is applicable to the light-receiving apparatus according to the first embodiment.

FIG. 5 is a schematic diagram showing an example of a configuration of a device that is applicable to the light-receiving apparatus 1a according to the first embodiment. In FIG. 5, the light-receiving apparatus 1a is constructed by stacking a light-receiving chip 2000 and a logic chip 2010 which are respectively made of semiconductor chips. It should be noted that FIG. 5 shows the light-receiving chip 2000 and the logic chip 2010 being separated from each other for the sake of description.

The light-receiving chip 2000 includes a pixel array unit 2001 made by, for example, arranging a plurality of photoelectric conversion elements 110 included on a one-to-one basis in a plurality of pixels 10 in a two-dimensional grid pattern. The logic chip 2010 is provided with a logic array unit 2011 including a signal processing unit that processes a signal acquired by the photoelectric conversion element 110.

Each circuit included in the light-receiving chip 2000 and each circuit included in the logic chip 2010 are electrically connected by a CCC (Copper-Copper Connection) or the like. The logic chip 2010 may be further provided with, in close proximity to the logic array unit 2011, a storage unit 2012 that stores a signal acquired by the photoelectric conversion element 110 and an element control unit 2013 that controls an operation as the light-receiving apparatus 1a.

In this case, a CCC refers to a connection mode in which the light-receiving chip 2000 and the logic chip 2010 are electrically connected to each other by directly joining a partial wiring included in a wiring layer of the light-receiving chip 2000 and a partial wiring included in a wiring layer of the logic chip 2010 with each other. The wiring in this case can be formed of a conductive material such as metal of which an example is copper.

The connection mode between the light-receiving chip 2000 and the logic chip 2010 is not limited to a CCC. For example, the light-receiving chip 2000 and the logic chip 2010 can also be connected to each other by a bump connection or a through electrode.

Objects of the electrical connection between the light-receiving chip 2000 and the logic chip 2010 include transmission of a pixel signal generated by the light-receiving chip 2000 to the logic chip 2010 and supplying externally-applied power into the light-receiving chip 2000 and the logic chip 2010.

For example, externally-applied power is supplied to the wiring layer of the light-receiving chip 2000 via a bonding pad (an extractor electrode) that is provided outside of the pixel array unit 2001 in the light-receiving chip 2000. The wiring layer of the light-receiving chip 2000 and the wiring layer of the logic chip 2010 are directly connected to each other by a connecting portion such as the CCC described above and power is supplied to the logic chip 2010 from the light-receiving chip 2000.

While a connecting portion that provides electrical connection between the light-receiving chip 2000 and the logic chip 2010 is described above as being provided with respect to the pixel 10 on a one-to-one basis, a configuration of the connecting portion is not limited to this example. For example, a configuration in which one connecting portion is provided with respect to a plurality of pixels 10 or a configuration in which a plurality of connecting portions are provided with respect to one pixel 10 may be adopted.

In addition to controlling the logic array unit 2011, the element control unit 2013 may be arranged in a vicinity of, for example, the photoelectric conversion element 110 for other driving or controlling purposes. In addition to the arrangement shown in FIG. 5, the element control unit 2013 may be provided so as to have an arbitrary function in an arbitrary region of the light-receiving chip 2000 and the logic chip 2010.

While only the photoelectric conversion element 110 among the respective elements included in the pixel 10 is described above as being arranged on the light-receiving chip 2000, the configuration of the light-receiving chip 2000 is not limited thereto. Specifically, a signal processing circuit that converts an electric charge having been read from the photoelectric conversion element 110 into an electric signal may be further arranged on the light-receiving chip 2000. Furthermore, a circuit that subjects an electric signal output from the signal processing circuit to another type of signal processing may be further arranged on the light-receiving chip 2000.

Figure 6:
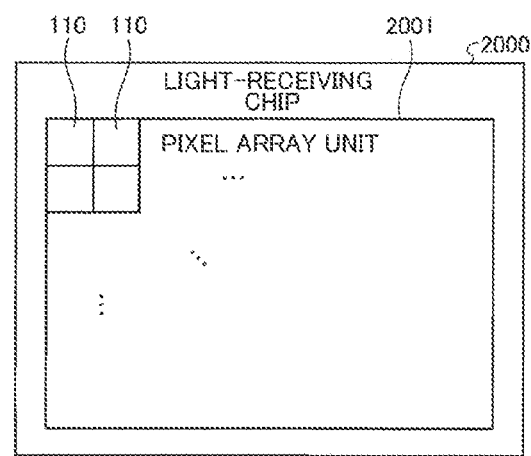
FIG. 6 is a plan view showing an example configuration of a light-receiving chip that is applicable to the first embodiment.

Next, more specific configuration examples of the light-receiving chip 2000 and the logic chip 2010 will be described using FIGS. 6 and 7. FIG. 6 is a plan view showing an example configuration of the light-receiving chip 2000 that is applicable to the first embodiment. The light-receiving chip 2000 is provided with the pixel array unit 2001, and the pixel array unit 2001 is provided with a plurality of photoelectric conversion elements 110 arranged in a two-dimensional grid pattern. Details of the photoelectric conversion element 110 will be given later.

Figure 7:
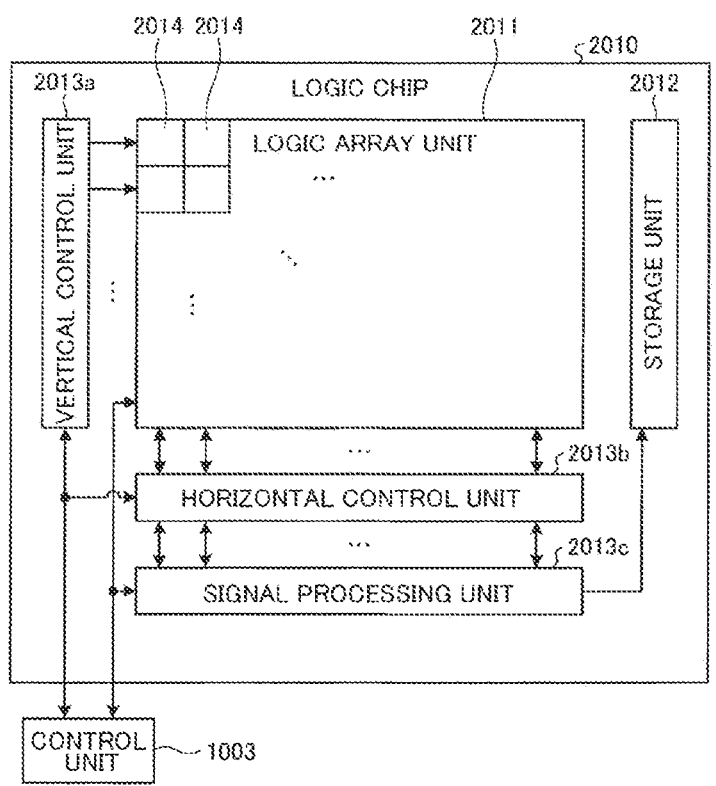
FIG. 7 is a block diagram showing an example configuration of a logic chip that is applicable to the first embodiment.

FIG. 7 is a block diagram showing an example configuration of the logic chip 2010 that is applicable to the first embodiment. In the example shown in FIG. 7, a vertical control unit 2013a, the logic array unit 2011, a horizontal control unit 2013b, a signal processing unit 2013c, and the storage unit 2012 are arranged on the logic chip 2010. Among these units, the vertical control unit 2013a, the horizontal control unit 2013b, and the signal processing unit 2013c may be configured so as to be included in the element control unit 2013, in addition, a logic circuit 2014 is arranged for each photoelectric conversion element 110 in the logic array unit 2011. Each of the logic circuits 2014 is connected via a signal line to a corresponding photoelectric conversion element 110. A circuit made up of the photoelectric conversion element 110 and the logic circuit 2014 that corresponds to the photoelectric conversion element 110 functions as a pixel circuit that generates a pixel signal by one pixel 10.

For example, a vertical synchronization signal and a horizontal synchronization signal output from the control unit 1003 are respectively supplied to the vertical control unit 2013a and the horizontal control unit 2013b. In addition, an exposure control signal output from the control unit 1003 is respectively supplied to the logic array unit 2011 and the signal processing unit 2013c.

In this case, a predetermined direction of the two-dimensional grid (for example, a lateral direction in FIGS. 6 and 7) is assumed to be a row direction and a direction that is perpendicular to a row is assumed to be a column direction. In other words, the pixel circuit (the photoelectric conversion element 110 and the logic circuit 2014) is arranged so as to be aligned in the row direction and the column direction with respect to the pixel array unit 2001 and the logic array unit 2011. Hereinafter, unless otherwise noted, a group of pixel circuits in the row direction will be referred to as a "row" and a group of pixel circuits in the column direction will be referred to as a "column".

The vertical control unit 2013a sequentially selects rows in synchronization with vertical synchronization signals. The logic circuit 2014 includes the counting unit 11 and the acquiring unit 13 described using FIG. 1 and is capable of outputting the time code Tc stored in the memory of the acquiring unit 13. The time code Tc output from each logic circuit 2014 is supplied to the signal processing unit 2013c. The horizontal control unit 2013b sequentially selects columns in synchronization with horizontal synchronization signals and causes pixel signals to be output.

Furthermore, information indicating the exposure period Tsh (an exposure start timing, an exposure time, or the like) is input to the signal processing unit 2013c from the control unit 1003. Based on the respective time codes Tc supplied from the respective logic circuits 2014, the signal processing unit 2013c calculates the predicted count value Npre according to, for example, the equation (1) described earlier. The signal processing unit 2013c outputs each calculated predicted count value Npre. Each predicted count value Npre output from the signal processing unit 2013c is supplied to and stored by the storage unit 2012.

Figure 8:
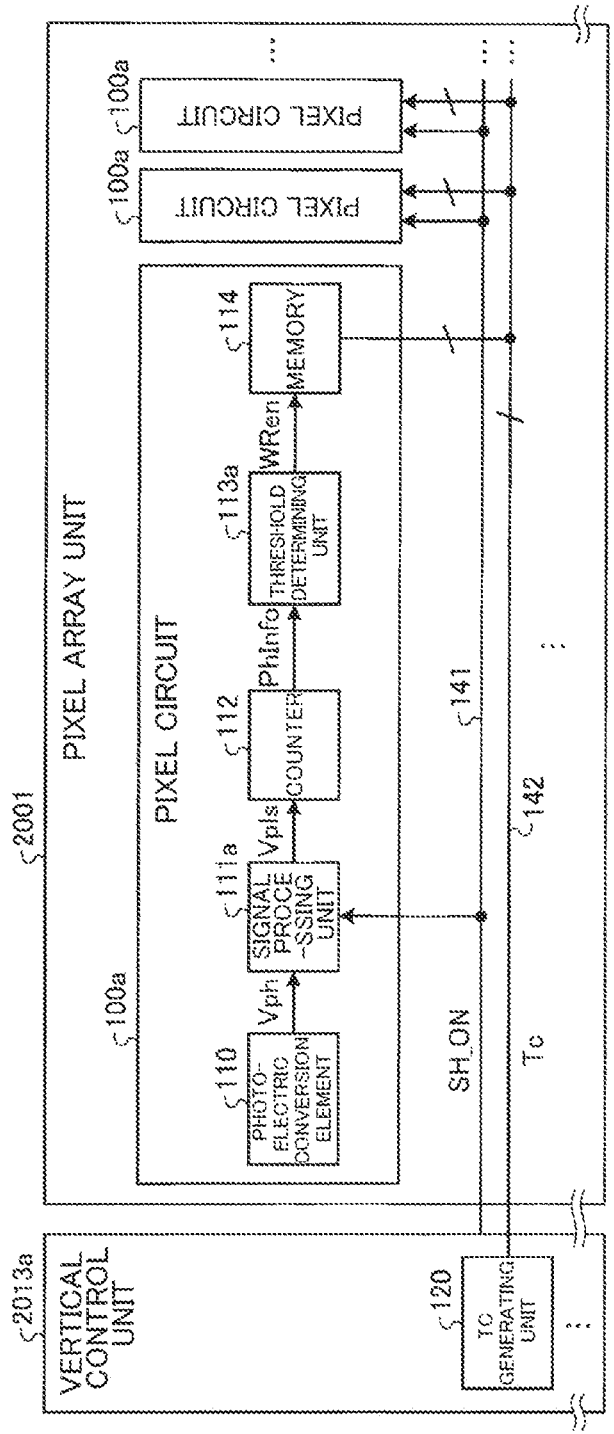
FIG. 8 is a block diagram showing an example configuration of a pixel array unit and a vertical control unit according to the first embodiment.

FIG. 8 is a block diagram showing an example configuration of the pixel array unit 2001 and the vertical control unit 2013a according to the first embodiment. In addition, FIG. 8 shows a more specific configuration of a pixel circuit with respect to the pixel array unit 2001.

As exemplified in FIG. 8, the pixel array unit 2001 includes a plurality of pixel circuits 100a. It should be noted that FIG. 8 extracts and shows the respective pixel circuits 100a included in one row among the respective pixel circuits 100a that are arranged in a two-dimensional grid pattern in the pixel array unit 2001.

In FIG. 8, the pixel circuit 100a includes the photoelectric conversion element 110, a signal processing unit 111a, a counter 112, a threshold determining unit 113a, and a memory 114.

The photoelectric conversion element 110 outputs a signal Vph in accordance with an incidence of a photon. In a case of the configuration shown in FIG. 5 described above, for example, the signal Vph is transmitted from the light-receiving chip 2000 to the logic chip 2010 via a coupling portion constituted by a CCC and supplied to the signal processing unit 111a that is arranged on the logic chip 2010. The signal processing unit 111a shapes the signal Vph output from the photoelectric conversion element 110 and outputs the shaped signal Vph as a pulse Vpls in accordance with an incidence of a photon. An output timing of the pulse Vpls is controlled in accordance with a signal SH_ON that is supplied from a TC generating unit 120 to be described later. The counter 112 counts the number of pulses Vpls that are output from the signal processing unit 111a and outputs a count result as photon information PhInfo.

The threshold determining unit 113a makes a determination based on the threshold Nth with respect to the photon information PhInfo having been output from the counter 112. Based on the photon information PhInfo, when the threshold determining unit 113a determines that the photon number incident to the photoelectric conversion element 110 exceeds the threshold Nth, the threshold determining unit 113a outputs a write signal WRen(W). The counter 112 and the threshold determining unit 113a constitute the counting unit 11 shown in FIG. 1.

The memory 114 corresponds to the acquiring unit 13 in FIG. 1 and stores the time code Tc that is supplied from the TC generating unit 120 (to be described later) via a signal line 142 in accordance with the write signal WRen. The memory 114 includes a memory control unit that controls writing of data to the memory 114 itself and reading of data from the memory 114.

On the other hand, in FIG. 8, the vertical control unit 2013a includes a TC (time code) generating unit 120 for each row. The TC generating unit 120 corresponds to the time code generating unit 12 shown in FIG. 1. In accordance with control by the control unit 1003, the TC generating unit 120 generates an update cycle that changes as the exposure period Tsh elapses and generates the time code Tc based on the update cycle. For example, the control unit 1003 generates a reference timing signal and supplies the generated reference timing signal to the TC generating unit 120. Based on the reference timing signal, the TC generating unit 120 generates the time code Tc at a predetermined update cycle. In the example shown in FIG. 8, the time code Tc generated by the TC generating unit 120 is input to the respective pixel circuits 100a via the signal line 142 and respectively supplied to and stored in the memory 114 included in each pixel circuit 100a.

Each time code Tc stored in the memory 114 included in each pixel circuit 100a is read from the memory 114 via the signal line 142.

For example, the control unit 1003 indicates a start timing of the exposure period Tsh to the TC generating unit 120 and supplies the TC generating unit 120 with information indicating a length of the exposure period Tsh.

In addition, the TC generating unit 120 generates a signal SH_ON that indicates a timing at which the signal processing unit 111a outputs the pulse Vpls. For example, the TC generating unit 120 generates the signal SH_ON based on a predetermined clock signal. In the example shown in FIG. 8, the signal SH_ON generated by the TC generating unit 120 is input to the respective pixel circuits 100a via the signal line 141 and supplied to the signal processing unit 111a.

Figure 9:
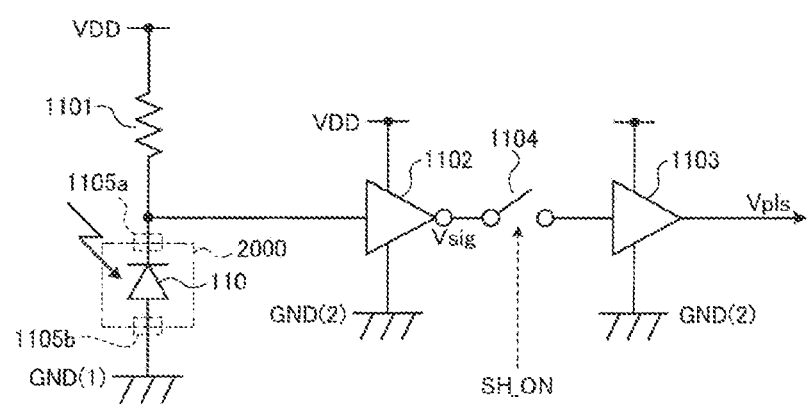
FIG. 9 is a diagram showing an example configuration of a signal processing unit that is applicable to the first embodiment.

FIG. 9 is a diagram showing an example configuration of the signal processing unit 111a that is applicable to the first embodiment. In FIG. 9, the signal processing unit 111a includes a resistor 1101, an inverter 1102, an amplifier 1103, and a switch 1104.

In FIG. 9, in the photoelectric conversion element 110 that is, for example, a SPAD, a cathode is connected to a terminal of a power supply potential VDD via the resistor 1101, and an anode is connected to a terminal of a potential GND(1) with a lower potential than the power supply potential VDD. The terminal of a potential GND(1) is, for example, a grounding terminal. Accordingly, a reverse bias is applied to the photoelectric conversion element 110. In addition, a photocurrent flows in a direction from the cathode toward an anode of the photoelectric conversion element 110.

It should be noted that the photoelectric conversion element 110 is not limited to a SPAD. An avalanche photodiode (APD) or an ordinary photodiode can also be applied as the photoelectric conversion element 110.

One end of the resistor 1101 is connected to the power supply potential VDD and another end is connected to the cathode of the photoelectric conversion element 110. A photocurrent flows through the resistor 1101 every time an incidence of a photon is detected by the photoelectric conversion element 110 and a cathode potential of the photoelectric conversion element 110 drops to a value of an initial state that is lower than the power supply potential VDD (a quenching operation).

A signal extracted from a connection point between the resistor 1101 and the cathode of the photoelectric conversion element 110 is input to the inverter 1102. The inverter 1102 inverts the input signal of the cathode potential of the photoelectric conversion element 110 and supplies an inverted output signal Vsig to the amplifier 1103 via the switch 1104. The amplifier 1103 shapes the inverted output signal Vsig and outputs the shaped inverted output signal Vsig as a pulse Vpls. In addition, a ground-side potential GND(2) to which the inverter 1102 and the amplifier 1103 are connected differs from the ground-side potential GND(1) to which the anode of the photoelectric conversion element 110 is connected.

In FIG. 9, the photoelectric conversion element 110 is formed on the light-receiving chip 2000. In addition, the resistor 1101, the inverter 1102, the amplifier 1103, and the switch 1104 are formed on the logic chip 2010. The cathode of the photoelectric conversion element 110 is connected to, via a coupling portion 1105a constituted by a CCC or the like, a connection point where the resistor 1101 and an input terminal of the inverter 1102 are connected to each other. In addition, the anode of the photoelectric conversion element 110 is connected to, via a coupling portion 1105b constituted by a CCC or the like, a supply line for supplying the ground-side potential GND(1) which is arranged on the logic chip 2010.

Figure 10A:
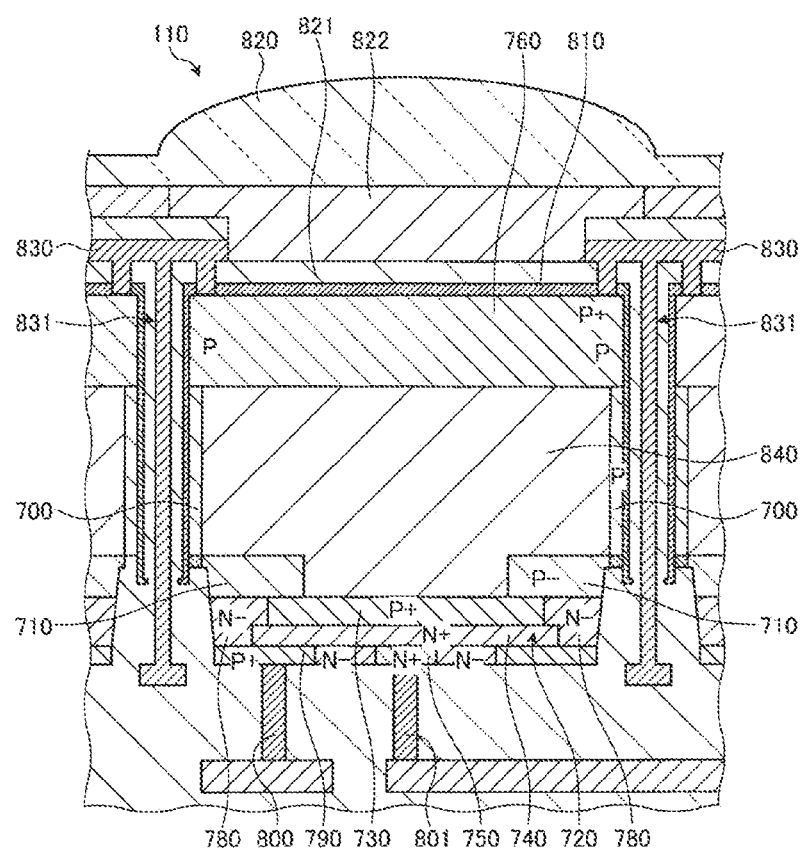
FIG. 10A is a diagram showing an example of a configuration of a photoelectric conversion element as a SPAD that is applicable to the first embodiment.

An example of a configuration of the photoelectric conversion element 110 that is applicable to the first embodiment will be described using FIGS. 10A and 10B. FIG. 10A is a diagram showing an example of a configuration of the photoelectric conversion element 110 as a SPAD that is applicable to the first embodiment. In FIG. 10, the photoelectric conversion element 110 includes a photoelectric conversion unit (an N-region) 840 that performs photoelectric conversion with a multiplication region as a SPAD pixel using a SPAD, and a topmost surface on a rear surface side of the photoelectric conversion unit 840 is configured as a light irradiating unit that irradiates light.

In FIG. 10A, an anode electrode (not illustrated) is electrically connected to a P-type semiconductor region 760. The P-type semiconductor region 760 is configured such that the lower the layer, the lower its impurity concentration. In addition, a P-type semiconductor region 700 and a P--type semiconductor region 710 are formed along a pixel separating unit 831 including a metal layer 830 from the P-type semiconductor region 760 to electrically connect the P-type semiconductor region 760 with an avalanche unit 720. The avalanche unit 720 is constructed by bonding a P+-type semiconductor region 730 and an N+-type semiconductor region 740 to each other. The P-type semiconductor region 700 is constructed so as to pass a charge (an electron) to be read by the avalanche unit 720 by accumulating an opposite charge (a hole). The P--type semiconductor region 710 is desirably a low-concentration region in order to raise a center potential so that a charge passes through to the avalanche unit 720.

The N+-type semiconductor region 740 is connected to an electrode 801 via an N+-type semiconductor region 750. In addition, an N--type semiconductor region 780 is formed on side surfaces of the P+-type semiconductor region 730 and the N+-type semiconductor region 740. Furthermore, a P+-type semiconductor region 790 is provided which is electrically connected to the N+-type semiconductor region 740 and the N--type semiconductor region 780 and which is grounded (GND) via the electrode 800.

A fixed charge film 810 is provided on a side surface of the pixel separating unit 831 and in an upper layer of the P-type semiconductor region 760. In the upper layer of the P-type semiconductor region 760, a color filter 822 is provided on the fixed charge film 810 via an insulating film 821. An on-chip lens 820 is further provided on top of the color filter 822. It should be noted that the color filter 822 is provided in accordance with use application.

Figure 10B:
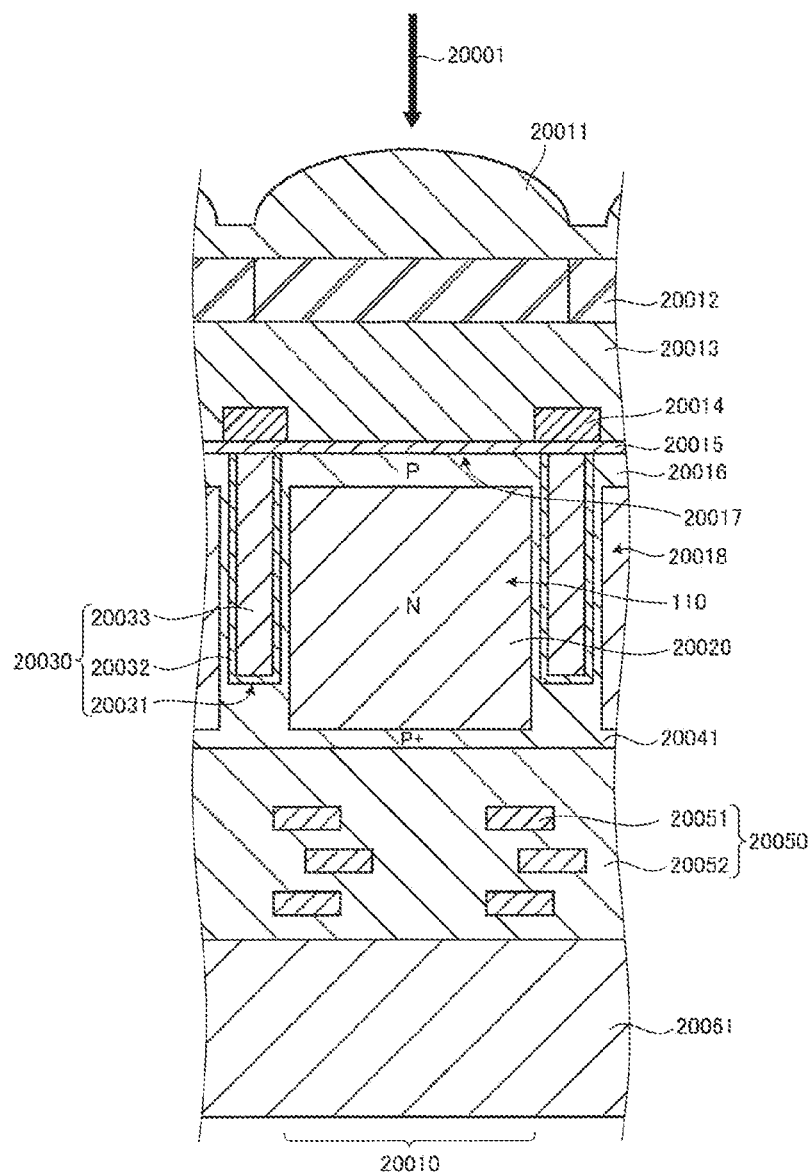
FIG. 10B is a diagram showing an example of a configuration of a photoelectric conversion element as a photodiode that is applicable to the first embodiment.

FIG. 10B is a diagram showing an example of a configuration of a light-receiving unit 20010 including the photoelectric conversion element 110 as a photodiode that is applicable to the first embodiment. In FIG. 10B, the photoelectric conversion element 110 that is a photodiode receives incident light 20001 that is incident from a side of a rear surface (an upper surface in FIG. 10B) of a semiconductor substrate 20018. A planarizing film 20013, a color filter 20012, and a microlens 20011 are provided above the photoelectric conversion element 110, and incident light 20001 that is incident sequentially via the respective units is received by a light-receiving surface 20017 and photoelectric conversion is performed.

For example, in the photoelectric conversion element 110, an N-type semiconductor region 20020 is formed as a charge storage region for storing charges (electrons). In the photoelectric conversion element 110, the N-type semiconductor region 20020 is provided inside P-type semiconductor regions 20016 and 20041 of the semiconductor substrate 20018. In the N-type semiconductor region 20020, the P-type semiconductor region 20041 with a higher impurity concentration than a rear surface (upper surface) side is provided on a front surface (lower surface) side of the semiconductor substrate 20018. In other words, the photoelectric conversion element 110 has a HAD (Hole-Accumulation Diode) structure, and the P-type semiconductor regions 20016 and 20041 are formed so as to suppress generation of a dark current at respective interfaces with an upper surface side and a lower surface side of the N-type semiconductor region 20020.

A pixel separating unit 20030 that electrically separates the plurality of light-receiving units 20010 from each other is provided inside the semiconductor substrate 20018 and the photoelectric conversion element 110 is provided in a region that is partitioned by the pixel separating unit 20030. In the drawing, when a solid-state imaging apparatus is viewed from an upper surface side, the pixel separating unit 20030 is formed in, for example, a grid-like shape so as to be interposed between the plurality of light-receiving units 20010 and the photoelectric conversion element 110 is formed in a region that is partitioned by the pixel separating unit 20030.

In each photoelectric conversion element 110, the anode is grounded, and a signal charge (for example, an electron) stored by the photoelectric conversion element 110 in the light-receiving unit 20010 is read via, for example, a transfer transistor (not illustrated) constituted by a MOSFET (Metal Oxide Semiconductor Field Effect Transistor) or the like and output to a VSL (vertical signal line) (not illustrated) as an electric signal.

A wiring layer 20050 is provided on a front surface (a lower surface) on an opposite side to a rear surface (an upper surface) on which respective units including a light-shielding film 20014, the color filter 20012, and the microlens 20011 are provided among the semiconductor substrate 20018.

The wiring layer 20050 includes wirings 20051 and an insulating layer 20052 and is formed such that the wirings 20051 are electrically connected to respective elements in the insulating layer 20052. The wiring layer 20050 is a so-called multilayer wiring layer and is formed by alternately stacking an interlayer insulating film that constitutes the insulating layer 20052 and the wirings 20051 a plurality of times. In this case, as the wirings 20051, respective wirings including a wiring to a transistor for reading a charge from the photoelectric conversion element 110 such as transfer Tr and a wiring to a VSL are stacked via the insulating layer 20052.

A supporting substrate 20061 is provided on a surface on an opposite side to a side provided with the photoelectric conversion element 110 of the wiring layer 20050. For example, a substrate made of a silicon semiconductor with a thickness of several hundred micrometers is provided as the supporting substrate 20061.

The light-shielding film 20014 is provided on a side of a rear surface (an upper surface in the diagram) of the semiconductor substrate 20018. The light-shielding film 20014 is configured to shield a part of the incident light 20001 that is directed from above the semiconductor substrate 20018 toward the rear surface of the semiconductor substrate 20018.

The light-shielding film 20014 is provided above the pixel separating unit 20030 that is provided inside the semiconductor substrate 20018. In this case, the light-shielding film 20014 is provided on the rear surface (the upper surface) of the semiconductor substrate 20018 so as to protrude in a convex shape via the insulating film 20015 that is made of a silicon dioxide film or the like. By comparison, the light-shielding film 20014 is not provided above the photoelectric conversion element 110 that is provided inside the semiconductor substrate 20018 and the photoelectric conversion element 110 is left open so that the incident light 20001 is incident to the photoelectric conversion element 110.

In other words, in FIG. 10B, when the light-receiving unit 20010 is viewed from an upper surface side, a planar shape of the light-shielding film 20014 is a grid shape that partitions the plurality of light-receiving units 20010 and openings are formed through which the incident light 20001 passes through to the light-receiving surface 20017.

The light-shielding film 20014 is formed of a light-shielding material that shields light. For example, the light-shielding film 20014 is formed by sequentially stacking a titanium (Ti) film and a tungsten (W) film. Otherwise, for example, the light-shielding film 20014 can be formed by sequentially stacking a titanium nitride (TiN) film and a tungsten (W) film. The light-shielding film 20014 is coated by the planarizing film 20013. The planarizing film 20013 is formed using an insulating material that transmits light.

The pixel separating unit 20030 has a groove portion 20031, a fixed charge film 20032, and an insulating film 20033.

The fixed charge film 20032 is formed on a side of the rear surface (the upper surface) of the semiconductor substrate 20018 so as to cover the groove portion 20031 that partitions the plurality of light-receiving units 20010 from each other. Specifically, the fixed charge film 20032 is formed so as to cover, by a certain thickness, an inside surface of the groove portion 20031 that is formed on a side of the rear surface (the upper surface) of the semiconductor substrate 20018. In addition, the insulating film 20033 is provided (filled) so as to fill the inside of the groove portion 20031 that is coated by the fixed charge film 20032.

In this case, the fixed charge film 20032 is formed using a high dielectric having a negative fixed charge so that a positive charge (hole) storage region is formed and generation of a dark current is suppressed in an interface portion with the semiconductor substrate 20018. Due to the fixed charge film 20032 being formed so as to have a negative fixed charge, the negative fixed charge causes an electric field to be applied to an interface with the semiconductor substrate 20018 and a positive charge (hole) storage region to be formed.

For example, the fixed charge film 20032 can be formed by a hafnium oxide film (a $HfO_2$ film). Otherwise, for example, the fixed charge film 20032 can be formed so as to include at least one oxide of hafnium, zirconium, aluminum, tantalum, titanium, magnesium, yttrium, a lanthanoid element, and the like.

1-3. Processing for Generating Time Code Tc According to First Embodiment

Figure 11:
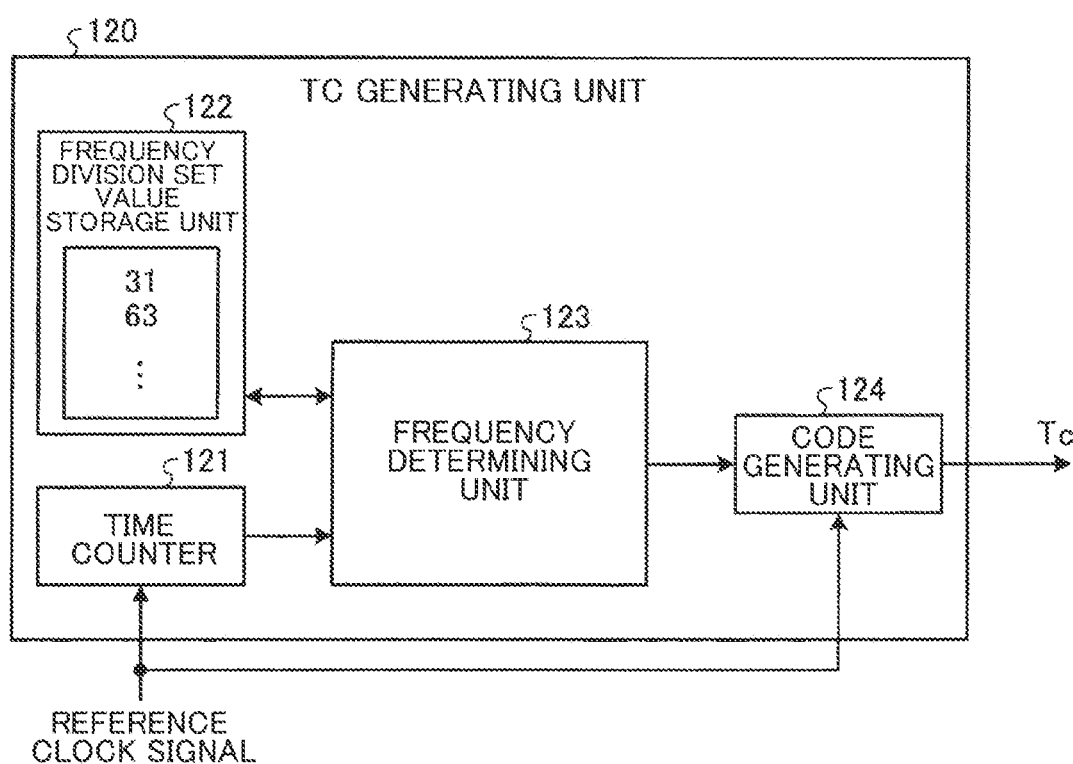
FIG. 11 is a block diagram showing an example configuration of a TC generating unit according to the first embodiment.
Figure 12:
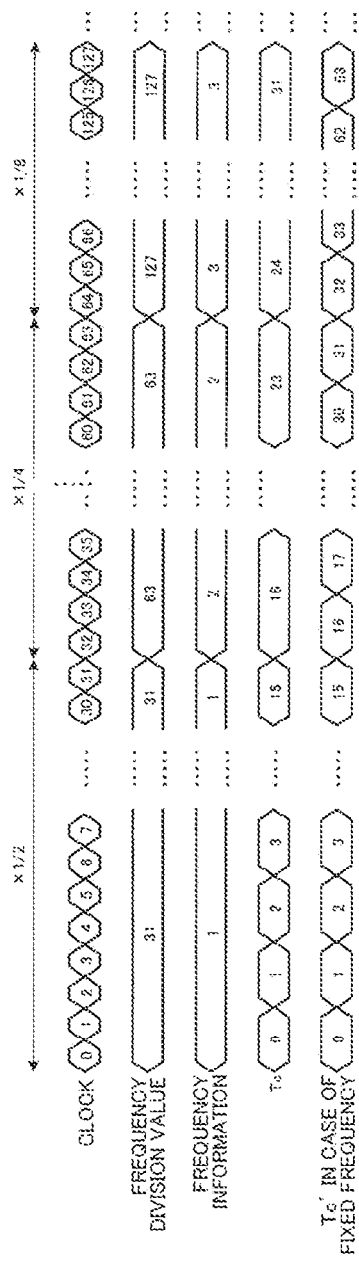
FIG. 12 is an example timing chart for explaining an operation of the TC generating unit according to the first embodiment.

An operation of the TC generating unit 120 according to the first embodiment will be described using FIGS. 11 and 12. FIG. 11 is a block diagram showing an example configuration of the TC generating unit 120 according to the first embodiment. In addition, FIG. 12 is an example timing chart for explaining an operation of the TC generating unit 120 according to the first embodiment.

In FIG. 11, the TC generating unit 120 according to the first embodiment includes a time counter 121, a frequency division set value storage unit 122, a frequency determining unit 123, and a code generating unit 124.

The time counter 121 is driven at a constant frequency and, for example, counts a reference clock signal that is supplied from the control unit 1003. For example, a count value of the time counter 121 is initialized to "0" at the start time point of the exposure period Tsh and the time counter 121 counts the reference clock signal by increasing the count value by "1" upon a rise or a fall of the reference clock signal. Here, for the sake of description, the exposure period Tsh is assumed to have a length corresponding to 128 counts of the reference clock signal. In this case, the count value of the time counter 121 is "0" at the start time point and "127" at the end time point of the exposure period Tsh.

The frequency division set value storage unit 122 stores a plurality of frequency division values in advance and outputs a required frequency division value from a plurality of stored frequency division values in response to a request by the frequency determining unit 123. For example, the frequency division set value storage unit 122 stores values "31", "63", and "127" as frequency division values.

A count value of the time counter 121 and a frequency division value output from the frequency division set value storage unit 122 are input to the frequency determining unit 123. Based on the input count value and the input frequency division value, the frequency determining unit 123 outputs frequency information. In this case, an initial value of the frequency information is assumed to be "1".

More specifically, the frequency determining unit 123 determines whether or not the input count value and the input frequency division value match each other. When it is determined that the count value and the frequency division value match each other and that the presently input frequency division value is not a maximum value, the frequency determining unit 123 adds 1 to the frequency information and outputs the frequency information. At the same time, the frequency determining unit 123 makes a request to the frequency division set value storage unit 122 for a next larger frequency division value with respect to the presently input frequency division value.

The code generating unit 124 outputs the time code Tc based on the reference clock signal and the frequency information output from the frequency determining unit 123. At this point, the code generating unit 124 changes the update cycle by dividing the reference clock signal by the number of times in accordance with the frequency information and controls time intervals of the time code Tc. For example, when the value of the frequency information is "1", the code generating unit 124 divides the reference clock signal once and generates the time code Tc in accordance with an update cycle that is ½ of the reference clock signal. In addition, for example, when the value of the frequency information is "2", the code generating unit 124 divides the reference clock signal twice and generates the time code Tc in accordance with an update cycle that is ¼ of the reference clock signal.

The operation of the TC generating unit 120 will be described in more detail using the timing chart shown in FIG. 12. In FIG. 12, a clock indicates a count value that represents a count of the reference clock signal by the time counter 121. In the example shown in FIG. 12, a value of the clock is "0" at the start time point and "127" at the end time point of the exposure period Tsh. At the start time point of the exposure period Tsh, the frequency determining unit 123 acquires the value "31" that is an initial value of the frequency division value from the frequency division set value storage unit 122 and outputs the value "1" that is the initial value of frequency information.

Based on the frequency information with the value "1", the code generating unit 124 divides the reference clock signal once and generates the time code Tc of which a value increases by 1 in accordance with a frequency (an update cycle) that is ½ of the reference clock signal.

When the frequency determining unit 123 determines that the value of the clock matches the frequency division value "31", the frequency determining unit 123 makes a request to the frequency division set value storage unit 122 for the frequency division value "63" that is the next larger value with respect to the present frequency division value "31". At the same time, the frequency determining unit 123 adds "1" to the value "1" of the frequency information and obtains "2". In accordance with the frequency information with the value "2", the code generating unit 124 divides the reference clock signal twice and generates the time code Tc of which a value increases by 1 in accordance with a frequency that is ¼ of the reference clock signal.

In the example shown in FIG. 12, during a period (clock values "0" to "31") where the value of the frequency information is "1", the code generating unit 124 sequentially generates the time code Tc of which a value increases by 1 from a value "0" to a value "15" in accordance with a frequency that is ½ of the reference clock signal. When the value of the frequency information switches from "1" to "2", the code generating unit 124 generates the time code Tc of which a value increases by 1 from a next value "16" in accordance with a frequency that is ¼ of the reference clock signal.

In this manner, with the TC generating unit 120 according to the first embodiment, every time a value of the clock matches a frequency division value, a frequency division ratio by which the reference clock signal is divided is increased and the frequency division value is updated. Therefore, the update cycle is sequentially extended in accordance as time elapses in the exposure period Tsh and the time intervals of the time code Tc sequentially increases.

A case will now be considered where a time code Tc' generated when time intervals are fixed within the exposure period Tsh is used. Here, it is assumed that the time code Tc' is generated in accordance with a frequency that is ½ of the frequency of the reference clock signal. In this case, the time code Tc' at the end time point of the exposure period Tsh has a value of "63" that is 6-bit data. By comparison, in the first embodiment, by extending the time intervals of the time code Tc as time elapses, the time code Tc at the end time point of the exposure period Tsh has a value of "31" that is 5-bit data.

In this manner, by making the time intervals of the time code Tc variable, the number of bits of the time code Tc can be made smaller and a size of a memory for storing the time Tth that is acquired by the time code Tc can be reduced.

A period during which the frequency division ratio with respect to the reference clock signal is the smallest (½) is a period during which the time code Tc is generated in accordance with a shortest update cycle and the time Tth at which the incident photon number reaches the threshold Nth can be acquired with highest accuracy. On the other hand, as the frequency division ratio becomes larger, the update cycle for generating the time code Tc becomes longer and acquisition accuracy of the time Tth declines.

In the case of high illumination, a large number of photons are conceivably incident in a short period of time from the start time point of the exposure period Tsh. In this case, since an average time interval Ta of photon incidence is shorter, acquiring the time Tth requires high accuracy. On the other hand, in the case of low illumination, a small number of photons are conceivably incident over a long period of time from the start time point of the exposure period Tsh. In this case, the average time interval Ta of photon incidence is longer. For this reason, it is conceivable that acquiring the time Tth does not require high accuracy.

Therefore, by minimizing the time interval of the time code Tc at the start time point of the exposure period Tsh and sequentially extending the time interval of the time code Tc as the exposure period Tsh elapses, the time Tth can be acquired in an efficient manner. In addition, since a suitable time interval for the time code Tc can be respectively set for high illumination, medium illumination, and low illumination, quantization noise can also be suppressed.

Figure 13:
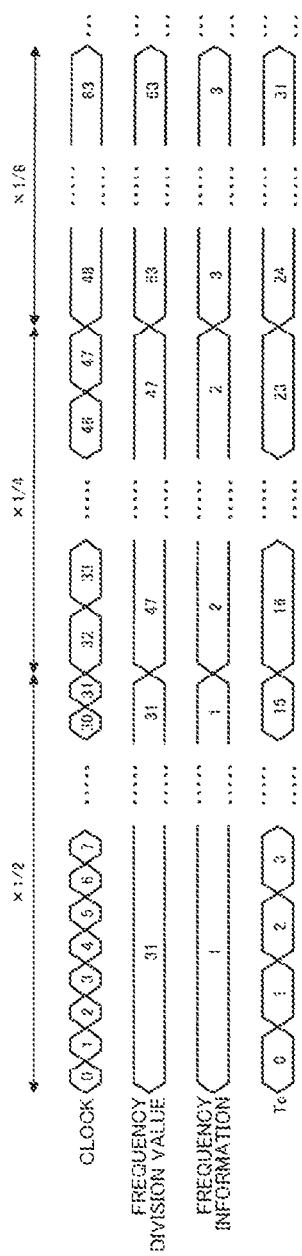
FIG. 13 is an example timing chart for explaining an operation of the TC generating unit according to the first embodiment when a frequency for driving a time counter is made variable.

While the time counter 121 counts the reference clock signal by being driven at a constant frequency in the example shown in FIG. 12, the driving frequency of the time counter 121 is not limited thereto. For example, the frequency at which the time counter 121 is driven may be variable. FIG. 13 is an example timing chart for explaining an operation of the TC generating unit 120 according to the first embodiment when the frequency for driving the time counter 121 is made variable. Since the meanings of the respective parts of the timing chart shown in FIG. 13 are similar to those of the timing chart shown in FIG. 12 and described above, descriptions thereof will be omitted here.

In the example shown in FIG. 13, when the value of the clock is "32" or thereafter, the time counter 121 is driven at a frequency that is ½ of a frequency prior to the value of "32". Accordingly, the frequency division values stored in the frequency division set value storage unit 122 are values "31", "47", and "63". Operations of the frequency determining unit 123 and the code generating unit 124 are similar to those in the example shown in FIG. 12 and described above. Even in this case, the time interval of the time code Tc can be made variable based on the frequency division values and the frequency information and the number of bits of the Tc can be made smaller.

In addition, while a numerical value that is incremented by 1 is applied as the time code Tc in the description given above, the numerical value of the time code Tc is not limited to this example. In other words, the increment of the time code Tc is not limited to 1. Furthermore, as long as values do not overlap each other, values other than those that monotonically increase or monotonically decrease can be used as the time code Tc.

Figure 14:
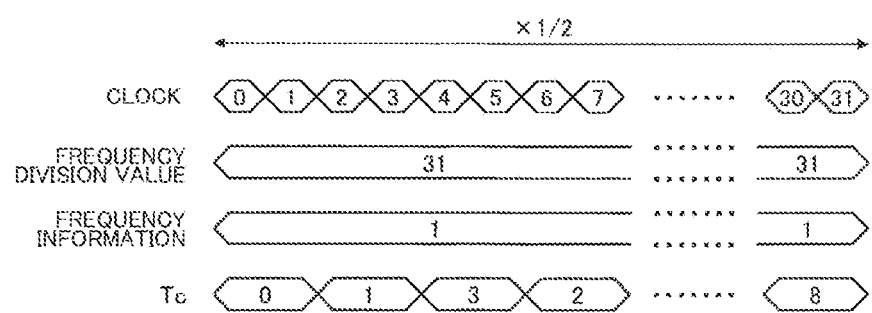
FIG. 14 is a timing chart showing an example of applying a Gray code to the time code Tc as an example of a value other than those that monotonically increase or monotonically decrease that is applicable to the first embodiment.

FIG. 14 is a timing chart showing an example of applying a Gray code to the time code Tc as an example of a value other than those that monotonically increase or monotonically decrease which is applicable to the first embodiment. Since the meanings of the respective parts of the timing chart shown in FIG. 14 are similar to those of the timing chart shown in FIG. 12 and described above, descriptions thereof will be omitted here. In addition, FIG. 14 extracts and shows a period where the frequency division value has a value of "31" in FIG. 12.

The Gray code refers to an ordering of codes in which a Hamming distance between adjacent codes is always 1 and has a characteristic in that a change from a given value to an adjacent value is always a change of 1 bit. By applying the Gray code to the time code Tc as described above, power required to issue the time code Tc in the TC generating unit 120 can be reduced as compared to a case of using a general binary. In addition, since a change in bits when a value changes to an adjacent value in the Gray code is smaller than using a general binary, unstable elements related to the prediction of a photon number can also be suppressed. For example, using the Gray code as the time code Tc also has the effect of relaxing frequency design in the TC generating unit 120.

While the TC generating unit 120 shown in FIG. 11 generates frequency information to be used by the code generating unit 124 to generate the time code Tc based on a frequency division value of the frequency determining unit 123 and a count value of the time counter 121, the generation of frequency information is not limited thereto. For example, frequency information may be generated using a PLL (Phase-locked loop).

Figure 15:
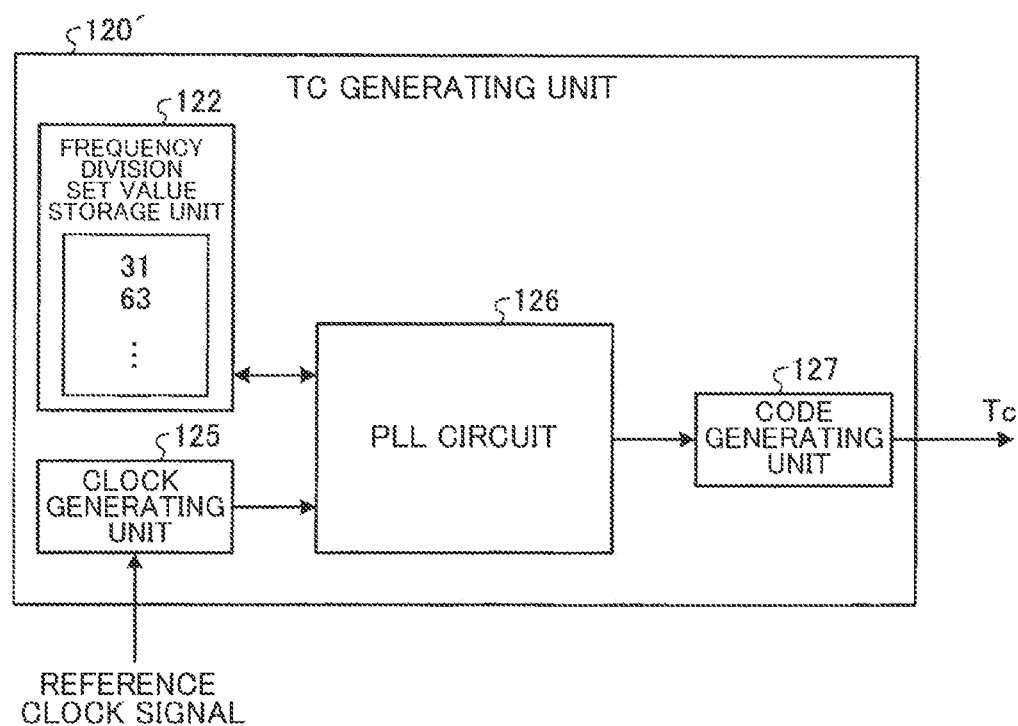
FIG. 15 is a block diagram showing an example of a configuration for generating the time code Tc using a PLL that is applicable to the first embodiment.

FIG. 15 is a block diagram showing an example of a configuration for generating the time code Tc using a PLL that is applicable to the first embodiment. In FIG. 15, a TC generating unit 120' includes the frequency division set value storage unit 122, a clock generating unit 125, a PLL circuit 126, and a code generating unit 127. In a similar manner to the TC generating unit 120 shown in FIG. 11, the frequency division set value storage unit 122 stores a plurality of frequency division values (for example, values "31", "63", and "127") in advance.

The clock generating unit 125 generates a clock signal of which a frequency has been stabilized based on, for example, a reference clock signal supplied from the control unit 1003. A clock signal generated by the clock generating unit 125 and a frequency division value output from the frequency division set value storage unit 122 in response to a request from the PLL circuit 126 are input to the PLL circuit 126. Based on the input clock signal, the PLL circuit 126 generates a clock signal of a frequency in accordance with the frequency division value. The clock signal generated by the PLL circuit 126 is supplied to the code generating unit 127.

For example, the code generating unit 127 includes a counter and a comparing unit. The counter counts a clock signal supplied from the PLL circuit 126. The comparing unit compares a count value having been counted by the counter with the threshold Nth. When the code generating unit 127 determines that the count value is equal to or exceeds the threshold Nth, the code generating unit 127 outputs the count value as the time code Tc.

In addition, when the code generating unit 127 determines that the count value is equal to or exceeds the threshold Nth and that the presently input frequency division value is not a maximum value, the code generating unit 127 makes a request to the frequency division set value storage unit 122 for a next larger frequency division value with respect to the presently input frequency division value. Accordingly, a frequency of the clock signal generated by the PLL circuit 126 can be lowered. At this point, by having the PLL circuit 126 control the clock signal for generating the time code Tc, finer control of the time code Tc can be realized.

1-4. Configuration Example of Counter Applicable to First Embodiment

Next, a configuration example of the counter 112 (refer to FIG. 8) that is applicable to the first embodiment will be described.

1-4-1. First Example of Counter

Figure 16A:
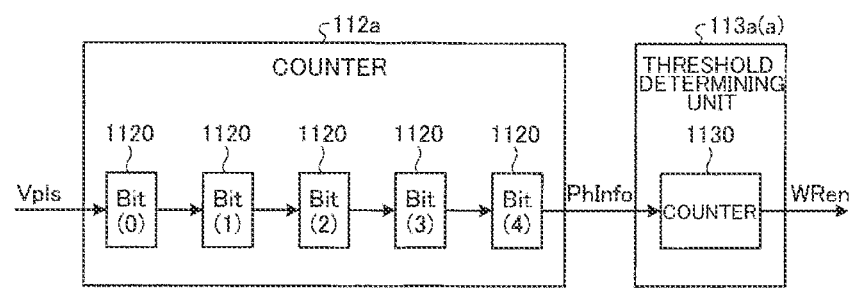
FIG. 16A is a block diagram showing an example configuration of a counter according to a first example that is applicable to the first embodiment.
Figure 16B:
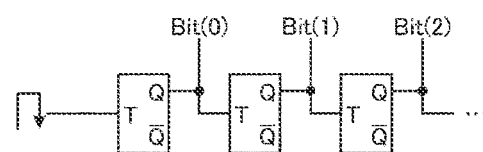
FIG. 16B is a block diagram showing an example configuration of a counter according to the first example that is applicable to the first embodiment.

First, a first example of the counter 112 that is applicable to the first embodiment will be described. FIGS. 16A and 16B are block diagrams showing an example configuration of a counter 112a according to the first example that is applicable to the first embodiment. Hereinafter, unless otherwise noted, the threshold Nth is assumed to have a value of "31" in decimal notation and a value of "0b11111" in binary notation. It should be noted that, in the binary notation, a head character string "0b" indicates that a subsequent character string (in this example, "11111") is a value in binary notation.

In FIG. 16A, the counter 112a according to the first example includes a plurality of counters 1120 that respectively count 1 bit. As exemplified in FIG. 16B, the counters 1120 are configured such that a T (toggle) flip-flop (hereinafter, abbreviated as T-FF) is connected in series.

With a T-FF, a value of an output terminal Q is inverted every time a falling edge is input to an input terminal T. Therefore, by connecting the respective counters 1120 in series such that the output terminal Q of a counter 1120 and the input terminal T of a counter 1120 of a next stage are connected to each other, the counter 112a can be constructed in which each counter 1120 counts a bit. In the example shown in FIG. 16A, in the counter 112a, since five counters 1120 are connected in series, the counter 112a operates as a 5-bit counter from bit "0" (Bit(0)) to bit "4" (Bit(4)).

When a falling edge of the pulse Vpls is input in a state where each counter 1120 has a value of "1", the counter 112a overflows and a value of "1" is output from the counter 1120 that represents an MSB (Most Significant Bit). The value "1" is input as photon information PhInfo to a threshold determining unit 113a(a) that corresponds to the threshold determining unit 113a shown in FIG. 8. For example, the threshold determining unit 113a(a) includes a 1-bit counter 1130, and when a value "1" is input from the counter 112a. 1 bit is output from the counter 1130, a determination is made that an incident photon number has reached the threshold Nth, and a write signal WRen(W) with respect to the memory 114 is output.

1-4-2. Second Example of Counter

Figure 17:
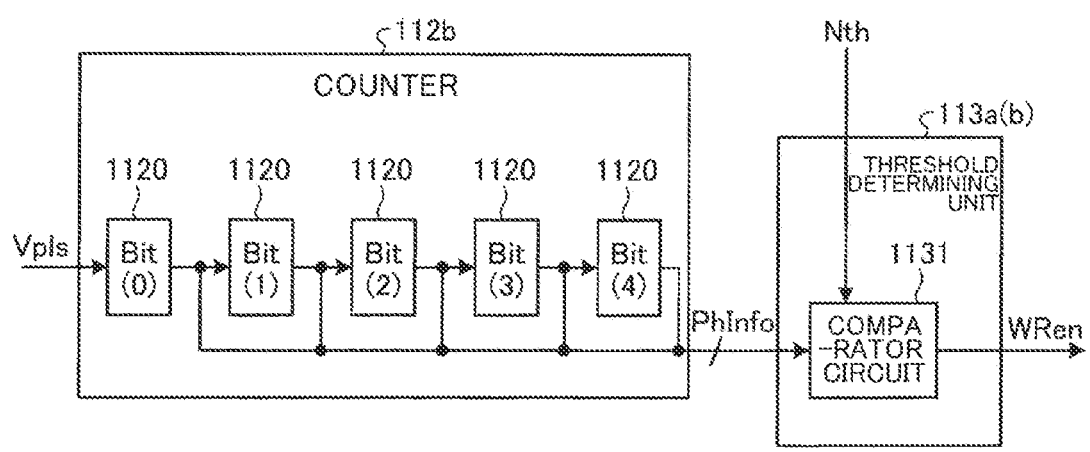
FIG. 17 is a block diagram showing an example configuration of a counter according to a second example that is applicable to the first embodiment.

Next, a second example of the counter 112 that is applicable to the first embodiment will be described. FIG. 17 is a block diagram showing an example configuration of a counter 112b according to the second example that is applicable to the first embodiment.

In FIG. 17, in the counter 112b according to the second example, a plurality of counters 1120 that are respectively constituted by a T-FF are connected in series. In the counter 112b, an output is extracted from an output terminal Q of each of the counters 1120 and each extracted bit is output as a bit sequence. In the example shown in FIG. 17, since the counter 112b includes five counters 1120, bits are output as a 5-bit sequence. The bit sequence that is output from the counter 112b is supplied to a threshold determining unit 113a(b) as photon information PhInfo.

The threshold determining unit 113a(b) corresponds to the threshold determining unit 113a shown in FIG. 8 and includes a comparator circuit 1131. The photon information PhInfo supplied to the threshold determining unit 113a(b) is input to the comparator circuit 1131. The comparator circuit 1131 compares the input photon information PhInfo with the threshold Nth, and when a value indicated by the photon information PhInfo and the threshold Nth match each other, outputs a write signal WRen(W) with respect to the memory 114.

With the counter 112b and the threshold determining unit 113a(b) according to the second example, an arbitrary value within a range of the number of bits that correspond to the number of counters 1120 can be set as the threshold Nth.

1-4-3. Third Example of Counter

Figure 18:
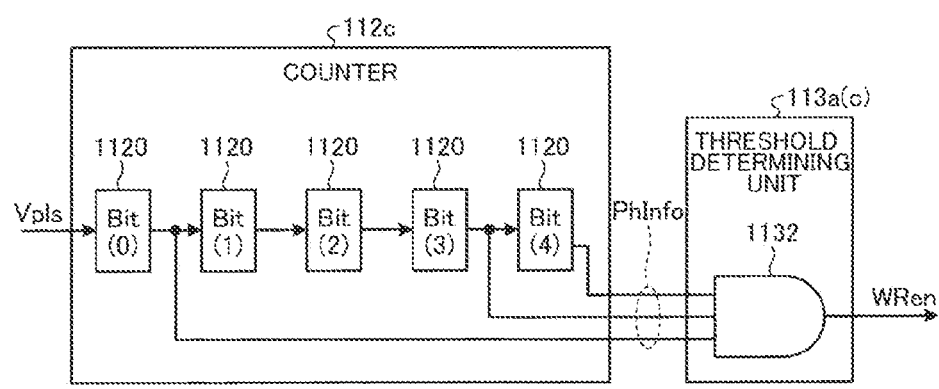
FIG. 18 is a block diagram showing an example configuration of a counter according to a third example that is applicable to the first embodiment.

Next, a third example of the counter 112 that is applicable to the first embodiment will be described. FIG. 18 is a block diagram showing an example configuration of a counter 112c according to the third example that is applicable to the first embodiment.

In FIG. 18, in the counter 112c according to the third example, a plurality of counters 1120 that are respectively constituted by a T-FF are connected in series. The counter 112c outputs, as photon information PhInfo, three signals including an input and an output of the counter 1120 that corresponds to an MSB and the pulse Vpls that is input to the counter 112c. The photon information PhInfo output from the counter 112c is supplied to a threshold determining unit 113a(c) that corresponds to the threshold determining unit 113a shown in FIG. 8.

The threshold determining unit 113a(c) includes a 3-input AND circuit 1132. The three signals included in the photon information PhInfo input to the threshold determining unit 113a(c) are respectively input to the three input terminals of the AND circuit 1132. When the three values included in the photon information PhInfo are "1", the threshold determining unit 113a(c) outputs a write signal WRen(W) with respect to the memory 114. Since the pulse Vpls input to the counter 112c is used as a determination condition based on logical AND, the write signal WRen can be output in synchronization with the input of the pulse Vpls.

1-4-4. Fourth Example of Counter

Figure 19A:
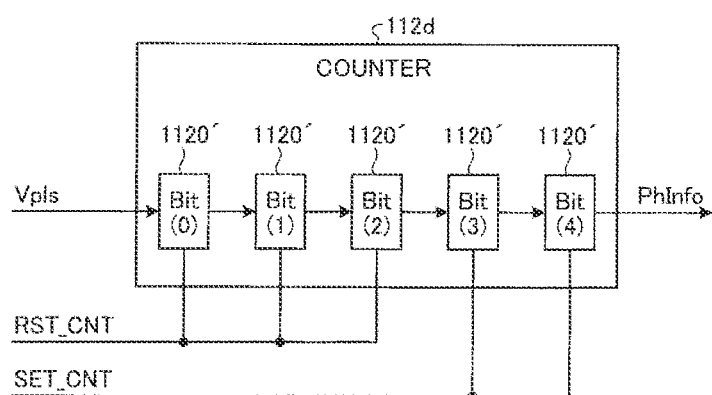
FIG. 19A is a block diagram showing an example configuration of a counter according to a fourth example that is applicable to the first embodiment.
Figure 19B:
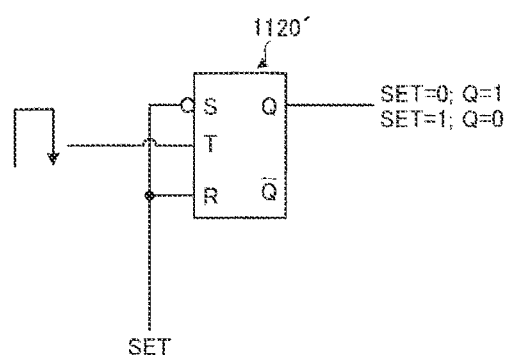
FIG. 19B is a block diagram showing an example configuration of a counter according to the fourth example that is applicable to the first embodiment.

Next, a fourth example of the counter 112 that is applicable to the first embodiment will be described. FIGS. 19A and 19B are block diagrams showing an example configuration of a counter 112d according to the fourth example that is applicable to the first embodiment.

In FIG. 19A, in the counter 112d, a plurality of counters 1120' that are respectively constituted by an asynchronous T-FF (hereinafter, an SRT-FF) are connected in series. The SRT-FF is configured so that an initial state can be determined by an external control signal. As shown in FIG. 19B, each counter 1120' constituted by each SRT-FF has a terminal S and a terminal R in addition to an input terminal T. In the example shown in FIG. 19B, for example, a signal SET is input to the terminal R and, at the same time, the signal SET is inverted and input to the terminal S. In the case of this connection, a value of "1" is written by a signal SET=0 (Q=1) and a value of "0" is written by a signal SET=1 (Q=0).

In the example shown in FIG. 19A, a signal RST_CNT is input as the signal SET described above to three counters 1120' (Bit(0), Bit(1), and Bit(2)) on an LSB (Least Significant Bit) side. In addition, a signal SET_CNT is input as the signal SET described above to two counters 1120' (Bit(3) and Bit(4)) on an MSB side. For example, when resetting each of the counters 1120' included in the counter 112d, the signal RST_CNT is set to a value of "0" and the signal SET_CNT is set to a value of "1" as initialization processing. Accordingly, "0" is respectively written into the three counters 1120' (Bit(0), Bit(1), and Bit(2)) on the LSB side and "1" is respectively written into the two counters 1120' (Bit(3) and Bit(4)) on the MSB side.

The threshold Nth can be controlled by initializing each of the counters 1120' in this manner. In the example described above, since the values of the two counters 1120' (Bit(3) and Bit(4)) on the MSB side are already set to "1", inputting eight pulses Vpls causes the counter 112d to overflow and photon information PhInfo with a value of "1" is output. In other words, in this case, the threshold Nth is controlled to a value of "8".

1-4-5. Fifth Example of Counter

Figure 20:
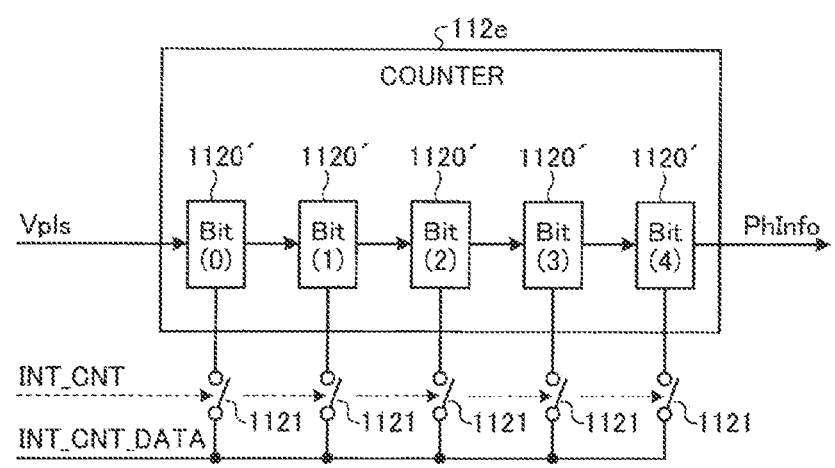
FIG. 20 is a block diagram showing an example configuration of a counter according to a fifth example that is applicable to the first embodiment.

Next, a fifth example of the counter 112 that is applicable to the first embodiment will be described. FIG. 20 is a block diagram showing an example configuration of a counter 112e according to the fifth example that is applicable to the first embodiment.

In FIG. 20, in the counter 112e, a plurality of counters 1120' that are respectively constituted by an asynchronous T-FF (hereinafter, an SRT-FF) are connected in series. With respect to each of the counters 1120', each bit of a 5-bit signal INIT_CNT_DATA is input via each of switches 1121 as the signal SET having been described using FIG. 19B. On (closed) and off (open) of each switch 1121 are simultaneously controlled by a 1-bit signal INIT-CNT.

By setting each bit of the signal INIT_CNT_DATA to, for example, a value of "0" and turning on each switch 1121 at a predetermined timing using the signal INIT-CNT, the value "0" is written into each of the counters 1120' and the counters 1120' can be reset.

1-4-6. Sixth Example of Counter

Figure 21:
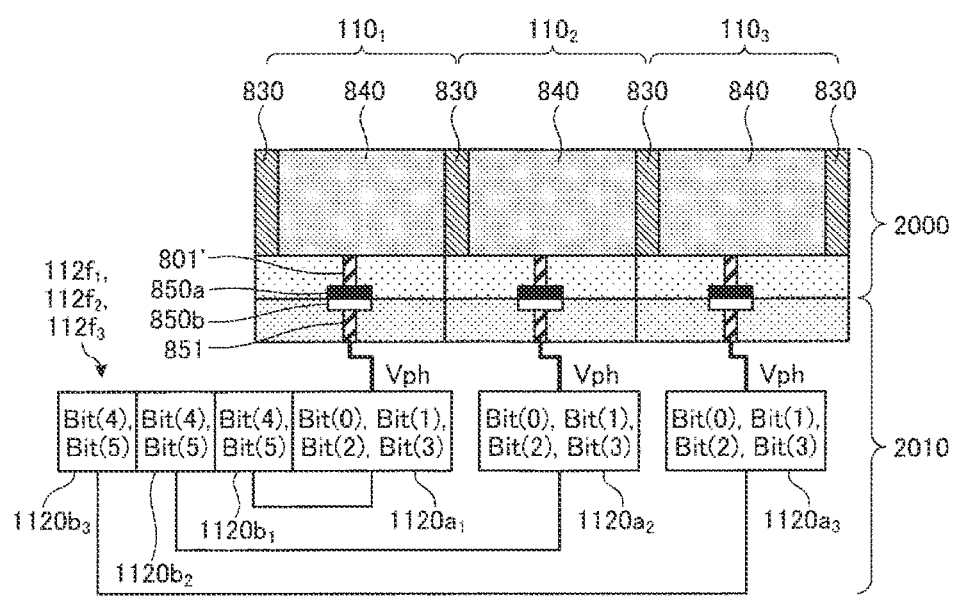
FIG. 21 is a diagram showing an example configuration of a counter according to a sixth example that is applicable to the first embodiment.

Next, a sixth example of the counter 112 that is applicable to the first embodiment will be described. The sixth example of the counter 112 is an example in which an arrangement of the respective counters 1120 (or 1120') that constitute the counter 112 has been modified. FIG. 21 is a diagram showing an example configuration of counters $112f_1$, $112f_2$, and $112f_3$ according to the sixth example that is applicable to the first embodiment. It should be noted that any of the counters 112a to 112e described above may be applied to the counters $112f_1$, $112f_2$, and $112f_3$.

The example in FIG. 21 shows three photoelectric conversion elements $110_1$, $110_2$, and $110_3$. In FIG. 21, for the sake of brevity, the pixel separating unit 831 and the photoelectric conversion unit 840 among the configuration shown in FIG. 10 have been extracted and shown.

Referring to FIG. 5, the photoelectric conversion elements $110_1$, $110_2$, and $110_3$ are arranged on the light-receiving chip 2000. On the other hand, the respective counters $112f_1$, $112f_2$, and $112f_3$ are arranged on the logic chip 2010. The photoelectric conversion elements $110_1$, $110_2$, and $110_3$ on the light-receiving chip 2000 are connected via an electrode 801' to a connecting portion 850a in the light-receiving chip 2000. The connecting portion 850a is connected to a connecting portion 850b in the logic chip 2010 by, for example, a CCC. On the other hand, each of the counters $112f_1$, $112f_2$, and $112f_3$ is connected via a corresponding electrode 851 to each connecting portion 850b. In other words, each signal Vph output in accordance with an incidence of a photon by the photoelectric conversion elements $110_1$, $110_2$, and $110_3$ is supplied to each of the counters $112f_1$, $112f_2$, and $112f_3$ via the electrode 801', the connecting portions 850a and 850b, and the electrode 851.

In this case, for the sake of description, it is assumed that the counter 112a shown in FIG. 16A is applied as each of the counters $112f_1$, $112f_2$, and $112f_1$. In addition, it is assumed that the counters $112f_1$, $112f_2$, and $112f_3$ are respectively 6-bit counters that include six counters 1120 (Bit(0)) to 1120 (Bit(5)).

Furthermore, hereinafter, unless otherwise noted, the respective counters 1120 (Bit(0)), 1120 (Bit(1)), 1120 (Bit(2)), and 1120 (Bit(3)) on an LSB side among the six counters 1120 (Bit(0)) to 1120 (Bit(5)) included in each of the counters $112f_1$, $112f_2$, and $112f_3$ will be collated and described as counters $1120a_1$, $1120a_2$, and $1120a_3$. In a similar manner, the respective counters 1120 (Bit(4)) and 1120 (Bit(5)) on an MSB side among the six counters 1120 (Bit(0)) to 1120 (Bit(5)) included in each of the counters $112f_1$, $112f_2$, and $112f_3$ will be collated and described as counters $1120b_1$, $1120b_2$, and $1120b_3$.

For example, the respective LSB-side counters $1120a_1$ that are included in the counter $112f_1$ perform counting at a higher speed than the respective MSB-side counters $1120b_1$. In consideration thereof, the respective LSB-side counters $1120a_1$, that are included in the counter $112f_1$ are arranged at positions corresponding to directly underneath the corresponding photoelectric conversion element $110_1$ on the logic chip 2010. With respect to the counters $112f_2$ and $112f_3$, similarly, the LSB-side counters $1120a_2$ and $1120a_3$ that are included in the respective counters $112f_2$ and $112f_3$ are arranged at positions corresponding to directly underneath the corresponding photoelectric conversion elements $110_2$ and $110_3$ on the logic chip 2010.

On the other hand, the respective MSB-side counters $1120b_1$, $1120b_2$, and $1120b_3$ that are included in the respective counters $112f_1$, $112f_2$, and $112f_3$ are arranged on the logic chip 2010 at organized positions. In this case, as shown in FIG. 21, the respective counters $1120b_1$, $1120b_2$, and $1120b_3$ need not be in close proximity to corresponding LSB-side counters $1120a_1$, $1120a_2$, and $1120a_3$.

As described above, by arranging, in an organized manner, the respective counters $1120b_1$ to $1120b_3$ which have a long average time interval Ta of an incident photon number and a slow counting speed, a trade-off can be established between counting speed and circuit area. Accordingly, the circuit area can be reduced while maintaining performance of the counters $112f_1$ to $112f_3$.

While the MSB-side counters $1120b_1$ to $1120b_3$ are organized with respect to three photoelectric conversion elements $110_1$ to $110_3$ in FIG. 21, the arrangement of the MSB-side counters 1120 is not limited thereto and the MSB-side counters 1120 may be arranged in an organized manner with respect to two photoelectric conversion elements 110 or four or more photoelectric conversion elements 110.

1-4-7. Seventh Example of Counter

Figure 22:
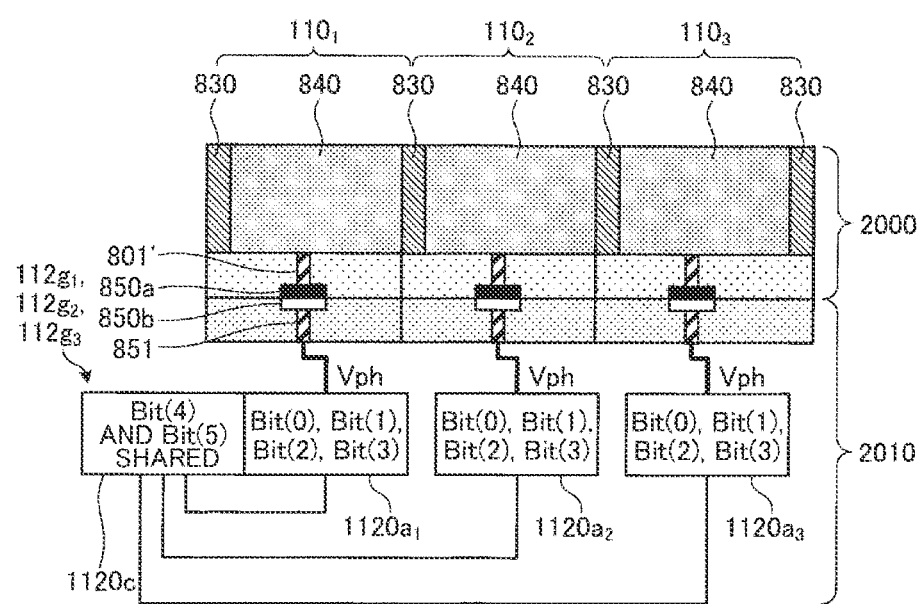
FIG. 22 is a diagram showing an example configuration of a counter according to a seventh example that is applicable to the first embodiment.

Next, a seventh example of the counter 112 that is applicable to the first embodiment will be described. The seventh example of the counter 112 is an example in which the respective MSB-side counters $1120b_1$ to $1120b_3$ in the sixth example described above are shared. FIG. 22 is a diagram showing an example configuration of counters $112g_1$, $112g_2$, and $112g_3$ according to the seventh example that is applicable to the first embodiment. It should be noted that any of the counters 112a to 112e described above may be applied to the counters $112g_1$, $112g_2$, and $112g_3$.

As shown in FIG. 22, in the respective counters $112g_1$ to $112g_3$, the respective LSB-side counters $1120a_1$ to $1120a_3$ are arranged at positions corresponding to directly underneath the corresponding photoelectric conversion elements $110_1$ to $110_3$ on the logic chip 2010 in a similar manner to the sixth example described above. On the other hand, the respective MSB-side counters 1120 (Bit(4)) and 1120 (Bit(5)) that are included in the respective counters $112g_1$ to $112g_3$ are organized by the respective counters $112g_1$ to $112g_3$ and arranged on the logic chip 2010 as a counter 1120c.

Figure 23:
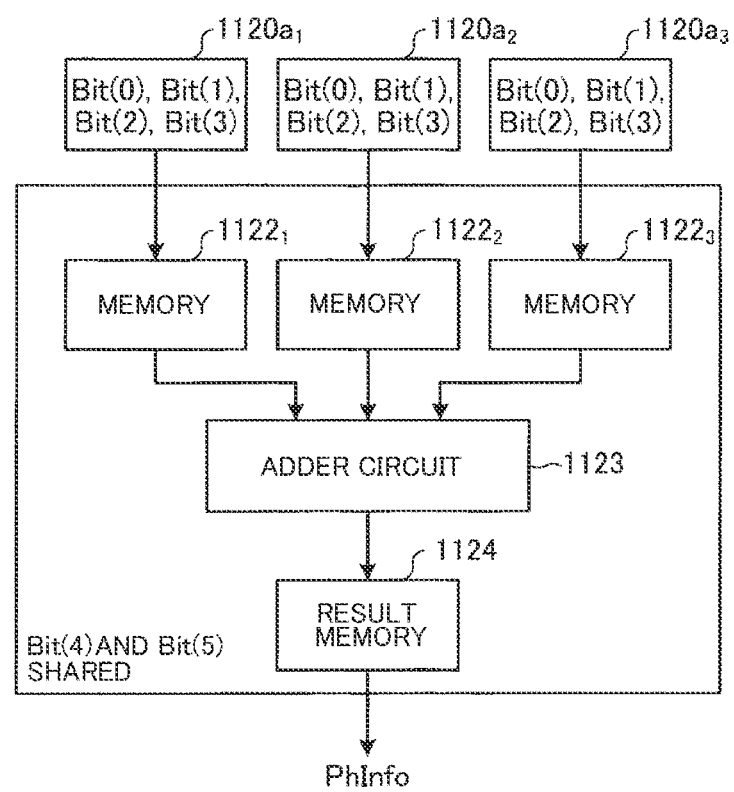
FIG. 23 is a block diagram showing an example configuration of a counter that is applicable to the first embodiment.

FIG. 23 is a block diagram showing an example configuration of the counter 1120c that is applicable to the first embodiment. In FIG. 23, the counter 1120c includes memories $1122_1$, $1122_2$, and $1122_3$, an adder circuit 1123, and a result memory 1124.

For example, an output of the LSB-side counter $1120a_1$ that corresponds to the photoelectric conversion element $110_1$ is supplied to the memory $1122_1$. The memory 1122k respectively stores output values supplied from the counter $1120a_1$. In other words, the memory $1122_1$ respectively stores values having overflowed from the counter $1120a_1$. Accordingly, the memory $1122_1$ functions as a counter that counts MSB-side bits.

The memories $1122_2$ and $1122_3$ similarly respectively store values having overflowed from the LSB-side counters $1120a_2$ and $1120a_3$ that respectively correspond to the photoelectric conversion elements $110_2$ and $110_3$.

Values stored in the memories $1122_1$, $1122_2$, and $1122_3$ are added by the adder circuit 1123 and stored in the result memory 1124. A value read from the result memory 1124 is output as photon information PhInfo and supplied to, for example, the threshold determining unit 113a.

1-4-8. Eighth Example of Counter

Next, an eighth example of the counter 112 that is applicable to the first embodiment will be described. In the first to seventh examples of the counter 112 described above, the pulse Vpls in accordance with an incidence of a photon with respect to the photoelectric conversion element 110 is counted using a digital counter that counts in binary using values "0" and "1". In the eighth example, the pulse Vpls is counted using an analog counter.

Figure 24:
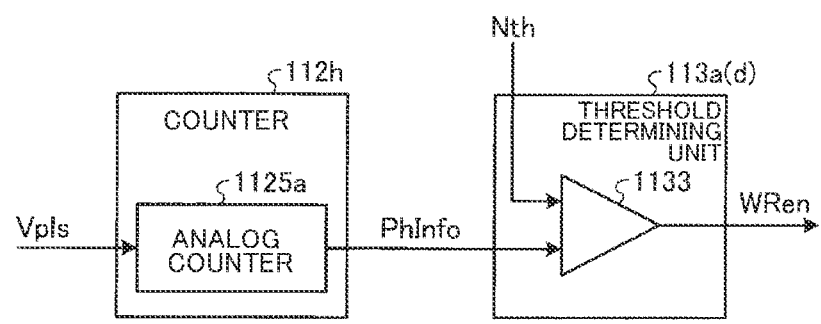
FIG. 24 is a block diagram showing an example configuration of a counter according to an eighth example that is applicable to the first embodiment.

FIG. 24 is a block diagram showing an example configuration of a counter 112h according to an eighth example that is applicable to the first embodiment. In FIG. 24, the counter 112h includes an analog counter 1125a. For example, the analog counter 1125a has a capacitor and stores a charge in accordance with a voltage of the input pulse Vpls in the capacitor. Since a capacitance C of the capacitor, a charge Q to be stored, and a voltage V that is extracted from the capacitor have a relationship expressed as V=Q/C, the analog counter 1125a is capable of extracting a voltage in accordance with the number of input pulses Vpls. The voltage extracted by the analog counter 1125a is supplied as photon information PhInfo to a threshold determining unit 113a(d) that corresponds to the threshold determining unit 113a shown in FIG. 8.

The threshold determining unit 113a(d) includes a comparator 1133 and uses the comparator 1133 to compare the photon information PhInfo that is supplied from the counter 112h and the threshold Nth that is supplied as a voltage value with each other. For example, the comparator 1133 outputs the write signal WRen(W) when the voltage value of the photon information PhInfo is higher than the voltage value of the threshold Nth.

1-4-9. Ninth Example of Counter

Next, a ninth example of the counter 112 that is applicable to the first embodiment will be described. The ninth example is an example in which the pulse Vpls is counted using an analog counter and a digital counter that counts in binary with values "0" and "1".

Figure 25:
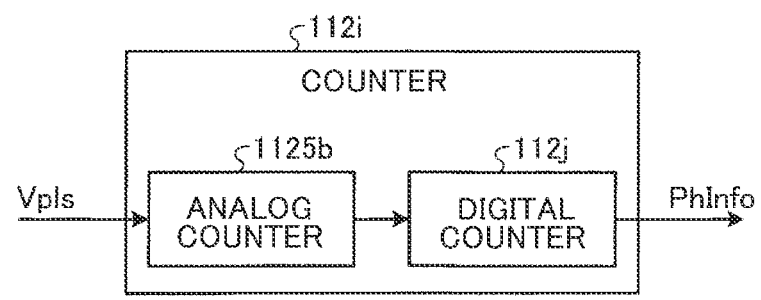
FIG. 25 is a block diagram showing an example configuration of a counter according to a ninth example that is applicable to the first embodiment.

FIG. 25 is a block diagram showing an example configuration of a counter 112i according to a ninth example that is applicable to the first embodiment. In FIG. 25, the counter 112i includes an analog counter 1125b and a digital counter 112j that is connected in series to the analog counter 1125b. Any of the counters 112a to 112e described above may be applied to the digital counter 112j.

For example, the analog counter 1125b that is applied to the ninth example has a capacitor in a similar manner to the analog counter 1125a described above and stores a charge in accordance with a voltage of the input pulse Vpls in the capacitor. The analog counter 1125b according to the ninth example is configured to further monitor a charge amount that is stored in the capacitor and output a pulse when a charge of which an amount equals or exceeds a predetermined amount is stored in the capacitor. For example, the analog counter 1125b detects a charge amount that is stored in the capacitor in a predetermined number of gradations (for example, 16 gradations) and outputs a pulse for each gradation. For example, the analog counter 1125b detects one gradation in response to an input of one pulse Vpls. When the charge amount stored in the capacitor reaches the predetermined number of gradations, the analog counter 1125b resets the counter.

The digital counter 112j counts the pulses that are output from the analog counter 1125b and outputs a count value as photon information PhInfo. For example, when the digital counter 112j corresponds to the counter 112a described earlier, the photon information PhInfo is supplied to the threshold determining unit 113a.

1-4-10. Tenth Example of Counter

Next, a tenth example of the counter 112 that is applicable to the first embodiment will be described. The ninth example is an example in which the pulse Vpls is counted using a counter constituted by a digital counter, an analog counter, a memory, and an adder.

Figure 26:
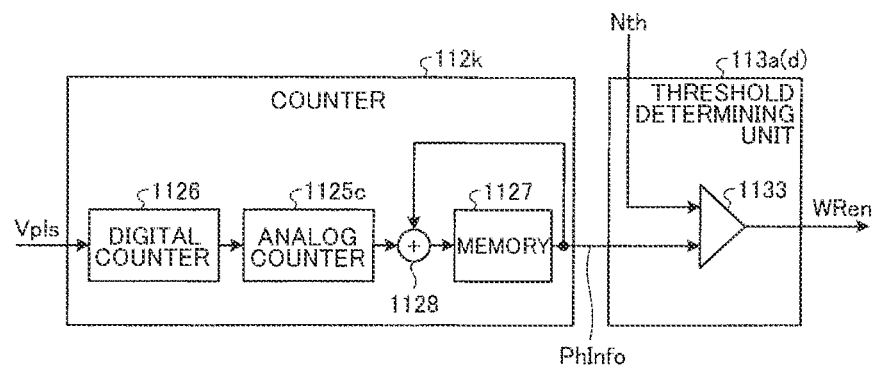
FIG. 26 is a block diagram showing an example configuration of a counter according to a tenth example that is applicable to the first embodiment.

FIG. 26 is a block diagram showing an example configuration of a counter 112k according to the tenth example that is applicable to the first embodiment. In FIG. 26, the counter 112k includes a digital counter 1126, an analog counter 1125c that is connected in series to the digital counter 1126, a memory 1127, and an adder 1128. The digital counter 1126 is, for example, a 1-bit counter and can be constructed using a single T-FF. In addition, it is assumed that the analog counter 1125b described above is applied as the analog counter 1125c.

The digital counter 1126 outputs a voltage indicating a value of "1" in response to an input of the pulse Vpls. The voltage is supplied to the analog counter 1125c and stored in the capacitor. The analog counter 1125c detects a charge amount that is stored in the capacitor in a predetermined number of gradations (for example, 16 gradations) and outputs a pulse for each gradation.

The adder 1128 has first and second input terminals, adds up a signal input to the first input terminal and a signal input to the second input terminal, and outputs a result of the addition. The output of the adder 1128 is input to and stored in the memory 1127. A signal read from the memory 1127 is output as photon information PhInfo and, at the same time, supplied to the second input terminal of the adder 1128. In this manner, a counter can be constituted by the adder 1128 and the memory 1127. In the case of the tenth example, the memory 1127 can be constituted by a capacitor.

The photon information PhInfo output from the memory 1127 is supplied to the threshold determining unit 113a(d)

that corresponds to the threshold determining unit 113*a* shown in FIG. 8. For example, a configuration similar to that of the threshold determining unit 113*a*(*d*) described using FIG. 24 can be applied to the threshold determining unit 113*a*(*d*). In other words, the threshold determining unit 113*a*(*d*) uses the comparator 1133 to compare the photon information PhInfo that is supplied from the counter 112*k* and the threshold Nth that is supplied as a voltage value with each other and outputs a write signal WRen(W) in accordance with a comparison result.

1-5. Arrangement of TC Generating Unit and Pixel Circuit Applicable to First Embodiment Next, an example of an arrangement of the TC generating unit 120 and the pixel circuit 100*a* according to the first embodiment will be described. Hereinafter, for convenience's sake, the pixel circuit 100*a* will be described as the pixel circuit 100. In addition, in FIGS. 27 to 33 described below, a description of the signal SH_ON that is output from the TC generating unit 120 is omitted.

1-5-1. First Arrangement Example According to First Embodiment

Figure 27:
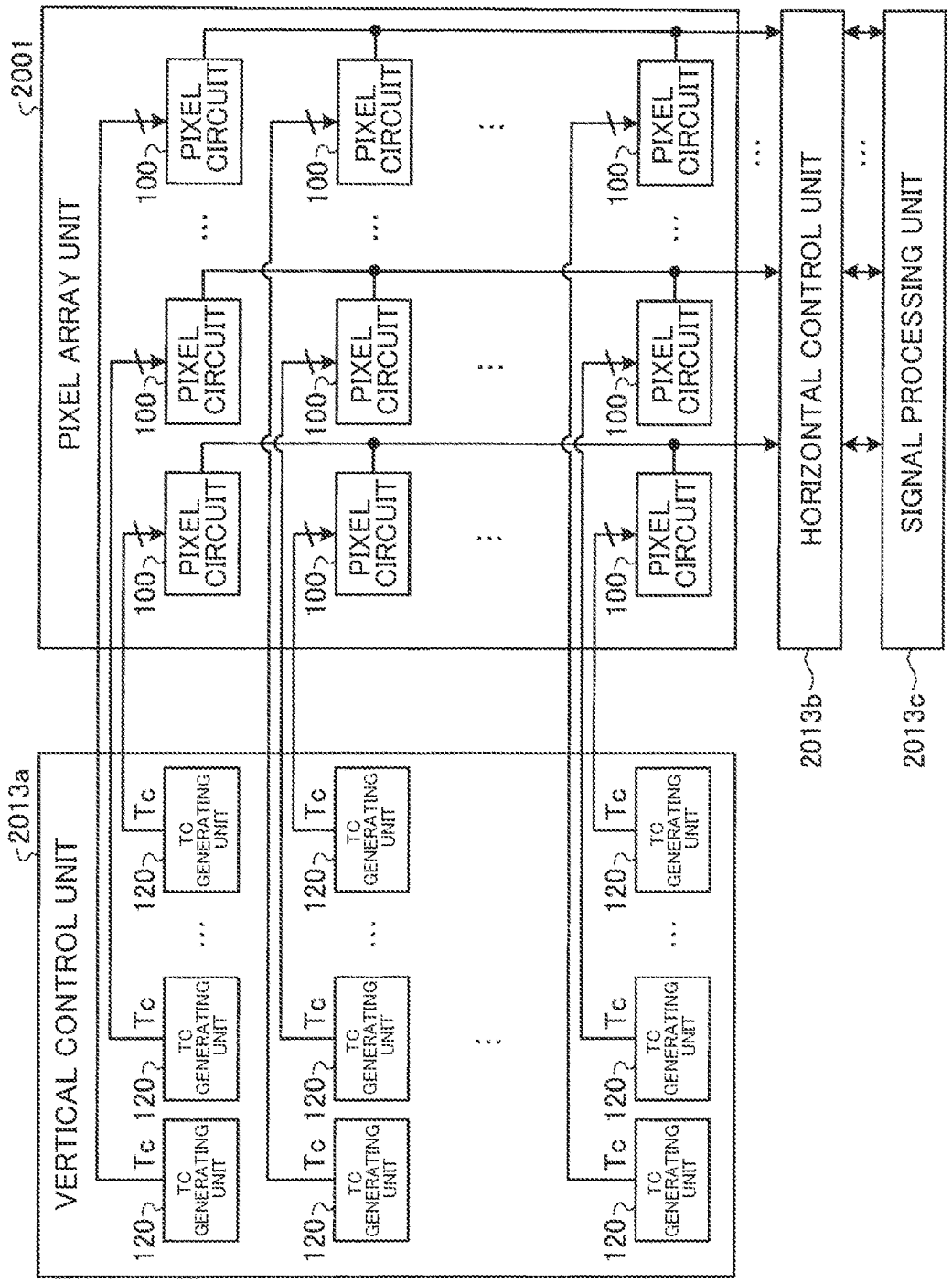
FIG. 27 is a diagram showing an arrangement example of a TC generating unit and a pixel circuit according to a first arrangement example according to the first embodiment.

First, a first arrangement example according to the first embodiment of the TC generating unit 120 and the pixel circuit 100 according to the first embodiment will be described. FIG. 27 is a diagram showing an arrangement example of the TC generating unit 120 and the pixel circuit 100 according to the first arrangement example according to the first embodiment.

In the first arrangement example according to the first embodiment, as shown in FIG. 27, the TC generating unit 120 is provided for each pixel circuit 100. In other words, the vertical control unit 2013*a* includes the TC generating unit 120 provided in a quantity that corresponds to the number of pixel circuits 100 that are included in the pixel array unit 2001. Each TC generating unit 120 respectively supplies the signal SH_ON and the time code Tc to a corresponding pixel circuit 100.

With the first arrangement example according to the first embodiment, an issuing speed (time interval) of the time code Tc can be controlled for each pixel circuit 100. Therefore, a variation in each pixel circuit 100 can be suppressed. For example, an arrangement according to the first arrangement example according to the first embodiment can conceivably be applied to a line sensor in which the respective pixel circuits 100 are arranged on a line to homogenize characteristics of the respective pixel circuits 100.

1-5-2. Second Arrangement Example According to First Embodiment

Figure 28:
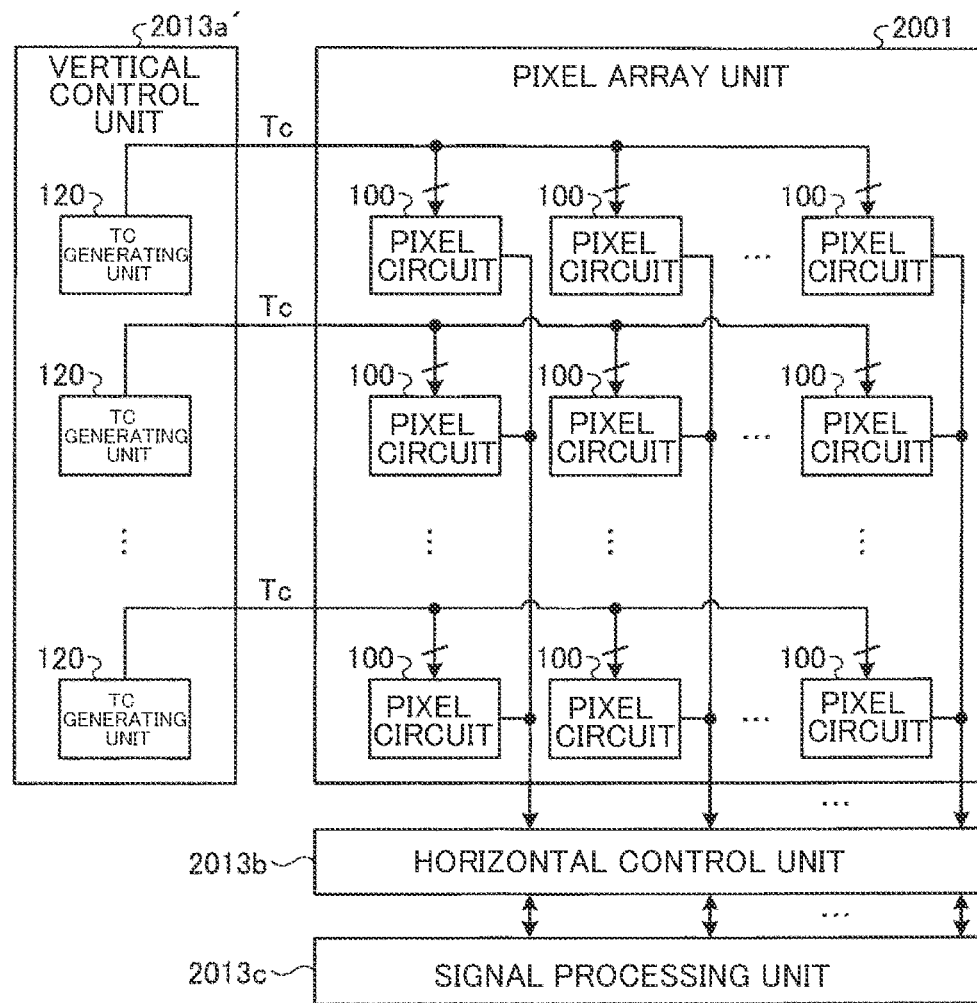
FIG. 28 is a diagram showing an arrangement example of a TC generating unit and a pixel circuit according to a second arrangement example according to the first embodiment.

Next, a second arrangement example according to the first embodiment of the TC generating unit 120 and the pixel circuit 100 according to the first embodiment will be described. FIG. 28 is a diagram showing an arrangement example of the TC generating unit 120 and the pixel circuit 100 according to the second arrangement example according to the first embodiment. In the second arrangement example according to the first embodiment, as shown in FIG. 28, the TC generating unit 120 is provided for each row of the respective pixel circuits 100 that are arranged in a two-dimensional grid pattern in the pixel array unit 2001. In other words, the second arrangement according to the first embodiment has a configuration that corresponds to FIG. 8 described earlier. The TC generating unit 120 commonly supplies the time code Tc and the signal SH_ON with respect to each pixel circuit 100 that is arranged in a corresponding row of the two-dimensional grid.

The configuration according to the second arrangement example according to the first embodiment is compatible with an existing sensor. In addition, wirings can be reduced in comparison to the configuration according to the first arrangement example according to the first embodiment described above.

1-5-3. Third Arrangement Example According to First Embodiment

Figure 29:
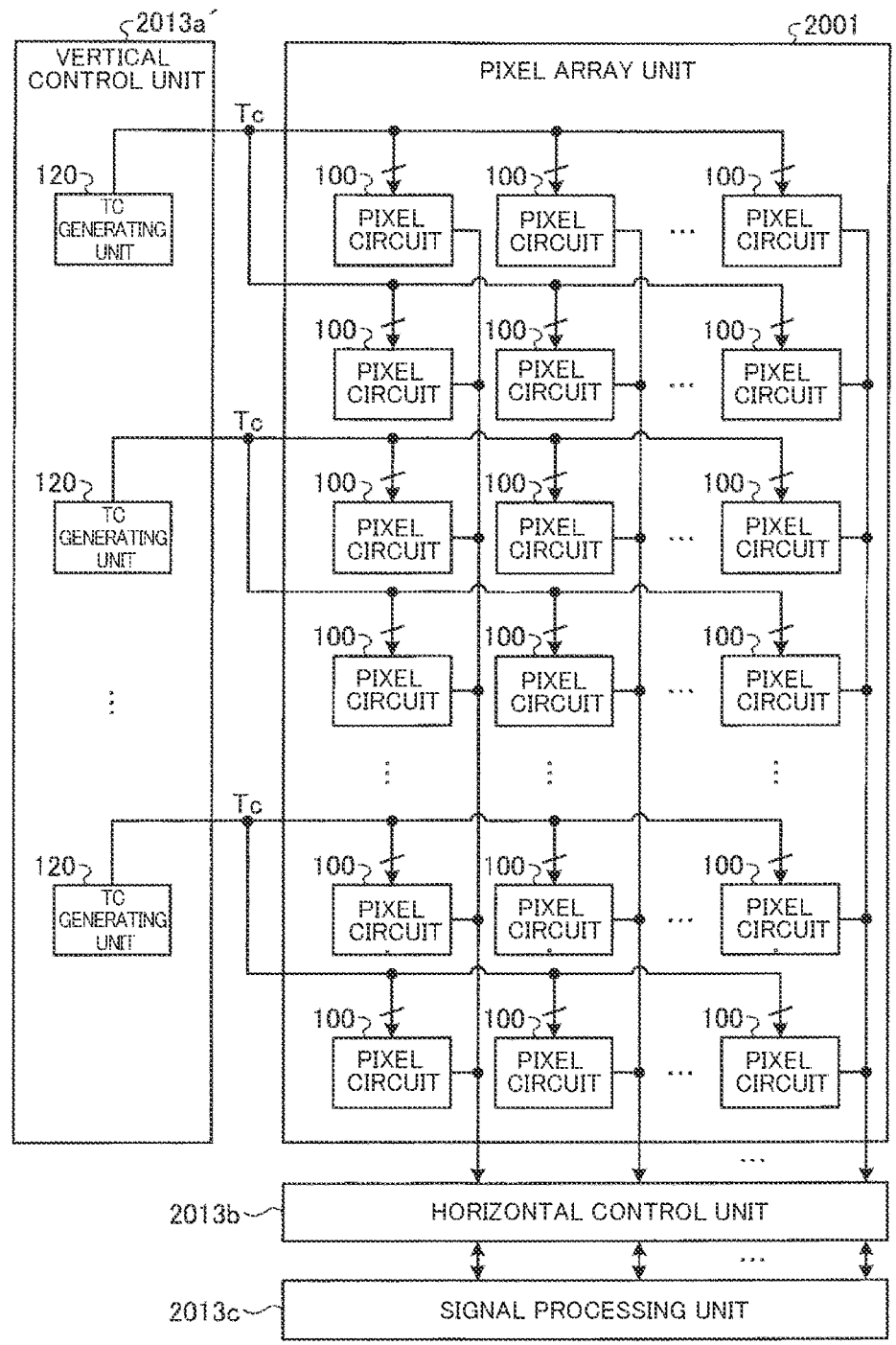
FIG. 29 is a diagram showing an arrangement example of a TC generating unit and a pixel circuit according to a third arrangement example according to the first embodiment.

Next, a third arrangement example according to the first embodiment of the TC generating unit 120 and the pixel circuit 100 according to the first embodiment will be described. FIG. 29 is a diagram showing an arrangement example of the TC generating unit 120 and the pixel circuit 100 according to the third arrangement example according to the first embodiment. In the third arrangement example according to the first embodiment, as shown in FIG. 29, the TC generating unit 120 is provided for every two rows of the respective pixel circuits 100 that are arranged in a two-dimensional grid pattern in the pixel array unit 2001. The TC generating unit 120 commonly supplies the time code Tc and the signal SH_ON with respect to each pixel circuit 100 that is arranged in two corresponding rows of the two-dimensional grid.

Figure 30:
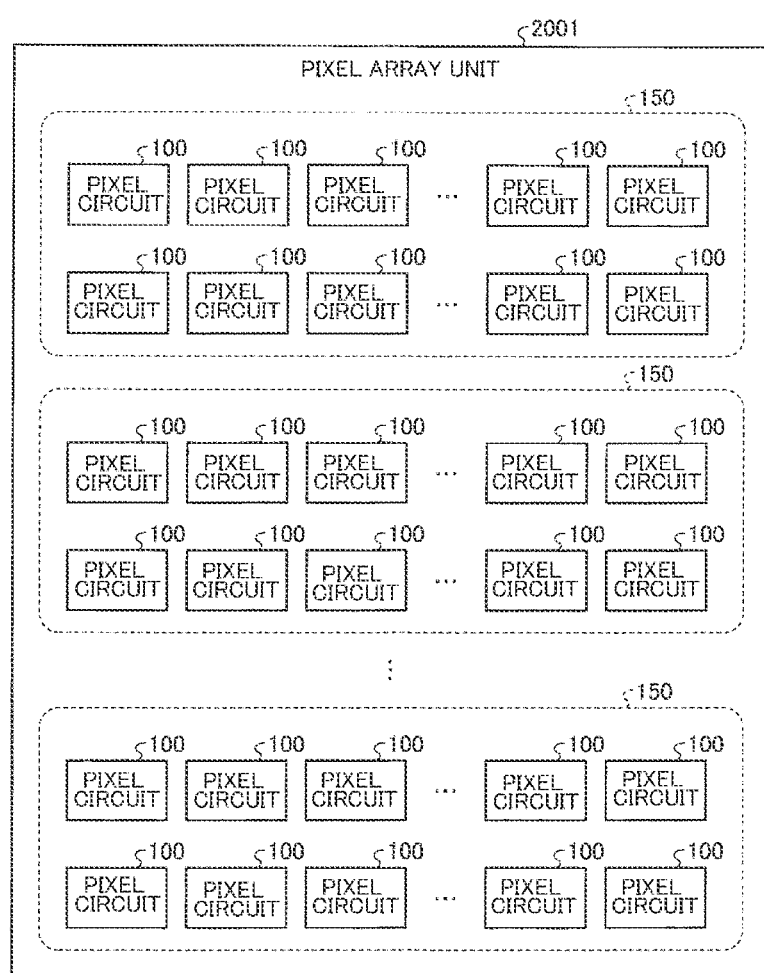
FIG. 30 is a diagram showing the third arrangement example according to the first embodiment with a focus on a pixel array unit.

FIG. 30 is a diagram showing the third arrangement example according to the first embodiment with a focus on the pixel array unit 2001. As shown in FIG. 30, the respective pixel circuits 100 arranged in a two-dimensional grid pattern in the pixel array unit 2001 can be handled in units of a group 150 organized for every two rows of the two-dimensional grid. In other words, the TC generating unit 120 is provided for each group 150, and the time code Tc and the signal SH_ON from the corresponding TC generating unit 120 is supplied to each pixel circuit 100 that is included in the group 150.

The configuration according to the third arrangement example according to the first embodiment enables wirings to be reduced in comparison to the configuration according to the second arrangement example according to the first embodiment described above.

1-5-4. Fourth Arrangement Example According to First Embodiment

Figure 31:
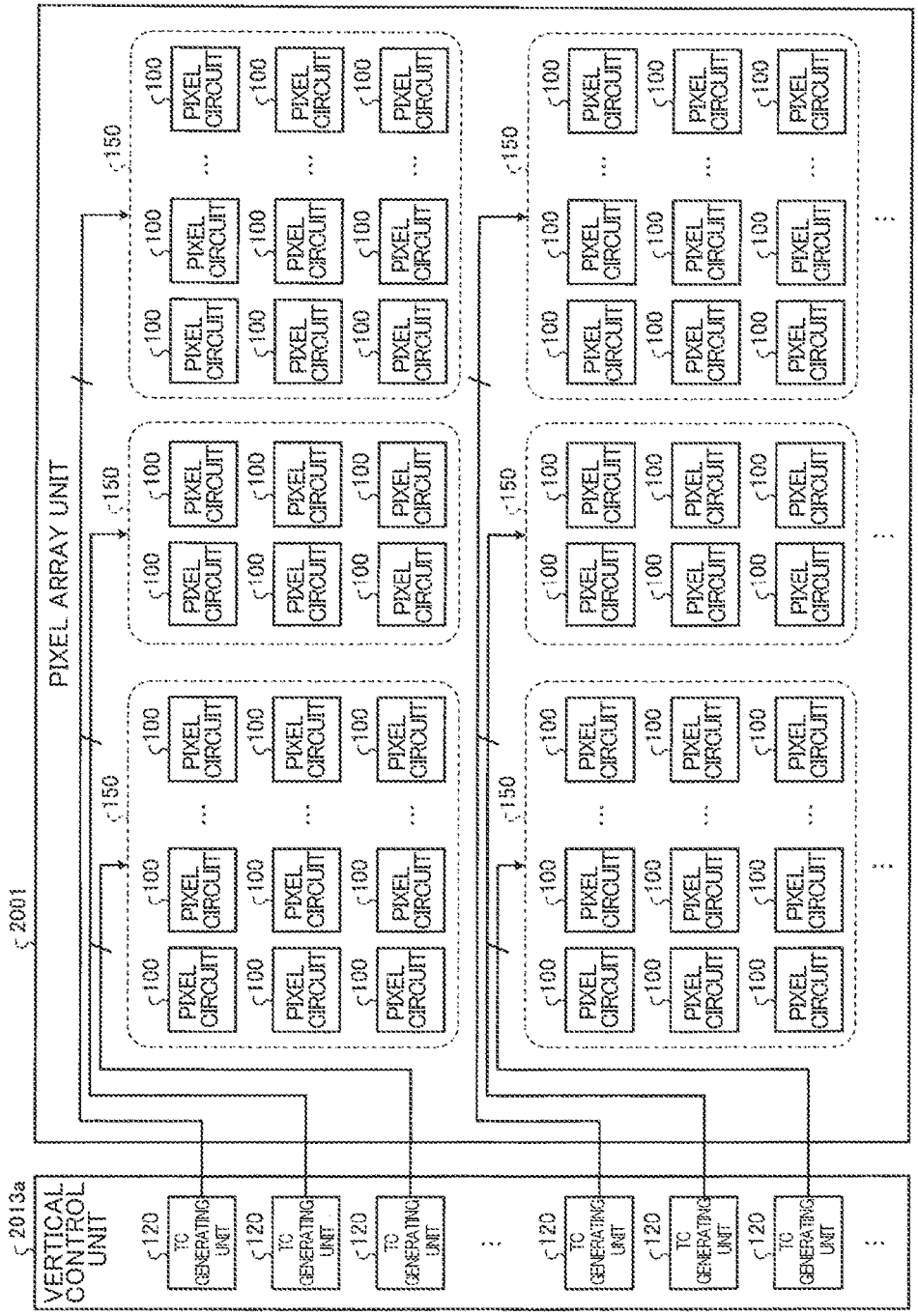
FIG. 31 is a diagram showing an arrangement example of a TC generating unit and a pixel circuit according to a fourth arrangement example according to the first embodiment.

Next, a fourth arrangement example according to the first embodiment of the TC generating unit 120 and the pixel circuit 100 according to the first embodiment will be described. FIG. 31 is a diagram showing an arrangement example of the TC generating unit 120 and the pixel circuit 100 according to the fourth arrangement example according to the first embodiment.

In the fourth arrangement example according to the first embodiment, as shown in FIG. 31, the TC generating unit 120 is provided for each region in the pixel array unit 2001. Each pixel circuit 100 included in each region is commonly supplied the time code Tc and the signal SH_ON from the TC generating unit 120 that corresponds to each region. In other words, in the fourth arrangement example according to the first embodiment, the time code Tc and the signal SH_ON are supplied from one TC generating unit 120 with respect to the group 150 constituted by the respective pixel circuits 100 that are included in a region provided in the pixel array unit 2001.

According to the fourth arrangement example according to the first embodiment, for example, a bias condition of each pixel circuit 100 can be controlled for each region. As an example, there is a case where the bias condition for obtaining the predicted count value Npre based on the time Tth at which the photon number incident to the photoelectric conversion element 110 reaches the threshold Nth is desirably corrected for each region of the pixel array unit 2001. In this case, applying the fourth arrangement example according to the first embodiment enables a function for correcting the bias condition to be included in each TC generating unit 120.

1-5-5. Fifth Arrangement Example According to First Embodiment

Next, a fifth arrangement example according to the first embodiment of the TC generating unit 120 and the pixel circuit 100 according to the first embodiment will be described. The fifth arrangement example according to the first embodiment is an example of a case where the photoelectric conversion element 110 included in each pixel circuit 100 is provided with a color filter. In the fifth arrangement example according to the first embodiment, in each row of the pixel array unit 2001, pixel circuits 100 that include the photoelectric conversion element 110 provided with a color filter of a same color are organized as a group and the TC generating unit 120 is provided for each group.

Figure 32:
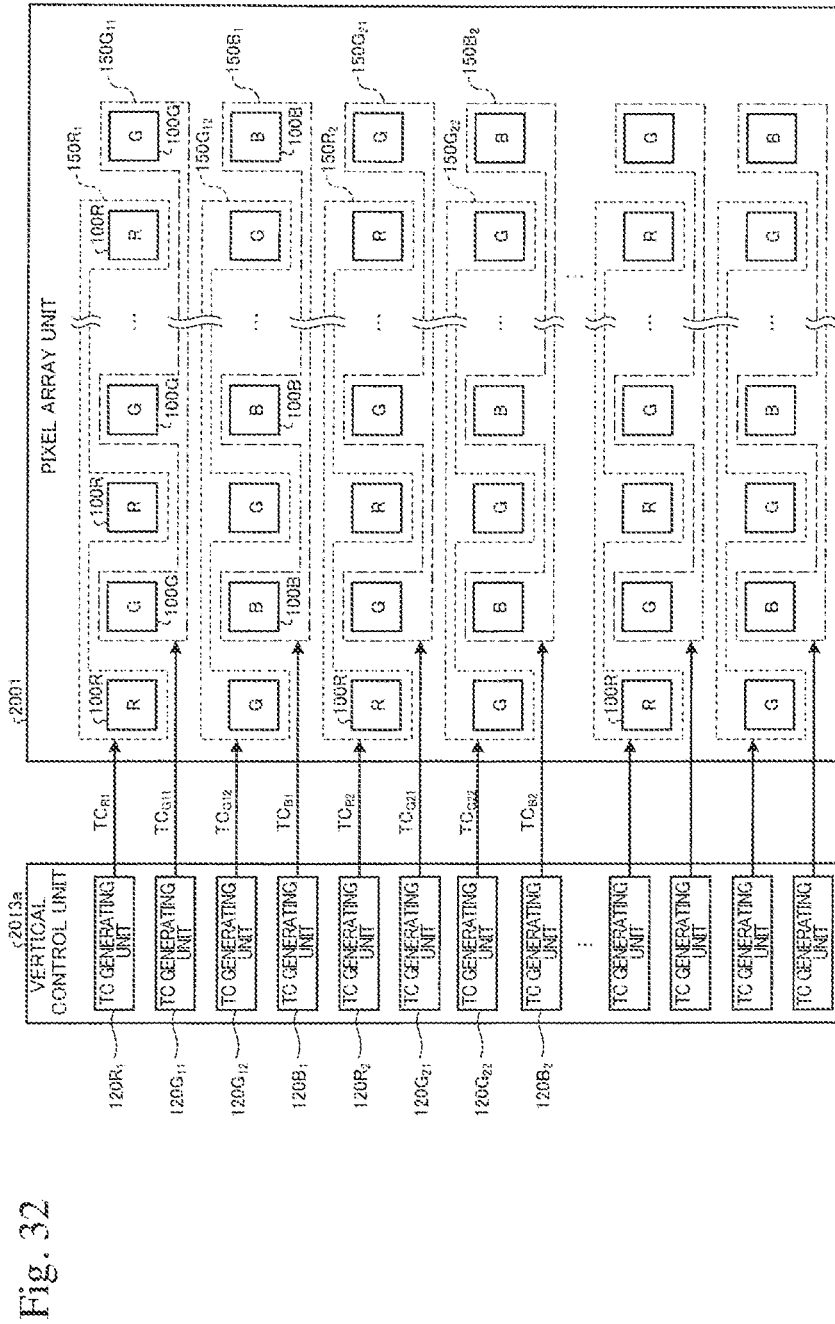
FIG. 32 is a diagram showing an arrangement example of a TC generating unit and a pixel circuit according to a fifth arrangement example according to the first embodiment.

FIG. 32 is a diagram showing an arrangement example of the TC generating unit 120 and pixel circuits 100R, 100G, and 100B according to the fifth arrangement example according to the first embodiment. It should be noted that the pixel circuits 100R, 100G, and 100B respectively include photoelectric conversion elements 110 provided with R (red), G (green), and B (blue) color filters. In this case, the respective pixel circuits 100R, 100G, and 100B are arranged in a Bayer array. In other words, the respective pixel circuits 100R, 100G, and 100B are arranged in a 2×2 array such that one each of the pixel circuits 100R and 100B and two pixel circuits 100G are arranged so that pixel circuits of a same color are not adjacent to each other.

In FIG. 32, for example, the pixel circuit 100R and the pixel circuit 100G are alternately arranged in a first row from the top. With respect to a group 150R₁ that includes the respective pixel circuits 100R arranged in the first row, a time code $Tc_{R1}$ and a signal $SH\_ON_{R1}$ (not illustrated) are supplied from a TC generating unit 120R₁. In addition, with respect to a group 150G₁₁ that includes the respective pixel circuits 100G arranged in the first row, a time code $Tc_{G11}$ and a signal $SH\_ON_{G11}$ (not illustrated) are supplied from a TC generating unit 120G₁₁.

With respect to a group 150G₁₂ that includes the respective pixel circuits 100G arranged in the second row, a time code $Tc_{G12}$ and a signal $SH\_ON_{G12}$ (not illustrated) are supplied from a TC generating unit 120G₁₂. In addition, with respect to a group 150B₁ that includes the respective pixel circuits 100B arranged in the second row, a time code $Tc_{B1}$ and a signal $SH\_ON_{B1}$ (not illustrated) are supplied from a TC generating unit 120B₁.

In a similar manner, according to the Bayer array, for example, in the third and fourth row, with respect to a group 150R₂ that includes the respective pixel circuits 100R arranged in the third row, a time code $Tc_{R2}$ and a signal $SH\_ON_{R2}$ (not illustrated) are supplied from a TC generating unit 120R₂. In addition, with respect to a group 150G₂₁ that includes the respective pixel circuits 100G arranged in the third row, a time code $Tc_{G21}$ and a signal $SH\_ON_{G21}$ (not illustrated) are supplied from a TC generating unit 120G₂₁.

With respect to a group 150G₂₂ that includes the respective pixel circuits 100G arranged in the fourth row, a time code $Tc_{G22}$ and a signal $SH\_ON_{G22}$ (not illustrated) are supplied from a TC generating unit 120G₂₂. In addition, with respect to a group 150B₂ that includes the respective pixel circuits 100B arranged in the fourth row, a time code $Tc_{B2}$ and a signal $SH\_ON_{B2}$ (not illustrated) are supplied from a TC generating unit 120B₂.

Thereafter, in a similar manner according to the Bayer array, in the fifth row, the sixth row, the seventh row, the eighth row, and so on, pixel circuits provided with a color filter of the same color are organized into a same group, and the time code Tc and the signal SH_ON are supplied to the group from a common TC generating unit.

The respective photoelectric conversion elements 110 provided with color filters of R color, G color, and B color have different sensitivities with respect to an incident photon. According to the fifth arrangement, with respect to the respective pixel circuits 100R, 100G, and 100B, the TC generating unit 120 is provided in an organized manner for each color of the color filters. Therefore, a different sensitivity in accordance with the color of the color filter of the photoelectric conversion element 110 can be corrected by control of photon number prediction based on the predicted count value Npre.

1-5-6. Sixth Arrangement Example According to First Embodiment

Next, a sixth arrangement example according to the first embodiment of the TC generating unit 120 and the pixel circuit 100 according to the first embodiment will be described. The sixth arrangement example according to the first embodiment is an example of a case where the photoelectric conversion element 110 included in each pixel circuit 100 is provided with a color filter and, at the same time, one TC generating unit 120 is commonly provided for all pixel circuits 100 included in the pixel array unit 2001.

Figure 33:
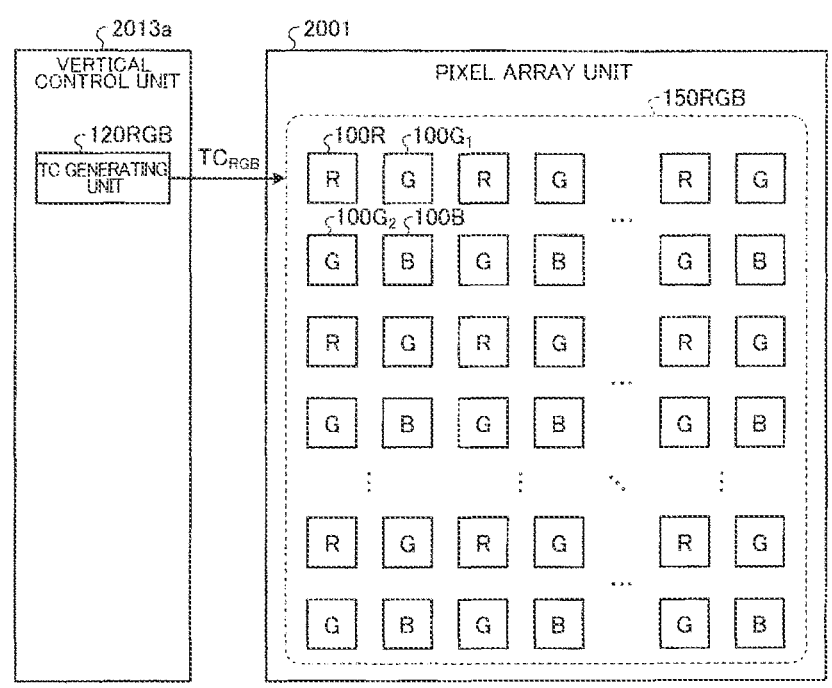
FIG. 33 is a diagram showing an arrangement example of a TC generating unit and a pixel circuit according to a sixth arrangement example according to the first embodiment.

FIG. 33 is a diagram showing an arrangement example of the TC generating unit 120 and pixel circuits 100R, 100G₁, 100G₂, and 100B according to the sixth arrangement example according to the first embodiment. It should be noted that the pixel circuits 100G₁ and 100G₂ respectively correspond to the two G pixels included in a Bayer array. In FIG. 33, all of the pixel circuits 100R, 100G₁, 100G₂, and 100B that are included in the pixel array unit 2001 are included in a single group 150RGB. With respect to all of the pixel circuits 100R, 100G₁, 100G₂, and 100B that are included in the group 150RGB, a time code $Tc_{RGB}$ and a signal $SH\_ON_{RGB}$ (not illustrated) are commonly supplied from a single TC generating unit 120RGB.

As described above, by providing a common TC generating unit 120RGB with respect to all of the pixel circuits 100R, 100G₁, 100G₂, and 100B that are included in the pixel array unit 2001, global shutter can be readily accommodated.

It should be noted that arrangements of the respective pixel circuits 100R, 100G, and 100B and the respective pixel circuits 100R, 100G₁, 100G₂, and 100B in the sixth and seventh arrangement examples of the first embodiment are not limited to a Bayer type. In addition, the color filters to be provided in the pixel circuits 100 are not limited to primary color system filters of the three colors of R, G, and B and may be complementary color system filters of the four colors of C (cyan), M (magenta), Y (yellow), and G.

Furthermore, in addition to the R, G, and color filters or complementary color system filters of C, M, Y, and G, the respective pixel circuits 100 may be further provided with optical filters of other types.

For example, in addition to the R, G, and B color filters, the respective pixel circuits 100 may be further provided with IR filters for selectively transmitting light in the infrared range. As an example, an IR filter can conceivably be provided with respect to one of the pixel circuits 100 provided with a G color filter in the Bayer array.

Furthermore, in addition to the R, G, and B color filters, for example, the respective pixel circuits 100 may be further provided with transparent filters for transmitting light over a wide wavelength band including respective wavelength bands of R, G, and B. Even in this case, a transparent filter can conceivably be provided with respect to one of the pixel circuits 100 provided with a G color filter in the Bayer array in a similar manner to the IR filter described above.

Furthermore, examples of color filter arrays that differ from a Bayer type array is a Quad Bayer type RGB array. The Quad Bayer type RGB array is an array in which four each of R color filters, G color filters, and B color filters which are respectively arranged in a 2×2 pattern and which are provided with the photoelectric conversion element 110 on a one-to-one basis are arranged in a Bayer array in units of the 2×2 pattern. The Quad Bayer type RGB array may be adopted as the array of the respective pixel circuits 100, each of which is provided with R, G, and B color filters.

1-6. First Modification of First Embodiment

Figure 34:
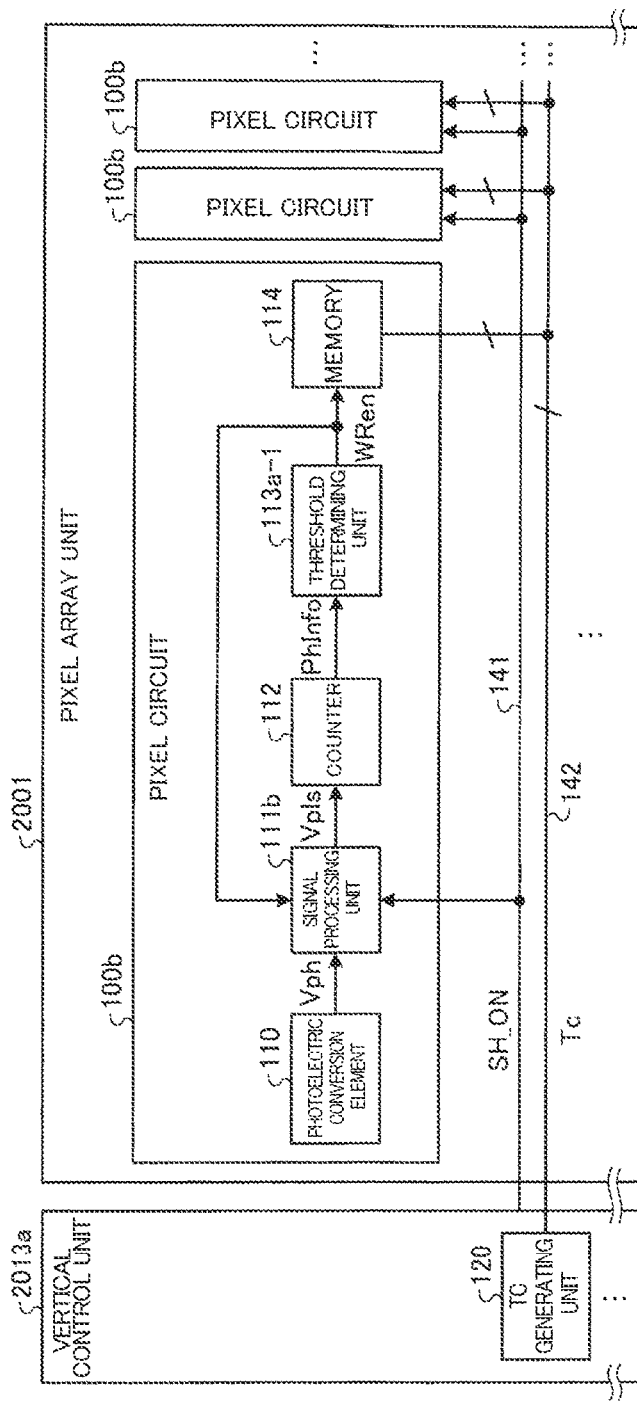
FIG. 34 is a block diagram showing an example configuration of a pixel array unit and a vertical control unit according to a first modification of the first embodiment.

Next, a first modification of the first embodiment will be described. FIG. 34 is a block diagram showing an example configuration of the pixel array unit 2001 and the vertical control unit 2013*a* according to the first modification of the first embodiment.

In FIG. 34, since the vertical control unit 2013*a* shares the configuration of the vertical control unit 2013*a* shown in FIG. 8 described earlier, a description thereof will be omitted here.

In the pixel array unit 2001, a pixel circuit 100*b* includes the photoelectric conversion element 110, a signal processing unit 111*b*, the counter 112, a threshold determining unit 113*a*-1, and the memory 114 in a similar manner to the pixel circuit 100*a* shown in FIG. 8. In the pixel circuit 100*b*, the write signal WRen output from the threshold determining unit 113 is supplied to the memory 114 and, at the same time, supplied to the signal processing unit 111*b*.

When a counted photon number exceeds the threshold Nth within the exposure period Tsh to create a state where the write signal WRen instructs writing of the time code Tc, the signal processing unit 111*b* restricts an operation of the photoelectric conversion element 110. For example, the signal processing unit 111*b* conceivably disconnects a connection to the power supply potential VDD with respect to the photoelectric conversion element 110 in accordance with the write signal WRen(W) and restores the connection to the power supply potential VDD with respect to the photoelectric conversion element 110 at the start time point of the exposure period Tsh.

Restricting the operation of the photoelectric conversion element 110 in accordance with the write signal WRen enables power consumption by the pixel circuit 100*b* to be reduced.

1-7. Second Modification of First Embodiment

Figure 35:
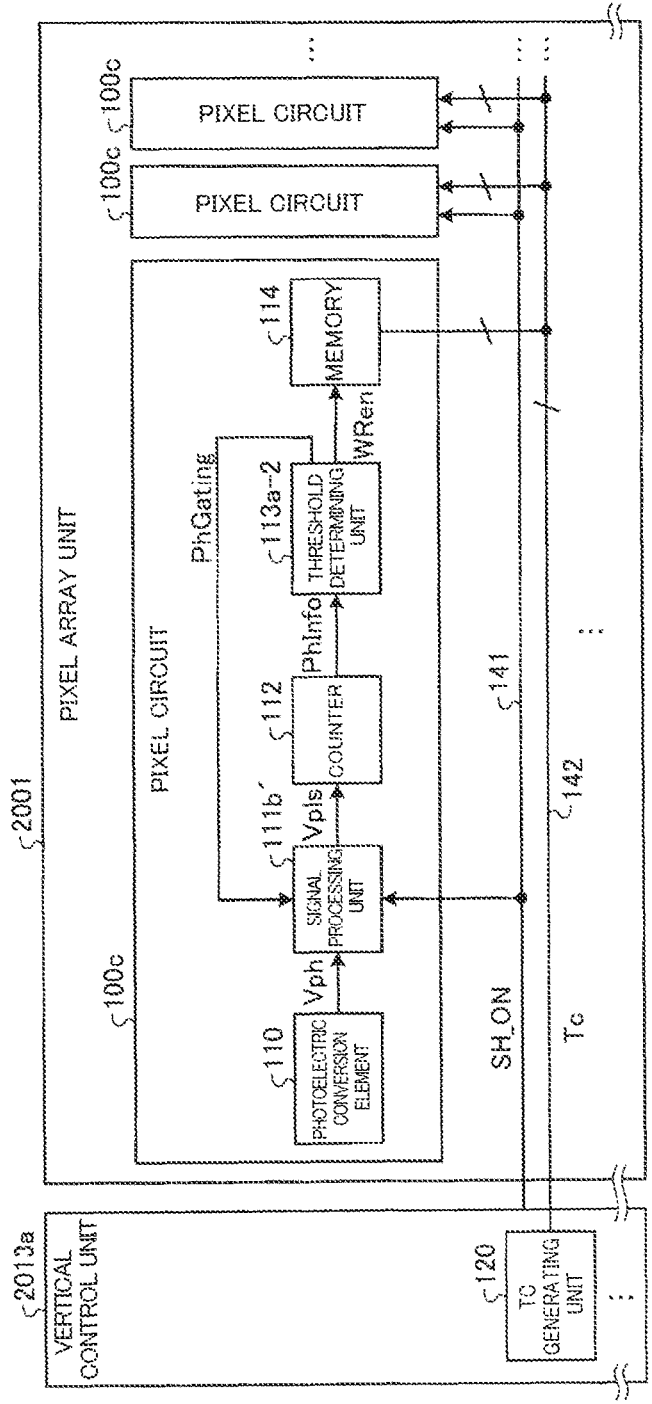
FIG. 35 is a block diagram showing an example configuration of a pixel array unit and a vertical control unit according to a second modification of the first embodiment.

Next, a second modification of the first embodiment will be described. FIG. 35 is a block diagram showing an example configuration of the pixel array unit 2001 and the vertical control unit 2013*a* according to the second modification of the first embodiment.

In FIG. 35, since the vertical control unit 2013*a* shares the configuration of the vertical control unit 2013*a* shown in FIG. 8 described earlier, a description thereof will be omitted here. In addition, in a pixel circuit 100*c* in the pixel array unit 2001, functions of a signal processing unit 111*b*' and a threshold determining unit 113*a*-2 have been changed as compared to the pixel circuit 100*b* shown in FIG. 34.

In the second modification of the first embodiment, the operation of the photoelectric conversion element 110 is restricted in accordance with a detection of the threshold Nth by the threshold determining unit 113*a*-2 in a similar manner to the first modification of the first embodiment described above. In this case, the threshold determining unit 113*a*-2 according to the second modification of the first embodiment generates a signal PhGating for restricting the operation of the photoelectric conversion element 110 separately from the write signal WRen and supplies the generated signal PhGating to the signal processing unit 111*b*'.

The signal processing unit 111*b*' restricts the operation of the photoelectric conversion element 110 in accordance with the signal PhGating. For example, the signal processing unit 111*b*' conceivably disconnects a connection to the power supply potential VDD with respect to the photoelectric conversion element 110 in accordance with the signal PhGating and restores the connection to the power supply potential VDD with respect to the photoelectric conversion element 110 at the start time point of the exposure period Tsh.

Restricting the operation of the photoelectric conversion element 110 in accordance with the signal PhGating enables power consumption by the pixel circuit 100*c* to be reduced.

1-8. Third Modification of First Embodiment

Next, a third modification of the first embodiment will be described. In the third modification of the first embodiment, a dual-mode counter configured so as to be switchable between a counting operation and a storage operation is used as a counter for counting the pulse Vpls in accordance with an incidence of a photon with respect to the photoelectric conversion element 110. Using a dual-mode counter enables, for example, the memory 114 in the pixel circuit 100*a* shown in FIG. 8 to be omitted and a circuit area to be reduced.

Figure 36:
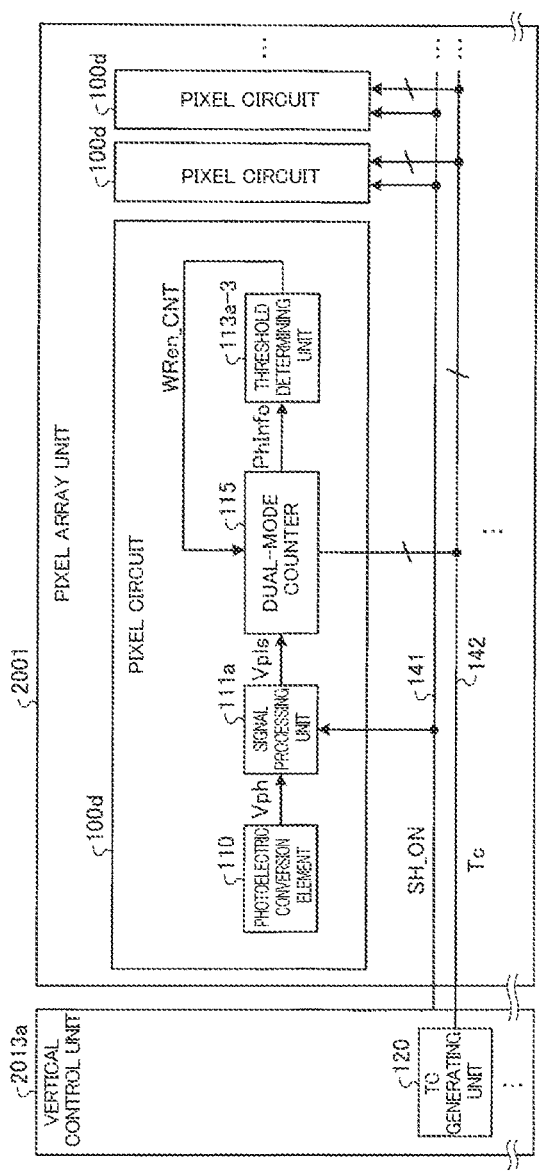
FIG. 36 is a block diagram showing an example configuration of a pixel array unit and a vertical control unit according to a third modification of the first embodiment.

FIG. 36 is a block diagram showing an example configuration of the pixel array unit 2001 and the vertical control unit 2013*a* according to the third modification of the first embodiment.

In FIG. 36, since the vertical control unit 2013*a* shares the configuration of the vertical control unit 2013*a* shown in FIG. 8 described earlier, a description thereof will be omitted here. In addition, in a pixel circuit 100*d* in the pixel array unit 2001, a function of the threshold determining unit 113*a*-3 has been changed, the memory 114 has been omitted, and a dual-mode counter 115 is provided in place of the counter 112 as compared to the pixel circuit 100*a* shown in FIG. 8.

In FIG. 36, the pulse Vpls in accordance with an incidence of a photon with respect to the photoelectric conversion element 110 is input to the dual-mode counter 115. In addition, the time code Tc output from the TC generating unit 120 is input to the dual-mode counter 115.

The dual-mode counter 115 has a counting operation mode and a storage operation mode as operating modes. In addition, the storage operation mode includes a writing operation mode and a retaining operation mode. The dual-mode counter 115 switches among these operating modes in accordance with a signal WRen_CNT that is supplied from a threshold determining unit 113". When the signal WRen_CNT is indicating a counting operation, the dual-mode counter 115 switches the operating mode to the counting operation mode, counts the number of pulses Vpls that are supplied from the signal processing unit 111a, and outputs the photon information PhInfo that indicates a count result. In addition, when the signal WRen_CNT is indicating a storage operation, the dual-mode counter 115 switches the operating mode to the storage operation mode and stores the input time code Tc.

For example, the threshold determining unit 113a-3 outputs the signal WRen_CNT that indicates a counting operation at the start time point of the exposure period Tsh. In accordance with the signal WRen_CNT, the operating mode of the dual-mode counter 115 switches to the counting operation mode. In the counting operation mode, the dual-mode counter 115 counts the pulses Vpls that are supplied from the signal processing unit 111a and outputs a count result as the photon information PhInfo.

Based on the photon information PhInfo that is output from the dual-mode counter 115, when the threshold determining unit 113a-3 determines that, for example, the photon number incident to the photoelectric conversion element 110 within the exposure period Tsh reaches the threshold Nth, the threshold determining unit 113a-3 outputs a signal WRen_CNT that indicates a storage operation. The dual-mode counter 115 switches the operating mode to the storage operation mode in accordance with the signal WRen_CNT, aborts counting of the pulse Vpls, and stores the time code Tc.

Figure 37A:
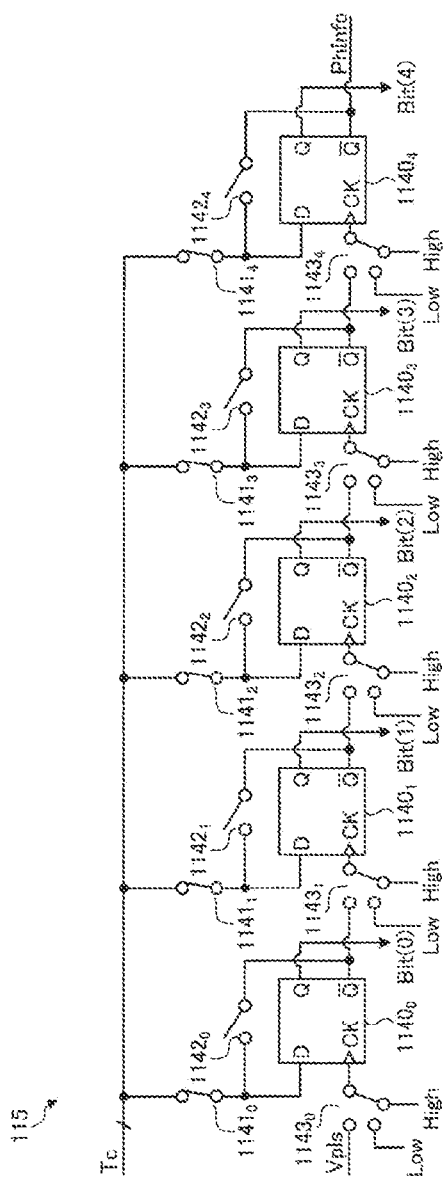
FIG. 37A is a diagram for explaining an operation of a dual-mode counter that is applicable to the third modification of the first embodiment.
Figure 37B:
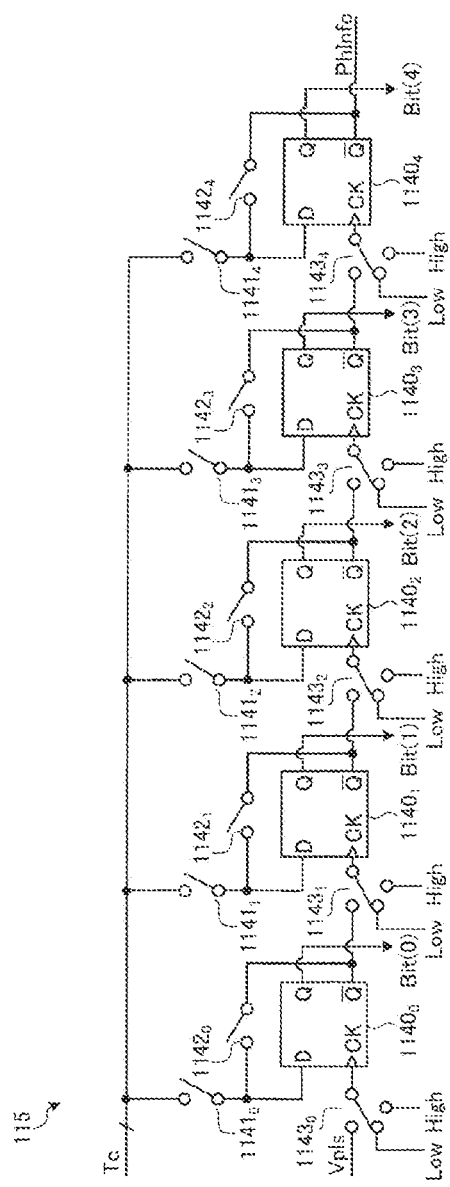
FIG. 37B is a diagram for explaining an operation of the dual-mode counter that is applicable to the third modification of the first embodiment.
Figure 37C:
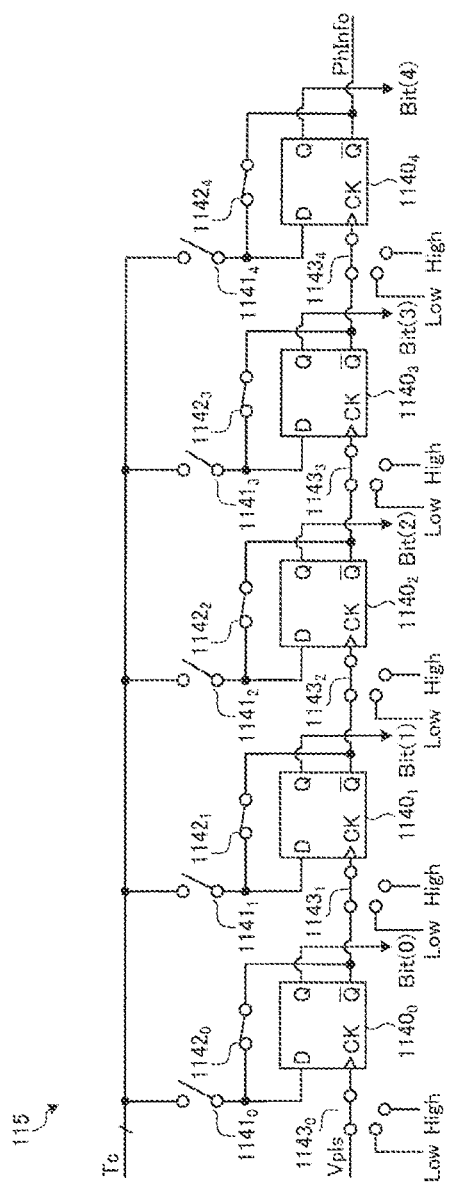
FIG. 37C is a diagram for explaining an operation of the dual-mode counter that is applicable to the third modification of the first embodiment.

FIGS. 37A to 37C are diagrams for explaining an operation of the dual-mode counter 115 that is applicable to the third modification of the first embodiment. FIG. 37A is a diagram showing a state of the dual-mode counter 115 during the counting operation mode. FIG. 37B is a diagram showing a state of the dual-mode counter 115 during the writing operation mode in the storage operation mode. FIG. 37C is a diagram showing a state of the dual-mode counter 115 during the retaining operation mode in the storage operation mode.

Hereinafter, the dual-mode counter 115 is assumed to be a 5-bit counter.

A configuration example of the dual-mode counter 115 will now be described using FIG. 37A. The dual-mode counter 115 that is applicable to the third modification of the first embodiment includes five D-FFs (D flip-flops) $1140_0$, $1140_1$, $1140_2$, $1140_3$, and $1140_4$ that correspond to the number of bits to be counted. With the respective D-FFs $1140_0$, $1140_1$, $1140_2$, $1140_3$, and $1140_4$, the respective bits of the time code Tc are input to a terminal D via respective switches $1141_0$, $1141_1$, $1141_2$, $1141_3$, and $1141_4$ that are each controlled in accordance with the signal WRen_CNT.

In addition, for example, in the D-FF $1140_0$, a terminal D and a terminal QB are connected via a switch $1142_0$ that is controlled in accordance with the signal WRen_CNT. It should be noted that the terminal QB indicates a terminal in the drawing of which "Q" has been overlined. With the other D-FFs $1140_1$, $1140_2$, $1140_3$, and $1140_4$, the terminal D and the terminal QB are similarly connected via respective switches $1142_1$, $1142_2$, $1142_3$, and $1142_4$ that are each controlled in accordance with the signal WRen_CNT.

Furthermore, for example, with respect to a terminal CK of the D-FF $1140_0$, a common selection terminal of the switch $1143_0$ that is controlled in accordance with the signal WRen_CNT is connected. The pulse Vpls is input to a first selection terminal of the switch $1143_0$, and a low-level potential and a high-level potential are respectively connected to second and third selection terminals of the switch $1143_0$. Connected to respective terminals CK of the other D-FFs $1140_1$, $1140_2$, $1140_3$, and $1140_4$ are common selection terminals of the switches $1143_1$, $1143_2$, $1143_3$, and $1143_4$ that are each controlled in accordance with the signal WRen_CNT, the switches $1143_1$, $1143_2$, $1143_3$, and $1143_4$ respectively having a first selection terminal to which the terminal QB of a preceding stage is connected and second and third selection terminals to which a low-level potential and a high-level potential are respectively connected.

In addition, with the respective D-FFs $1140_0$, $1140_1$, $1140_2$, $1140_3$, and $1140_4$, respective bits (bit (0), bit (1), bit (2), bit (3), and bit (4)) are output from respective output terminals Q. Furthermore, the photon information PhInfo is output from the output terminal QB of the last-stage D-FF $1140_4$.

Operation examples when the operating mode of the dual-mode counter 115 is the counting operation mode, the writing operation mode, and the retaining operation mode will be described. It should be noted that the respective D-FFs $1140_0$ to $1140_4$, the respective switches $1141_0$ to $1141_4$, the respective switches $1142_0$ to $1142_4$, and the respective switches $1143_0$ to $1143_4$ are controlled so as to assume a same state in each operating mode. Therefore, hereinafter, unless otherwise noted, a description will be given using the D-FF $1140_0$ and the switches $1141_0$, $1142_0$, and $1143_0$ that are connected to the D-FF $1140_0$ as an example.

When the operating mode of the dual-mode counter 115 is the counting operation mode, as shown in FIG. 37A, the switch $1141_0$ is controlled so as to assume an off (open) state, the switch $1142_0$ is controlled so as to assume an on (closed) state, and the switch $1143_0$ is controlled so as to connect the common selection terminal to the first selection terminal. Accordingly, with the D-FF $1140_0$, the output terminal QB and the terminal D are connected to each other, the pulse Vpls is input to the terminal CK, and an output that is inverted every time the input pulse Vpls falls is extracted from the output terminals Q and QB.

The output of the terminal QB of the D-FF $1140_0$ is input to the terminal CK of the D-FF $1140_1$ of a subsequent stage. In a similar manner to that described above, an output that is inverted every time the output of the terminal QB of the D-FF $1140_0$ falls is extracted from the output terminals Q and QB of the D-FF $1140_1$. A similar operation is performed on the D-FF $1140_2$ and thereafter of the subsequent stage. Due to such an operation, the dual-mode counter 115 operates as a counter that counts the pulse Vpls in the counting operation mode.

When an operation of the dual-mode counter 115 is the writing operation mode, as shown in FIG. 37B, the switch $1141_0$ is controlled so as to assume an on state, the switch $1142_0$ is controlled so as to assume an off state, and the switch $1143_0$ is controlled so as to connect the common selection terminal to the third selection terminal. Accordingly, a predetermined bit of the time code Tc is input to the terminal D of the D-FF $1140_0$ via the switch $1141_0$ and, at the same time, the terminal CK is placed in a high state and a value of the predetermined bit of the time code Tc is written into the terminal D of the D-FF $1140_0$.

Subsequently the operation of the dual-mode counter 115 makes a transition to the retaining operation mode, the respective switches $1141_0$ and $1142_0$ are controlled so as to assume an off state as shown in FIG. 37C, and the switch $1143_0$ is controlled so as to connect the common selection terminal to the second selection terminal. Accordingly, the terminal CK is placed in a low state and the value written into the terminal D in the D-FF $1140_0$ is retained. In addition, in the retaining operation mode, the values having been written into and retained by the terminal D of the respective D-FFs $1140_0$ to $1140_4$ can be extracted from the output terminal Q of the respective D-FFs $1140_0$ to $1140_4$.

1-9. Data Processing Applicable to First Embodiment and Respective Modifications Thereof Next, data processing with respect to the predicted count value Npre that is applicable to the first embodiment and the respective modifications thereof will be described. First, compression processing with respect to the predicted count value Npre will be described as a first example of data processing with respect to the predicted count value Npre. As described earlier with respect to FIG. 2B, in the first embodiment and the respective modifications thereof, the predicted count value Npre is calculated based on the time code Tc that corresponds to the time Tth at which a count value of the photon number reaches the threshold Nth.

Now, let us assume that the predicted count value Npre having been predicted based on the time Tth at which the count value had reached the threshold Nth is a 15-bit value and that the threshold Nth is a 9-bit value. In this case, significant figures of the predicted count value Npre are a 9-bit value. In other words, among the 15 bits of the predicted count value Npre, 6 bits' worth are non-significant figures. In addition, in this case, the LSB-side bits of the predicted count value Npre are low in significance. Therefore, by ignoring predetermined LSB-side bits of the 15-bit value of the predicted count value Npre, the number of bits of the predicted count value Npre can be reduced.

As an example, the 15-bit predicted count value Npre is conceivably expressed by 8-bit significant figures and a 3-bit shift amount. As specific numerical values, when it is assumed that the exposure period Tsh is 1000 and the time Tth at which the count value had attained the threshold Nth is 25, referring to equation (1) described earlier, the predicted count value Npre can be obtained as equation (4) below.

$$Npre = Nth \times (Tsh/Tth) = 512 \times (1000/25) = 20480 \quad (4)$$

The value "20480" in decimal notation is a 15-bit value "0b101000000000000" in binary notation. Applying a 3-bit shift amount "0b111" to the 15-bit value results in equation (5) below.

$$0b101000000000000 = 0b10100000 \times 2^{\wedge}(0b111) \quad (5)$$

Therefore, using the 8-bit value "0b10100000" and the 3-bit shift amount "0b111", the 15-bit predicted count value Npre can be expressed as, for example, an 11-bit value "0b11110100000". In this case, the three top bits indicate the shift amount. In this manner, the number of bits of the predicted count value Npre can be reduced from 15 bits to 11 bits.

In the light-receiving apparatus $1a$, for example, when calculating the predicted count value Npre based on the time code Tc having been read from the memory 114 of each pixel circuit $100a$, the signal processing unit $2013c$ (refer to FIG. 7) applies equation (5) described above and reduces the number of bits of the calculated predicted count value Npre. Accordingly, for example, processing and a memory capacity in the signal processing unit $2013c$ and traffic when outputting the calculated predicted count value Npre to the outside can be reduced.

Next, processing for converting the predicted count value Npre into a value (referred to as a correlated predicted count value Npre_related) that is correlated with the predicted count value Npre will be described as a second example of data processing with respect to the predicted count value Npre. Equation (6) below represents an example of calculating the correlated predicted count value Npre_related by adding an offset value Noffset to the predicted count value Npre.

$$Npre\_related = Npre + Noffset \quad (6)$$

As shown in equation (7) below, the correlated predicted count value Npre_related can also be calculated based on a predicted count value Npre_reduce described using equation (4) and equation (5) and of which the number of bits has been reduced.

$$Npre\_related = Npre\_reduce + Noffset \quad (7)$$

In the light-receiving apparatus $1a$, for example, when calculating the predicted count value Npre based on the time code Tc having been read from the memory 114 of each pixel circuit $100a$, the signal processing unit $2013c$ applies equation (6) described above and calculates the correlated predicted count value Npre_related that corresponds to the predicted count value Npre to be calculated. Accordingly, for example, processing in the signal processing unit $2013c$ and a load of external processing with respect to the predicted count value Npre can be reduced.

While conversion processing with respect to the predicted count value Npre has been described as though being processing for adding an offset value, conversion processing is not limited thereto. In other words, for example, in the signal processing unit $2013c$, various kinds of conversion processing can be applied with respect to the predicted count value Npre depending an use application or the like. The conversion processing can include processing for converting a data format such as a Gray code.

2. Second Embodiment

2-1. Outline of Configuration Applicable to Second Embodiment

Figure 38:
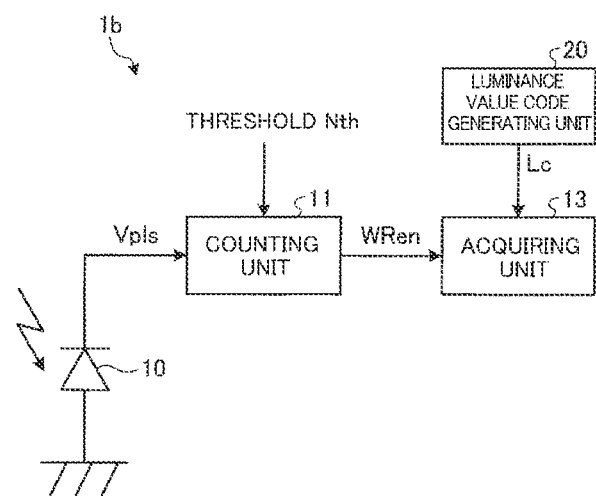
FIG. 38 is a diagram showing a schematic configuration example of a light-receiving apparatus according to a second embodiment.

Next, a second embodiment of the present disclosure will be described. The second embodiment represents an example in which a photon number incident to the photoelectric conversion element 110 is converted into a luminance value. FIG. 38 is a diagram showing a schematic configuration example of a light-receiving apparatus according to the second embodiment. In FIG. 38, a light-receiving apparatus $1b$ according to the second embodiment includes a pixel 10, a counting unit 11, a luminance value code generating unit 20, and an acquiring unit 13. In a similar manner to the description of FIG. 1, the pixel 10 includes a photoelectric conversion element that converts light into an electric charge by photoelectric conversion and a signal processing circuit that reads the electric charge from the photoelectric conversion element and outputs the electric charge as an electric signal. A SPAD can be applied as the photoelectric conversion element included in the pixel 10 in a similar manner to the first embodiment described above. The light-receiving apparatus 1b predicts a luminance value in accordance with the number of photons incident to the pixel 10 within a designated exposure period Tsh and acquires, using the acquiring unit 13, a luminance value code Lc which is generated by the luminance value code generating unit 20 and which corresponds to the predicted luminance value.

The counting unit 11 counts the pulse Vpls output from the pixel 10 within a designated exposure period Tsh, and when the number Ncnt of the counted pulses Vpls exceeds the threshold Nth before the exposure period Tsh ends, the counting unit 11 outputs the write signal WRen(W). The write signal WRen is supplied to the acquiring unit 13.

On the other hand, the luminance value code generating unit 20 predicts a luminance value at the end time point of the exposure period Tsh in accordance with an elapsed time from the start time point of the exposure period Tsh to a time point at which writing is instructed by the write signal WRen(W) and generates a luminance value code Lc that indicates the predicted luminance value. The luminance value code Lc generated by the luminance value code generating unit 20 is supplied to the acquiring unit 13.

For example, the acquiring unit 13 includes a memory, acquires the luminance value code Lc having been supplied from the luminance value code generating unit 20 at timing where writing is instructed by the write signal WRen(W) or, in other words, a timing at which the write signal WRen makes a transition from a low state to a high state, and writes the acquired luminance value code Lc into the memory.

The configuration described using FIG. 5 in which the light-receiving chip 2000 and the logic chip 2010 that are respectively made of semiconductor chips are stacked can be applied to the light-receiving apparatus 1b according to the second embodiment in a similar manner to the light-receiving apparatus 1a according to the first embodiment described earlier.

2-2. Explanation of Principle of Second Embodiment

A principle of a conversion of a photon number into a luminance value according to the second embodiment will now be described. Luminance (a luminance value) with respect to a given pixel (the photoelectric conversion element 110) and an average photon each interval Ta that represents an average incidence interval of photons incident to the pixel are inversely proportional to each other.

For example, let us assume that, using a predetermined coefficient k, the photon number Pn incident to the photoelectric conversion element 110 and a luminance value Lx have a relationship expressed as Lx=Pn×k. In addition, when a given time T (for example, the exposure period Tsh) is considered, the photon number Pn that is incident at the average photon reach interval Ta within the time T is expressed as Pn=T/Ta. Therefore, the average photon reach interval Ta and the luminance value Lx are inversely proportional to each other as indicated by equation (8) below.

$$Lx=(T\times k)/Ta \tag{8}$$

Using the average photon reach interval Ta, an expected time $Tth_{ev}$ that is expected for the incident photon number Pn to attain the threshold Nth (refer to FIG. 2B) is expressed by equation (9) below.

$$Tth_{ev}=Nth\times Ta \tag{9}$$

Equations (8) and (9) reveal that the expected time $Tth_{ev}$ that is expected for the photon number Pn incident to the photoelectric conversion element 110 to attain the threshold Nth and the luminance value Lx that is expected upon attaining the threshold Nth are inversely proportional to each other as indicated by equation (10) below.

$$Tth_{ev}=(Nth\times(T\times k))/Lx \tag{10}$$

As described above, the luminance value Lx in equation (10) is a value that is expected upon the photon number Pn incident to the photoelectric conversion element 110 attaining the threshold Nth and is a predicted luminance value Lpre that is predicted for the threshold Nth.

Figure 39:
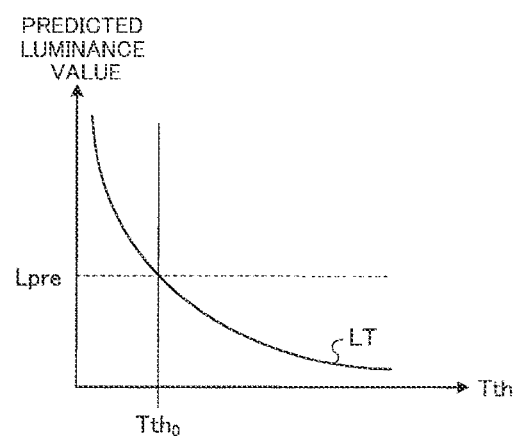
FIG. 39 is a diagram showing an example relationship between a time Tth at which a photon number Pn attains a threshold Nth and a predicted luminance value Lpre according to the second embodiment.

FIG. 39 is a diagram showing an example relationship between the time Tth at which the photon number Pn attains the threshold Nth and the predicted luminance value Lpre according to the second embodiment. In FIG. 39, the luminance value Lx in equation (10) described above is indicated as the predicted luminance value Lpre. In this case, as the expected time $Tth_{ev}$, the time Tth at which the photon number Pn incident to the photoelectric conversion element 110 attains the threshold Nth can be used. In FIG. 39, by referring to a curved line LT in accordance with equation (10) based on a time $Tth_0$, the predicted luminance value Lpre in the exposure period Tsh can be obtained.

In equation (10) described above, the threshold Nth, the time T (the exposure period Tsh), and the coefficient k are constants given in advance. For example, the luminance value code generating unit 20 can store, in advance, the curved line LT as a table in which the predicted luminance value Lpre and the time Tth are associated with each other. In this case, the table stores the predicted luminance value Lpre as the luminance value code Lc that is a discrete value in association with the corresponding time Tth.

The luminance value code generating unit 20 is not limited to the above and may calculate the predicted luminance value Lpre based on the measured time Tth and using the threshold Nth, the time T (the exposure period Tsh), and the coefficient k. Even in this case, the calculated predicted luminance value Lpre is processed into a discrete value and adopted as the luminance value code Lc.

Figure 40:
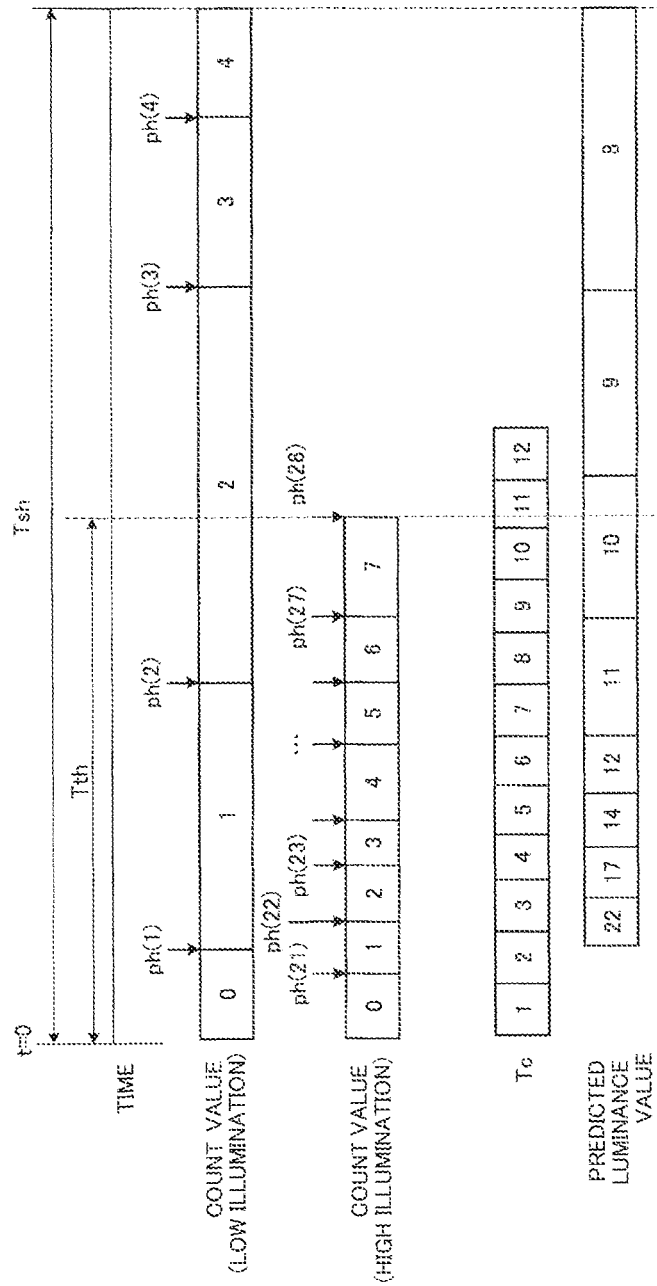
FIG. 40 is a diagram for schematically explaining generation of the predicted luminance value Lpre by a luminance value code generating unit according to the second embodiment.

FIG. 40 is a diagram for schematically explaining generation of the predicted luminance value Lpre by the luminance value code generating unit 20 according to the second embodiment. In FIG. 40, the passage of time, an example of a count value in the case of low illumination, an example of a count value in the case of high illumination, an example of the time code Tc at regular intervals, and an example of the predicted luminance value Lpre are respectively shown from top to bottom. Among these values, since the passage of time, the example of a count value in the case of low illumination, the example of a count value in the case of high illumination, and the example of the time code Tc at regular intervals are similar to corresponding portions in FIG. 3 described earlier, a description thereof will be omitted here. In addition, in FIG. 40, with respect to the example of a count value in the case of high illumination and the example of the time code Tc at regular intervals, a longer time scale as compared to FIG. 3 has been applied for the sake of description.

At the bottom of FIG. 40, a situation in which the predicted luminance value Lpre is reduced in inverse proportion to the time Tth as time elapses is shown. More specifically, in the example shown in FIG. 40, a value of the predicted luminance value Lpre rapidly decreases in short intervals such as "22", "17", "14", . . . on a side near a start time point to of the exposure period Tsh. On the other hand, near the end time point of the exposure period Tsh, a change in the predicted luminance value Lpre with respect to time becomes smaller and the interval of the change also increases.

In FIG. 40, in the case of high illumination, Ph(21), Ph(22), ..., Ph(27) are counted within the exposure period Tsh and the counter overflows upon a time point of a next detection of an eighth photon Ph(28). Therefore, the timing of detection of the eighth photon Ph(28) is the time Tth at which the count value exceeds the threshold Nth. In the example shown in FIG. 40, the time code Tc corresponding to the time Tth has a value of "11". By comparison, the predicted luminance value Lpre has a value of "10".

It should be noted that, according to equation (10) described earlier, the predicted luminance value Lpre increases rapidly as the time Tth approaches 0 and becomes positive infinity when the time Tth is 0. Therefore, during a period in which the time Tth is extremely short, the predicted luminance value Lpre assumes an extremely large value and the predicted luminance value Lpre within the period assumes a realistically meaningless value. This means that the predicted luminance value Lpre during this period is unnecessary. Therefore, for example, in a table in which the predicted luminance value Lpre and the time Tth are associated with each other, only time after a time point at which a predetermined period of time has elapsed from the start time point of the exposure period Tsh can be considered as the time Tth and the predicted luminance values Lpre prior to the time point can be excluded from being defined in the table.

In the example shown in FIG. 40, for example, the luminance value code generating unit 20 ignores values at time points before the predicted luminance value Lpre="22" or, in other words, values that exceed the predicted luminance value Lpre="22" among the predicted luminance values shown in the bottom section. For example, the luminance value code generating unit 20 does not define, in the table, the time Tth and the predicted luminance value Lpre prior to the time Tth that corresponds to the predicted luminance value Lpre="22".

In this manner, in the second embodiment, the predicted luminance value Lpre that is predicted in the exposure period Tsh can be directly obtained based on the time Tth at which the photon number Pn incident to the photoelectric conversion element 110 had attained the threshold Nth. Accordingly the light-receiving apparatus 1b according to the second embodiment is capable of reducing a load of processing for converting the time code Tc into a luminance value as compared to the light-receiving apparatus 1a according to the first embodiment.

For example, in the light-receiving apparatus 1a according to the first embodiment, the signal processing unit 2013c (refer to FIG. 7) executes processing for respectively converting time codes Tc read from each logic circuit 2014 included in the logic array unit 2011 (refer to FIG. 7) into luminance values. In other words, in the light-receiving apparatus 1a according to the first embodiment, for example, the signal processing unit 2013c must at least complete processing for respectively converting the time codes Tc read from logic circuits 2014 which corresponds to one row and which are included in the logic array unit 2011 into luminance values within one horizontal synchronization period.

By contrast, the light-receiving apparatus 1b according to the second embodiment executes processing for converting the time Tth at which the incident photon number attains the threshold Nth into a luminance value in each of the logic circuits 2014 included in the logic array unit 2011. Since the conversion processing of time information into a luminance value is executed by being distributed across the respective logic circuits 2014, a small amount of processing can suffice for each piece of conversion processing and, at the same time, the processing by the signal processing unit 2013c can be reduced.

Figure 41:
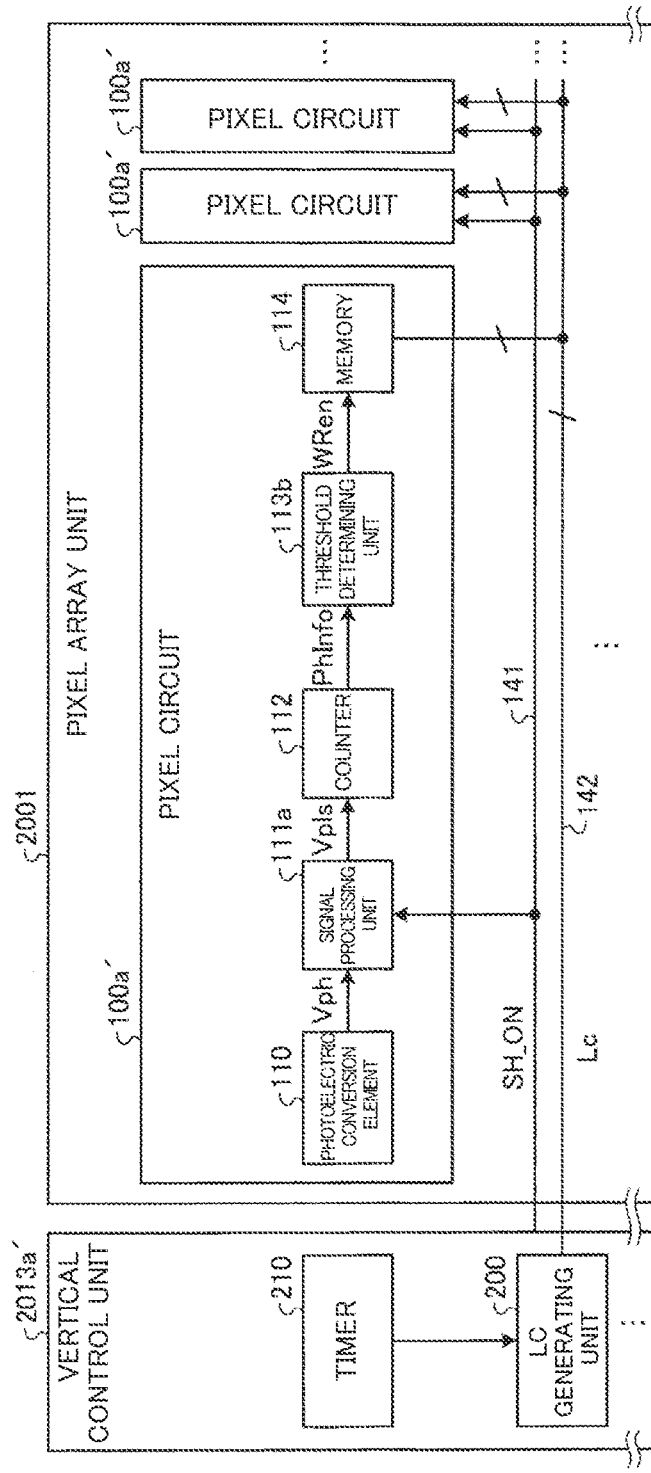
FIG. 41 is a block diagram showing an example configuration of a pixel array unit and a vertical control unit according to the second embodiment.

FIG. 41 is a block diagram showing an example configuration of the pixel array unit 2001 and the vertical control unit 2013a according to the second embodiment. In addition, FIG. 41 shows a more specific configuration of a pixel circuit with respect to the pixel array unit 2001. It should be noted that, in FIG. 41, portions shared by FIG. 8 described above will be denoted by same reference signs and detailed descriptions thereof will be omitted.

As exemplified in FIG. 41, the pixel array unit 2001 has a configuration that corresponds to that of the pixel array unit 2001 described using FIG. 8 and includes a plurality of pixel circuits 100a' that respectively correspond to the pixel circuits 100a shown in FIG. 8. It should be noted that FIG. 41 extracts and shows the respective pixel circuits 100a' included in one row among the respective pixel circuits 100a' that are arranged in a two-dimensional grid pattern in the pixel array unit 2001.

In FIG. 41, the pixel circuit 100a' includes the photoelectric conversion element 110, a signal processing unit 111a, a counter 112, a threshold determining unit 113b, and a memory 114. Among these units, since the photoelectric conversion element 110, the signal processing unit 111a, the counter 112, and the threshold determining unit 113b have similar functions to the photoelectric conversion element 110, the signal processing unit 111a, the counter 112, and the threshold determining unit 113a shown in FIG. 8, a description thereof will be omitted here. For example, a SPAD can be applied as the photoelectric conversion element 110 shown in FIG. 41 in a similar manner to the first embodiment described above. The memory 114 stores the luminance value code Lc as the predicted luminance value Lpre that is supplied from an LC generating unit 200 (to be described later) in accordance with a write signal WRen(W) that is supplied from the threshold determining unit 113b.

On the other hand, in FIG. 41, the vertical control unit 2013a' corresponds to the vertical control unit 2013a shown in FIG. 8 and includes an LC (luminance value code) generating unit 200 for each row. In addition, a timer 210 is included so as to be shared by the respective rows. The LC generating unit 200 corresponds to the luminance value code generating unit 20 described earlier. For example, based on time information supplied from the timer 210, the LC generating unit 200 generates the luminance value code Lc which has been described using FIGS. 39 and 40 and which changes in an inversely proportional relationship with respect to elapsed time from the start time point of the exposure period Tsh.

The timer 210 generates time information indicating a timing of a change for each change of the predicted luminance value Lpre having been described using FIG. 40 based on, for example, a clock signal.

Figure 42:
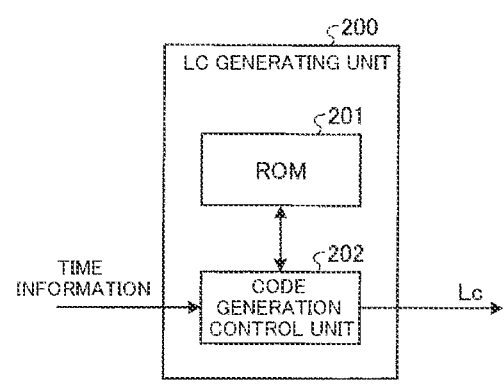
FIG. 42 is a block diagram showing an example configuration of an LC generating unit that is applicable to the second embodiment.

FIG. 42 is a block diagram showing an example configuration of the LC generating unit 200 that is applicable to the second embodiment. In this case, it is assumed that the luminance value code Lc is to be stored as a table associated with the time Tth. The LC generating unit 200 includes a ROM (Read Only Memory) 201 and a code generation control unit 202. The ROM 201 stores, in advance, a table in which the luminance value code Lc and the time Tth are associated with each other.

The code generation control unit 202 reads, from the ROM 201, the luminance value code Lc that corresponds to the time information supplied from the outside such as the timer 210. In the example shown in FIG. 41, the luminance value code Lc read from the ROM 201 by the code generation control unit 202 is input to the respective pixel circuits 100a' included in the pixel array unit 2001 and supplied to each memory 114.

It should be noted that the control unit 1003 (refer to FIG. 7) indicates a start timing of the exposure period Tsh to the LC generating unit 200 and supplies the LC generating unit 200 with information indicating a length of the exposure period Tsh.

In addition, the LC generating unit 200 generates a signal SH_ON that indicates a timing at which the signal processing unit 111a outputs the pulse Vpls. For example, the LC generating unit 200 generates the signal SH_ON based on a predetermined clock signal. In the example shown in FIG. 41, the signal SH_ON generated by the LC generating unit 200 is input to the respective pixel circuits 100a' and supplied to the signal processing unit 111a.

It should be noted that the respective counters 112a to 112i and the digital counter 112j having been described using FIGS. 16A and 16B, 17, 18, 19A and 19B, and 20 to 26 can also be applied to the pixel circuit 100a' according to the second embodiment in a similar manner to the pixel circuit 100a described earlier.

2-3. Arrangement of LC Generating Unit and Pixel Circuit Applicable to Second Embodiment Next, an example of an arrangement of the LC generating unit 200 and the pixel circuit 100a' according to the first embodiment will be described. Hereinafter, for convenience's sake, the pixel circuit 100a' will be described as the pixel circuit 100'. In addition, in FIGS. 43 to 48 described below, a description of the timer 210 and the signal SH_ON that is output from the LC generating unit 200 are omitted.

2-3-1. First Arrangement Example According to Second Embodiment

Figure 43:
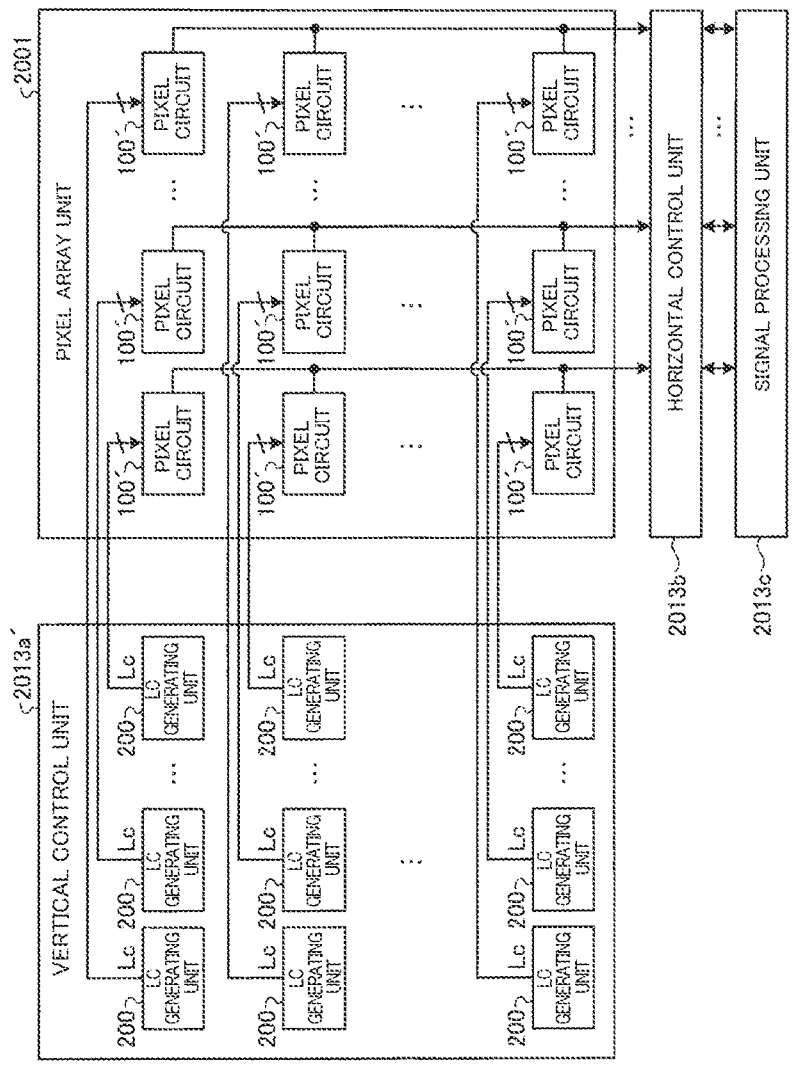
FIG. 43 is a diagram showing an arrangement example of an LC generating unit and a pixel circuit according to a first arrangement example according to the second embodiment.

First, a first arrangement example according to the second embodiment of the LC generating unit 200 and the pixel circuit 100' according to the second embodiment will be described. FIG. 43 is a diagram showing an arrangement example of the LC generating unit 200 and the pixel circuit 100' according to the first arrangement example according to the second embodiment.

The first arrangement example according to the second embodiment corresponds to the first arrangement example according to the first embodiment described using FIG. 27 and, as shown in FIG. 43, the LC generating unit 200 is provided for each pixel circuit 100'. In other words, the vertical control unit 2013a' includes the LC generating unit 200 provided in a quantity that corresponds to the number of pixel circuits 100' that are included in the pixel array unit 2001. Each LC generating unit 200 respectively supplies the signal SH_ON and the luminance value code Lc to a corresponding pixel circuit 100'.

With the first arrangement example according to the second embodiment, an issuing speed (time interval) of the luminance value code Lc can be controlled for each pixel circuit 100'. Therefore, a variation in each pixel circuit 100' can be suppressed. For example, an arrangement according to the first arrangement example according to the second embodiment can conceivably be applied to a line sensor in which the respective pixel circuits 100' are arranged on a line to homogenize characteristics of the respective pixel circuits 100'.

2-3-2. Second Arrangement Example According to Second Embodiment

Figure 44:
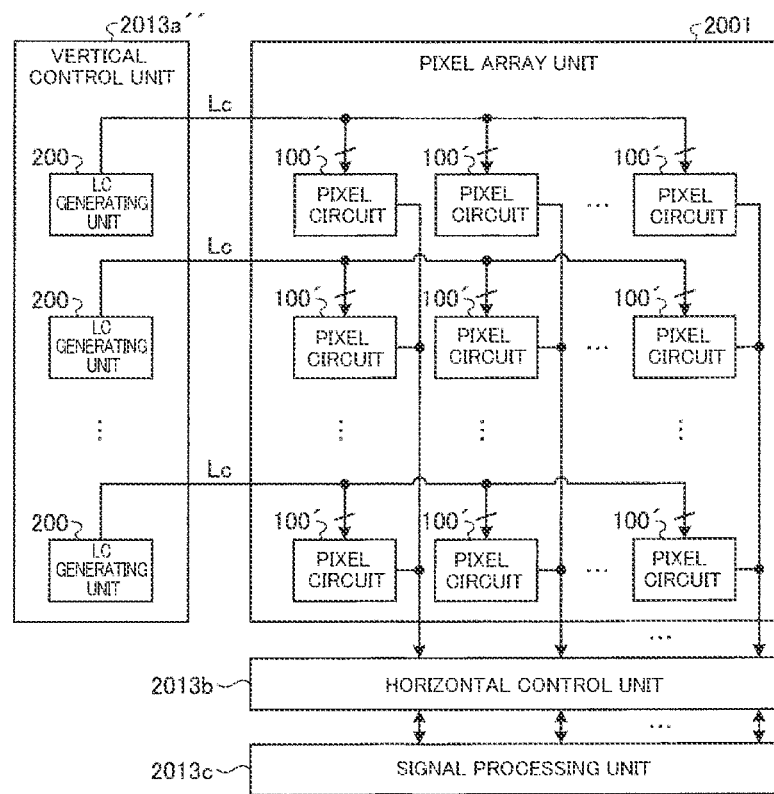
FIG. 44 is a diagram showing an arrangement example of an LC generating unit and a pixel circuit according to a second arrangement example according to the second embodiment.

Next, a second arrangement example according to the second embodiment of the LC generating unit 200 and the pixel circuit 100' according to the second embodiment will be described. FIG. 44 is a diagram showing an arrangement example of the LC generating unit 200 and the pixel circuit 100' according to the second arrangement example according to the second embodiment. The second arrangement example according to the second embodiment corresponds to the second arrangement example according to the first embodiment described using FIG. 28 and, as shown in FIG. 44, the LC generating unit 200 is provided for each row of the respective pixel circuits 100' that are arranged in a two-dimensional grid pattern in the pixel array unit 2001 with respect to the vertical control unit 2013a". In other words, the second arrangement according to the second embodiment has a configuration that corresponds to FIG. 41 described earlier. The LC generating unit 200 commonly supplies the luminance value code Lc and the signal SH_ON with respect to each pixel circuit 100' that is arranged in a corresponding row of the two-dimensional grid.

The configuration according to the second arrangement example according to the second embodiment is compatible with an existing sensor. In addition, wirings can be reduced in comparison to the configuration according to the first arrangement example according to the second embodiment described above.

2-3-3. Third Arrangement Example According to Second Embodiment

Figure 45:
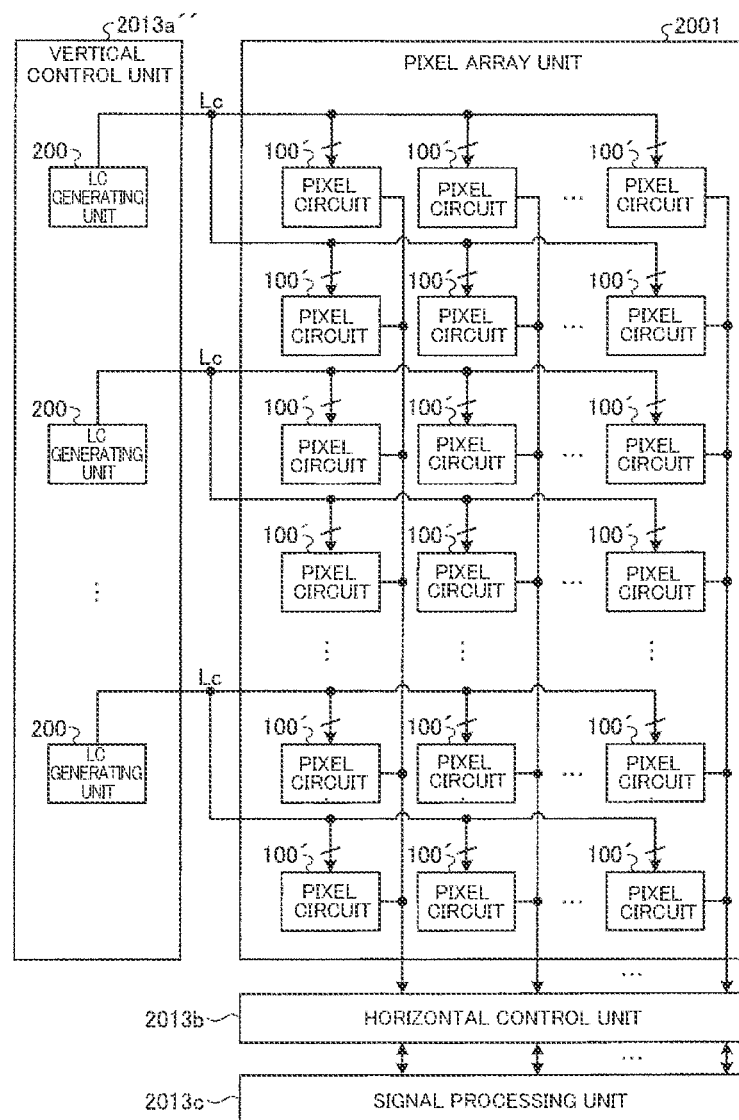
FIG. 45 is a diagram showing an arrangement example of an LC generating unit and a pixel circuit according to a third arrangement example according to the second embodiment.

Next, a third arrangement example according to the second embodiment of the LC generating unit 200 and the pixel circuit 100' according to the second embodiment will be described. FIG. 45 is a diagram showing an arrangement example of the LC generating unit 200 and the pixel circuit 100' according to the third arrangement example according to the second embodiment. The third arrangement example according to the second embodiment corresponds to the third arrangement example according to the first embodiment described using FIG. 29 and, as shown in FIG. 45, the LC generating unit 200 is provided for every two rows of the respective pixel circuits 100' that are arranged in a two-dimensional grid pattern in the pixel array unit 2001. The LC generating unit 200 commonly supplies the luminance value code Lc and the signal SH_ON with respect to each pixel circuit 100' that is arranged in two corresponding rows of the two-dimensional grid.

The configuration according to the third arrangement example according to the second embodiment enables wirings to be reduced in comparison to the configuration according to the second arrangement example according to the second embodiment described above.

2-3-4. Fourth Arrangement Example According to Second Embodiment

Figure 46:
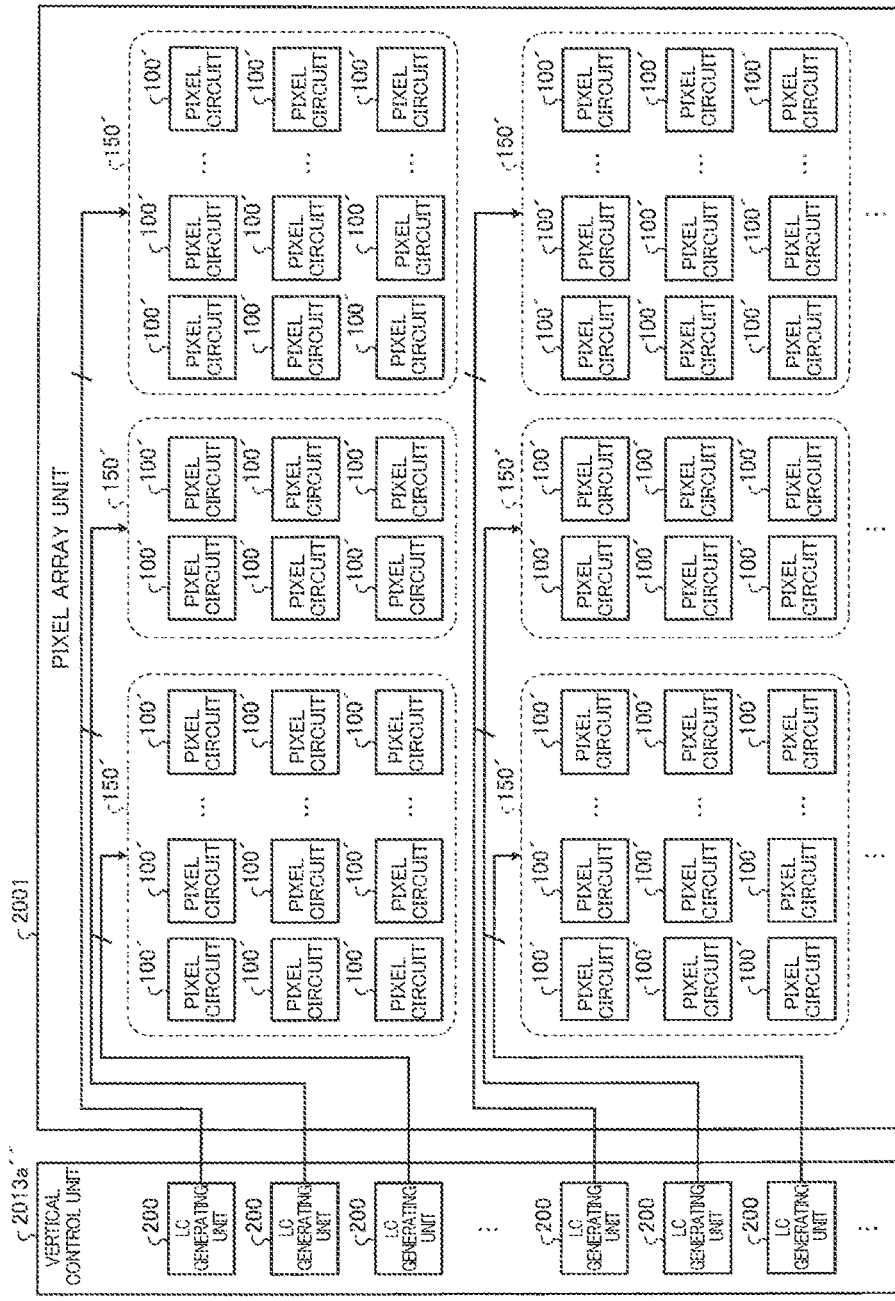
FIG. 46 is a diagram showing an arrangement example of an LC generating unit and a pixel circuit according to a fourth arrangement example according to the second embodiment.

Next, a fourth arrangement example according to the second embodiment of the LC generating unit 200 and the pixel circuit 100' according to the second embodiment will be described. FIG. 46 is a diagram showing an arrangement example of the LC generating unit 200 and the pixel circuit 100' according to the fourth arrangement example according to the second embodiment.

The fourth arrangement example according to the second embodiment corresponds to the fourth arrangement example according to the first embodiment described using FIG. 31 and, as shown in FIG. 46, the LC generating unit 200 is provided for each region in the pixel array unit 2001. Each pixel circuit 100' included in each region is commonly supplied the luminance value code Lc and the signal SH_ON (not illustrated) from the LC generating unit 200 that corresponds to each region. In other words, in the fourth arrangement example according to the second embodiment, the luminance value code Lc and the signal SH_ON are supplied from one LC generating unit 200 with respect to the group 150' constituted by the respective pixel circuits 100' that are included in a region provided in the pixel array unit 2001.

According to the fourth arrangement example according to the second embodiment, for example, a bias condition of each pixel circuit 100' can be controlled for each region.

2-3-5. Fifth Arrangement Example According to Second Embodiment

Next, a fifth arrangement example according to the second embodiment of the LC generating unit 200 and the pixel circuit 100' according to the second embodiment will be described. The fifth arrangement example according to the second embodiment corresponds to the fifth arrangement example according to the first embodiment described using FIG. 32 and is an example of a case where the photoelectric conversion element 110 included in each pixel circuit 100' is provided with a color filter. In the fifth arrangement example according to the second embodiment, in each row of the pixel array unit 2001, pixel circuits 100' that include the photoelectric conversion element 110 provided with a color filter of a same color are organized as a group and the LC generating unit 200 is provided for each group.

Figure 47:
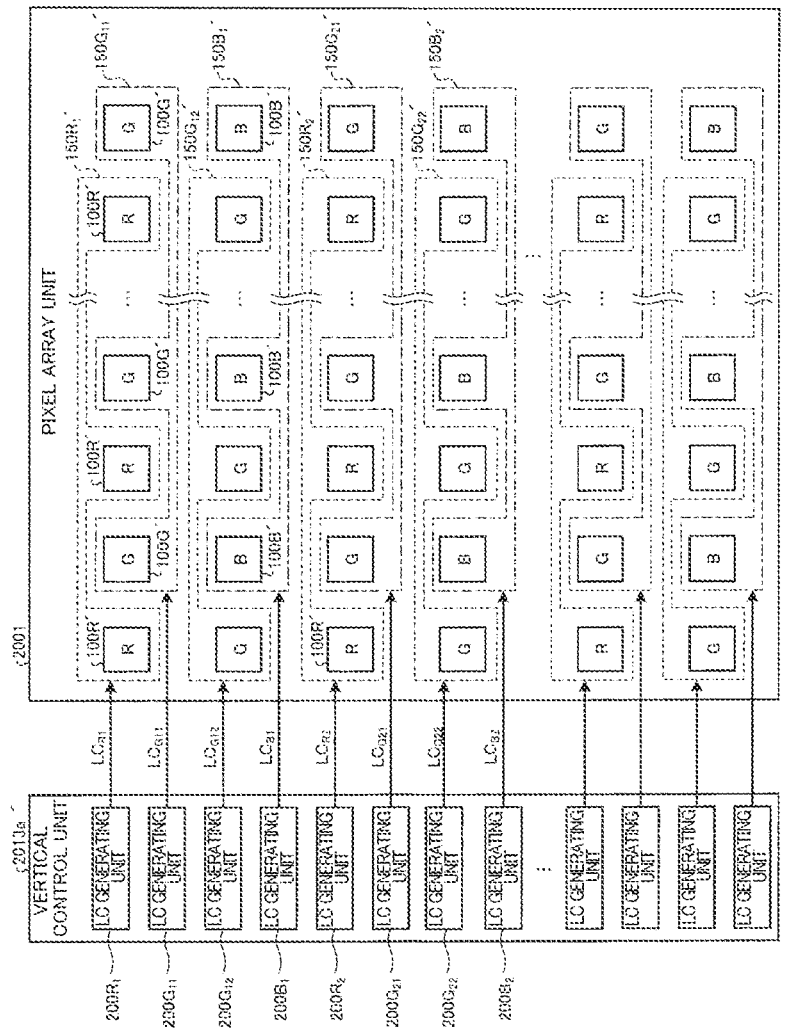
FIG. 47 is a diagram showing an arrangement example of an LC generating unit and a pixel circuit including photoelectric conversion elements respectively provided with R, G, and B color filters according to a fifth arrangement example according to the second embodiment.

FIG. 47 is a diagram showing an arrangement example of an LC generating unit 200 and pixel circuits 100R', 100G', and 100B' including photoelectric conversion elements 110 respectively provided with R (red), G (green), and B (blue) color filters according to the fifth arrangement example according to the second embodiment.

In FIG. 47, for example, with respect to a group $150R_1'$ that includes the respective pixel circuits 100R' arranged in the first row, a luminance value code $Lc_{R1}$ and a signal $SH\_ON_{R1}$ (not illustrated) are supplied from an LC generating unit $200R_1$. In addition, with respect to a group $150G_{11}'$ that includes the respective pixel circuits 100G' arranged in the first row, a luminance value code $Lc_{G11}$ and a signal $SH\_ON_{G11}$ (not illustrated) are supplied from an LC generating unit $200G_{11}$.

With respect to a group $150G_{12}'$ that includes the respective pixel circuits 100G' arranged in the second row, a luminance value code $Lc_{G12}$ and a signal $SH\_ON_{G12}$ (not illustrated) are supplied from an LC generating unit $200G_{12}$. In addition, with respect to a group $150B_1'$ that includes the respective pixel circuits 100B' arranged in the second row, a luminance value code $Lc_{B1}$ and a signal $SH\_ON_{B1}$ (not illustrated) are supplied from an LC generating unit $200B_1$.

In a similar manner, according to the Bayer array, for example, in the third and fourth row, with respect to a group $150R_2'$ that includes the respective pixel circuits 100R' arranged in the third row, a luminance value code $Lc_{R2}$ and a signal $SH\_ON_{R2}$ (not illustrated) are supplied from an LC generating unit $200R_2$. In addition, with respect to a group $150G_{21}'$ that includes the respective pixel circuits 100G' arranged in the third row, a luminance value code $Lc_{G21}$ and a signal $SH\_ON_{G21}$ (not illustrated) are supplied from an LC generating unit $200G_{21}$.

With respect to a group $150G_{22}'$ that includes the respective pixel circuits 100G' arranged in the fourth row, a luminance value code $Lc_{G22}$ and a signal $SH\_ON_{G22}$ (not illustrated) are supplied from an LC generating unit $200G_{22}$. In addition, with respect to a group $150B_2'$ that includes the respective pixel circuits 100B' arranged in the fourth row, a luminance value code $Lc_{B2}$ and a signal $SH\_ON_{B2}$ (not illustrated) are supplied from an LC generating unit $200B_2$.

Thereafter, in a similar manner according to the Bayer array, in the fifth row, the sixth row, the seventh row, the eighth row, and so on, pixel circuits provided with a color filter of the same color are organized into a same group, and the luminance value code Lc and the signal SH_ON are supplied from a common TC generating unit.

The respective photoelectric conversion elements 110 provided with color filters of R color, G color, and B color have different sensitivities with respect to an incident photon. According to the fifth arrangement, with respect to the respective pixel circuits 100R', 100G', and 100B', the LC generating unit 200 is provided in an organized manner for each color of the color filters. Therefore, a different sensitivity in accordance with the color of the color filter of the photoelectric conversion element 110 can be corrected by control of the predicted luminance value Lpre (for example, an adjustment of a table value stored in the ROM 201) based on the time Tth of attainment of the threshold Nth.

It should be noted that arrangements of the respective pixel circuits 100R', 100G', and 100B' and the respective pixel circuits 100R', $100G_1'$, $100G_2'$, and 100B' in the fifth and sixth arrangement examples of the second embodiment are not limited to a Bayer type in a similar manner to the sixth and seventh arrangement examples of the first embodiment described earlier. In addition, the color filters to be provided in the pixel circuits 100' are not limited to primary color system filters of the three colors of R, G, and B and may be complementary color system filters of the four colors of C (cyan), M (magenta), Y (yellow), and G.

Furthermore, in addition to the R, G, and color filters or complementary color system filters of C, M, Y, and G, the respective pixel circuits 100 may be further provided with optical filters of other types such as an IR filter and a transparent filter. Moreover, the Quad Bayer type RGB array described earlier may be adopted as the array of the respective pixel circuits 100', each of which being provided with R, G, and B color filters.

2-3-6. Sixth Arrangement Example According to Second Embodiment

Next, a sixth arrangement example according to the second embodiment of the LC generating unit 200 and the pixel circuit 100' according to the second embodiment will be described. The sixth arrangement example according to the second embodiment corresponds to the sixth arrangement example according to the first embodiment having been described using FIG. 33 and is an example of a case where the photoelectric conversion element 110 included in each pixel circuit 100' is provided with a color filter and, at the same time, one LC generating unit 200 is commonly provided for all pixel circuits 100' included in the pixel array unit 2001.

Figure 48:
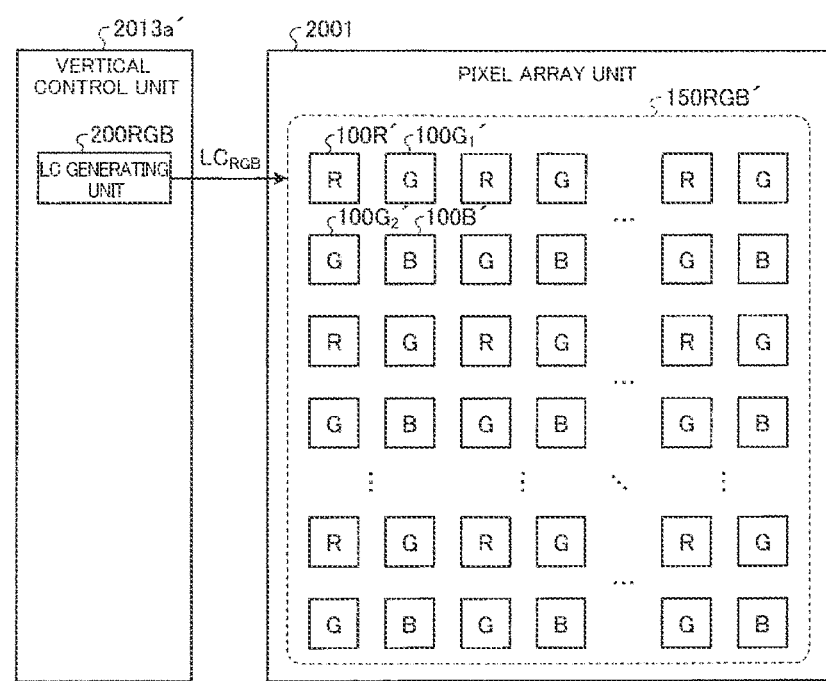
FIG. 48 is a diagram showing an arrangement example of an LC generating unit and a pixel circuit according to a sixth arrangement example according to the second embodiment.

FIG. 48 is a diagram showing an arrangement example of the LC generating unit 200 and pixel circuits 100R', 100G$_1$', 100G$_2$', and 100B' according to the sixth arrangement example according to the second embodiment. In FIG. 48, all of the pixel circuits 100R', 100G$_1$', 100G$_2$', and 100B' that are included in the pixel array unit 200$_1$ are included in a single group 150RGB'. With respect to all of the pixel circuits 100R', 100G$_1$', 100G$_2$', and 100B' that are included in the group 150RGB, a luminance value code Lc$_{RGB}$ and a signal SH_ON$_{RGB}$ (not illustrated) are commonly supplied from a single LC generating unit 200RGB.

As described above, by providing a common LC generating unit 200RGB with respect to all of the pixel circuits 100R', 100G$_1$', 100G$_2$', and 100B' that are included in the pixel array unit 200$_1$, global shutter can be readily accommodated.

2-4. First Modification of Second Embodiment

Figure 49:
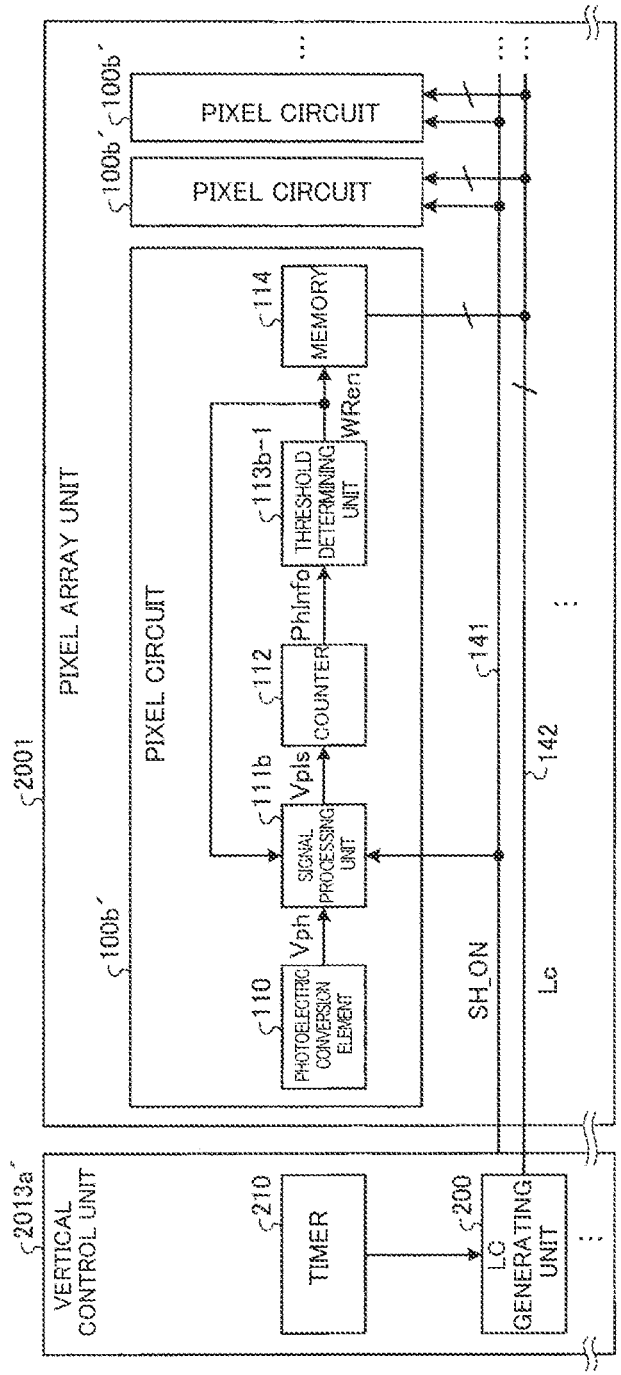
FIG. 49 is a block diagram showing an example configuration of a pixel array unit and a vertical control unit according to a first modification of the second embodiment.

Next, a first modification of the second embodiment will be described. FIG. 49 is a block diagram showing an example configuration of the pixel array unit 200$_1$ and the vertical control unit 2013$a$' according to the first modification of the second embodiment.

In FIG. 49, since the vertical control unit 2013$a$' shares the configuration of the vertical control unit 2013$a$ shown in FIG. 41 described earlier, a description thereof will be omitted here.

In the pixel array unit 200$_1$, a pixel circuit 100$b$' corresponds to the pixel circuit 100$b$ according to the first modification of the first embodiment having been described using FIG. 34 and includes the photoelectric conversion element 110, a signal processing unit 111$b$, the counter 112, a threshold determining unit 113$b$-1, and the memory 114. In the pixel circuit 100$b$', the write signal WRen(W) output from the threshold determining unit 113$b$-1 is supplied to the memory 114 and the signal processing unit 111$b$.

When a counted photon number exceeds the threshold Nth within the exposure period Tsh to create a state where the write signal WRen instructs writing of the luminance value code Lc, the signal processing unit 111$b$ restricts an operation of the photoelectric conversion element 110. Since a method similar to that of the first modification of the first embodiment described earlier can be applied to the restriction of the operation of the photoelectric conversion element 110, a description thereof will be omitted here.

Restricting the operation of the photoelectric conversion element 110 in accordance with the write signal WRen that instructs writing enables power consumption by the pixel circuit 100$b$' to be reduced.

2-5. Second Modification of Second Embodiment

Figure 50:
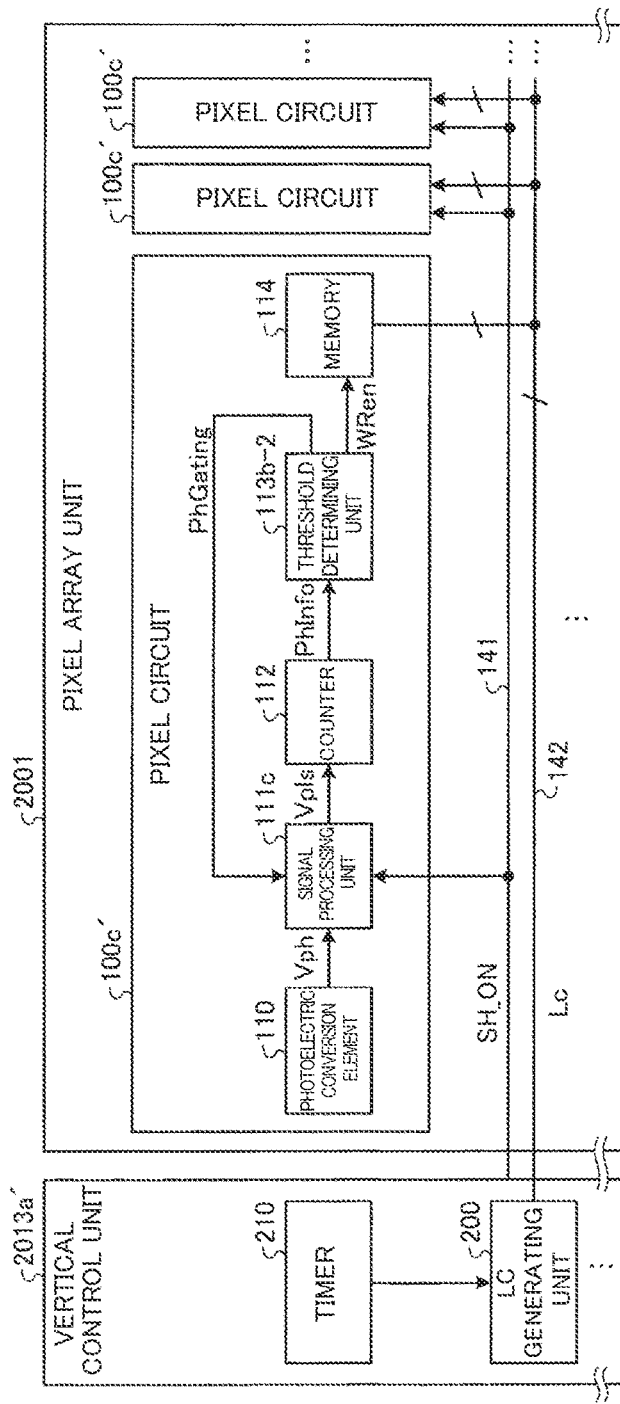
FIG. 50 is a block diagram showing an example configuration of a pixel array unit and a vertical control unit according to a second modification of the second embodiment.

Next, a second modification of the second embodiment will be described. FIG. 50 is a block diagram showing an example configuration of the pixel array unit 200$_1$ and the vertical control unit 2013$a$' according to the second modification of the second embodiment.

In FIG. 50, since the vertical control unit 2013$a$' shares the configuration of the vertical control unit 2013$a$' shown in FIG. 41 described earlier, a description thereof will be omitted here. In addition, in a pixel circuit 100$c$' in the pixel array unit 200$_1$, functions of a signal processing unit 111$b$' and a threshold determining unit 113$b$-2 have been changed as compared to the pixel circuit 100$b$' shown in FIG. 49.

The second modification of the second embodiment corresponds to the pixel circuit 100$c$ according to the second modification of the first embodiment having been described using FIG. 35 and restricts the operation of the photoelectric conversion element 110 in accordance with a detection of the threshold Nth by the threshold determining unit 113$b$-2. Since a method similar to that of the second modification of the first embodiment described earlier can be applied to the restriction of the operation of the photoelectric conversion element 110, a description thereof will be omitted here.

Restricting the operation of the photoelectric conversion element 110 in accordance with a signal PhGating enables power consumption by the pixel circuit 100$c$' to be reduced.

2-6. Third Modification of Second Embodiment

Next, a third modification of the second embodiment will be described. The third modification of the second embodiment corresponds to the pixel circuit 100$d$ according to the third modification of the first embodiment having been described using FIG. 36, and using a dual-mode counter as a counter for counting the pulse Vpls in accordance with an incidence of a photon with respect to the photoelectric conversion element 110 enables, for example, the memory 114 in the pixel circuit 100$a$ shown in FIG. 41 to be omitted and circuit area to be reduced.

Figure 51:
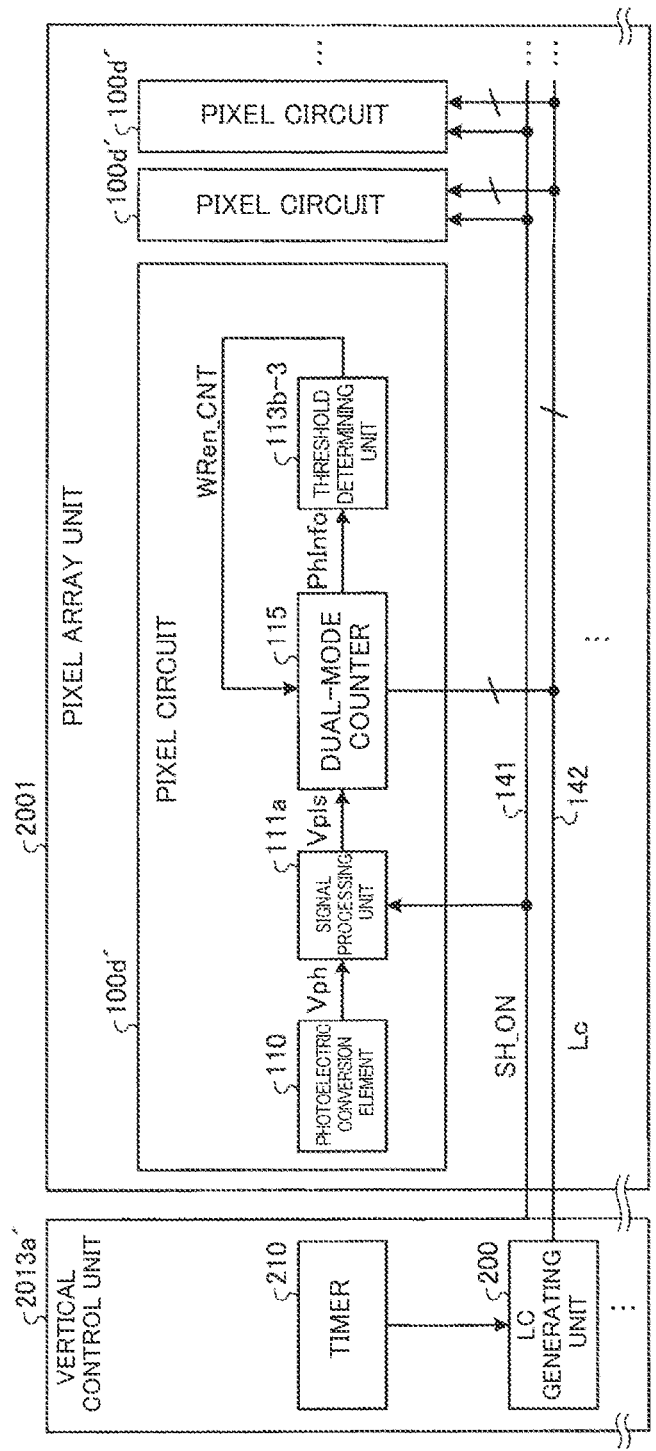
FIG. 51 is a block diagram showing an example configuration of a pixel array unit and a vertical control unit according to a third modification of the second embodiment.

FIG. 51 is a block diagram showing an example configuration of the pixel array unit 200$_1$ and the vertical control unit 2013$a$' according to the third modification of the second embodiment. In FIG. 51, since the vertical control unit 2013$a$' shares the configuration of the vertical control unit 2013$a$' shown in FIG. 41 described earlier, a description thereof will be omitted here. In addition, in a pixel circuit 100$d$' in the pixel array unit 200$_1$, a function of a threshold determining unit 113$b$-3 has been changed, the memory 114 has been omitted, and a dual-mode counter 115 is provided in place of the counter 112 as compared to the pixel circuit 100$a$ shown in FIG. 41.

In FIG. 51, the pulse Vpls in accordance with an incidence of a photon with respect to the photoelectric conversion element 110 is input to the dual-mode counter 115. In addition, the luminance value code LU output from the TC generating unit 120 is input to the dual-mode counter 115. Since a configuration and an operation of the dual-mode counter 115 are similar to the configuration and an operation of the dual-mode counter 115 having been described using FIGS. 37A to 37C, a description thereof will be omitted here.

As described earlier, the dual-mode counter 115 switches operating modes between a counting operation mode and a storage operation mode in accordance with a signal WRen_CNT that is supplied from the threshold determining unit 113$b$-3. In addition, the storage operation mode includes a writing operation mode and a retaining operation mode. When the signal WRen_CNT is indicating a counting operation, the dual-mode counter 115 switches the operating mode to the counting operation mode, counts the number of pulses Vpls that are supplied from the signal processing unit 111$a$', and outputs the photon information PhInfo that indicates a count result. In addition, when the signal WRen_CNT is indicating a storage operation, the dual-mode counter 115 switches the operating mode to the storage operation mode and stores the input luminance value code Lc.

Since a detailed operation by the dual-mode counter 115 is similar to that of the first modification of the first embodiment described earlier, a description thereof will be omitted here.

It should be noted that the compression processing with respect to the predicted count value Npre described using equation (5) and equation (6) and the processing for conversion into a correlation value with respect to the predicted count value Npre described using equation (7) are also applicable to the second embodiment and the respective modifications thereof. In this case, the predicted count value Npre in equations (5), (6), and (7) is substituted with the predicted luminance value Lpre.

2-7. Fourth Modification of Second Embodiment

Next, a fourth modification of the second embodiment will be described. In the second embodiment described above, an update cycle of the predicted luminance value Lpre is made variable as shown in FIG. 40. In other words, in the example shown in FIG. 40, the update cycle is shorter on a side near the start time point to of the exposure period Tsh and the update cycle is made longer as more time elapses from the start time point to. By comparison, the update cycle of the predicted luminance value Lpre is fixed in the fourth modification of the second embodiment.

Figure 52:
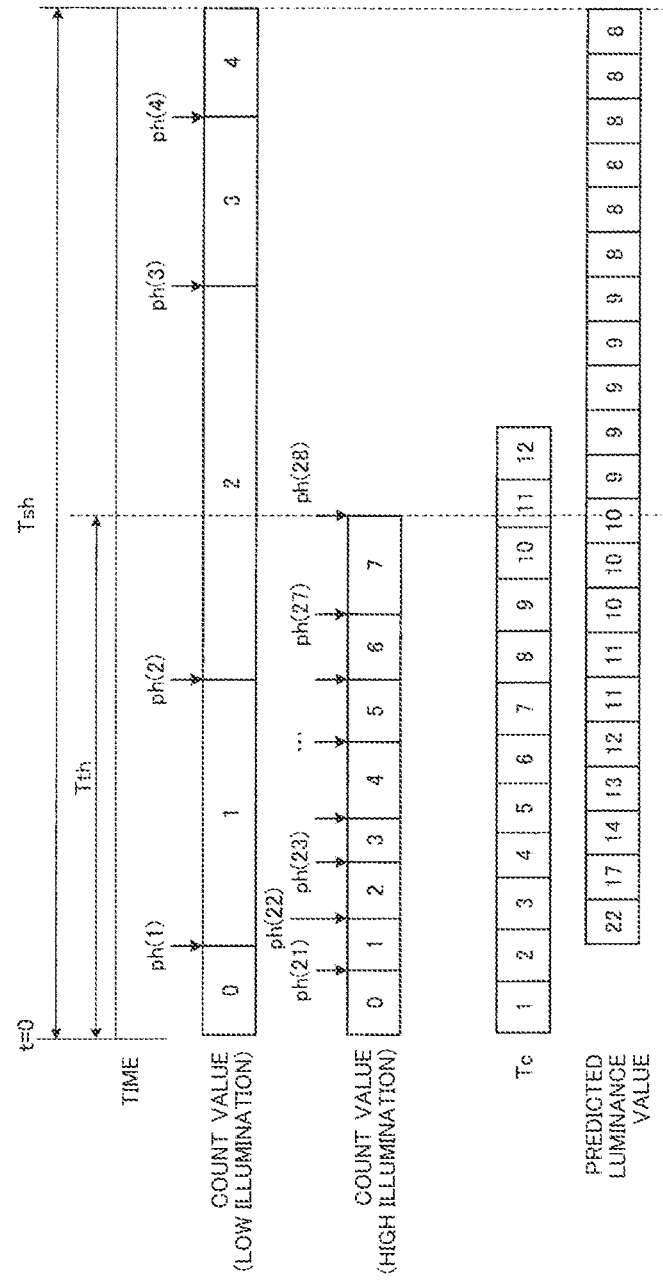
FIG. 52 is a diagram for schematically explaining generation of the predicted luminance value Lpre by a luminance value code generating unit according to a fourth modification of the second embodiment.

FIG. 52 is a diagram for schematically explaining generation of the predicted luminance value Lpre by the luminance value code generating unit 20 according to the fourth modification of the second embodiment. In FIG. 52, the passage of time, an example of a count value in the case of low illumination, an example of a count value in the case of high illumination, an example of the time code Tc at regular intervals, and an example of the predicted luminance value Lpre are respectively shown from top to bottom. Among these values, since the passage of time, the example of a count value in the case of low illumination, the example of a count value in the case of high illumination, and the example of the time code Tc at regular intervals are similar to corresponding portions in FIG. 40 described earlier, a description thereof will be omitted here.

As shown in the bottom part of FIG. 52, for example, the luminance value code generating unit 20 updates the predicted luminance value Lpre at a same time interval. More specifically, in the example shown in FIG. 52, the luminance value code generating unit 20 updates the predicted luminance value Lpre in accordance with a cycle of the predicted luminance value Lpre="22" of which the update cycle is the shortest in FIG. 40 described earlier. In this case, as time elapses from the start time point to, a change in the predicted luminance value Lpre with respect to time decreases. Therefore, the luminance value code generating unit 20 performs a plurality of consecutive updates using the same predicted luminance value Lpre as time elapses from the start time point to. In the example shown in FIG. 52, the luminance value code generating unit 20 performs updates of the predicted luminance value Lpre at a constant cycle consecutively using a same value a plurality of times such as respectively consecutively using the predicted luminance values Lpre="11", "10", "9", and so on twice, three times, five times, and so on.

In this manner, updating the predicted luminance value Lpre at a constant cycle enables the luminance value code generating unit 20 to more readily perform update processing of the predicted luminance value Lpre.

3. Third Embodiment

Next, a third embodiment of the present disclosure will be described. The third embodiment obtains the predicted luminance value Lpre based on the photon number that is incident with respect to the photoelectric conversion element 110 and makes an update cycle for acquiring the predicted luminance value Lpre variable. In addition, a change in the luminance value code Lc that indicates the acquired predicted luminance value Lpre is also made variable.

Figure 53:
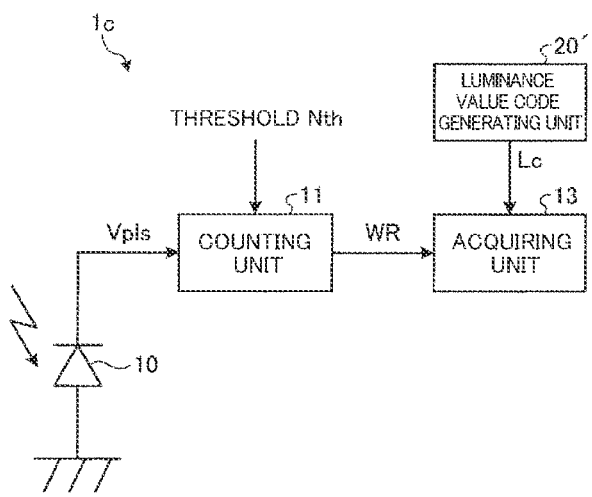
FIG. 53 is a diagram showing a schematic configuration example of a light-receiving apparatus according to a third embodiment.

FIG. 53 is a diagram showing a schematic configuration example of a light-receiving apparatus according to the third embodiment. In FIG. 53, a light-receiving apparatus 1c according to the third embodiment includes a pixel 10, a counting unit 11, a luminance value code generating unit 20', and an acquiring unit 13. In a similar manner to the description of FIG. 1, the pixel 10 includes a photoelectric conversion element that converts light into an electric charge by photoelectric conversion and a signal processing circuit that reads the electric charge from the photoelectric conversion element and outputs the electric charge as an electric signal. The light-receiving apparatus 1c predicts a luminance value in accordance with the number of photons incident to the pixel 10 within a designated exposure period Tsh and acquires, using the acquiring unit 13, a luminance value code Lc which is generated by the luminance value code generating unit 20' and which corresponds to the predicted luminance value.

The third embodiment will now be described in greater detail. As described in the second embodiment, the predicted luminance value Lpre changes in an inversely proportional manner with respect to a time Tth at which a photon number Pn attains a threshold Nth (refer to FIG. 39). In this case, a change amount of the predicted luminance value Lpre per unit time decreases as time elapses from the start time point of the exposure period Tsh. Assuming that the unit time indicates a resolution with respect to time, the change amount of the predicted luminance value Lpre per unit time indicates a resolution of the predicted luminance value Lpre.

Figure 54:
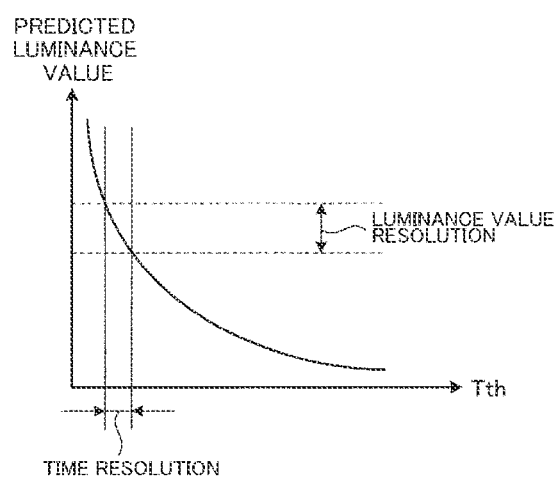
FIG. 54 is a diagram showing an example relationship between a luminance value resolution and a time resolution that is applicable to the third embodiment.

FIG. 54 is a diagram showing an example relationship between a resolution of the predicted luminance value Lpre (a luminance value resolution) and a resolution of time (a time resolution) that is applicable to the third embodiment. FIG. 54 reveals that, when time resolution is constant, luminance value resolution drops as time elapses from the start time point of the exposure period Tsh. In other words, it can also be said that, when luminance value resolution is constant, time resolution drops as time elapses from the start time point of the exposure period Tsh. For example, a lower time resolution suffices as time elapses from the start time point of the exposure period Tsh relative to the time resolution in a vicinity of the start time point of the exposure period Tsh.

In consideration thereof, the light-receiving apparatus 1c according to the third embodiment changes a time interval at which the luminance value code generating unit 20' generates the luminance value code Lc as time elapses from the start time point of the exposure period Tsh. In addition, the light-receiving apparatus 1c controls a change in the luminance value code Lc generated by the luminance value code generating unit 20' as time elapses from the start time point of the exposure period Tsh.

Figure 55:
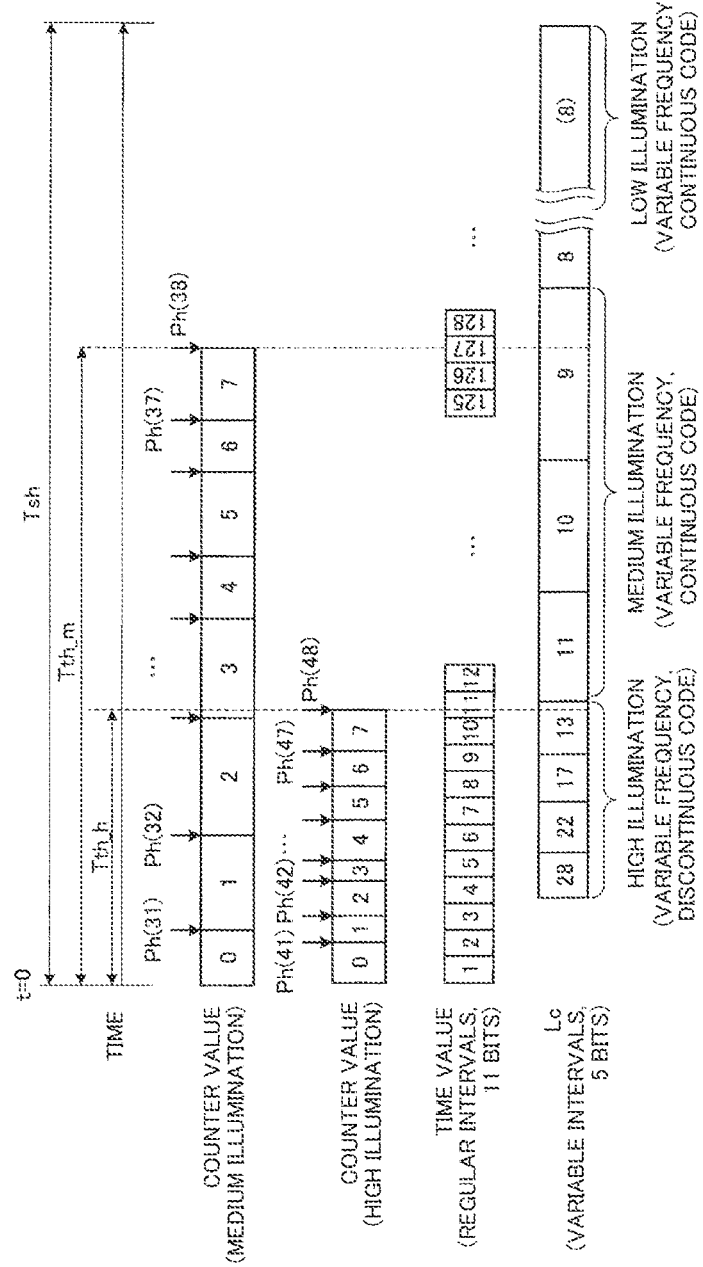
FIG. 55 is a diagram for explaining generation of the luminance value code Lc in cases of high illumination and medium illumination according to the third embodiment.

Generation of the luminance value code Lc by the luminance value code generating unit 20' according to the third embodiment will be described using FIGS. 55 and 56. FIG. 55 is a diagram for explaining the generation of the luminance value code Lc in cases of high illumination and medium illumination according to the third embodiment. In FIG. 55, the passage of time, an example of a count value in the case of medium illumination, an example of a count value in the case of high illumination, a time value, and an example of the luminance value code Lc are respectively shown from top to bottom.

In this case, for the sake of description, it is assumed that the counter included in the counting unit 11 is a 3-bit counter and that the threshold Nth is 8. In other words, when the photon number detected in the pixel 10 reaches 8, the counter of the counting unit 11 overflows.

In FIG. 55, the time value is a value which is incremented every predetermined time and which is supplied from, for example, a timer. On the other hand, the luminance value code generating unit 20' classifies illumination into, for example, three stages including high illumination, medium illumination, and low illumination, and generates the luminance value code Lc at intervals in accordance with respectively different update cycles. In this case, a period of high illumination, a period of medium illumination, and a period of low illumination are assigned to the exposure period Tsh. For example, the period of high illumination is considered to be between the start time point of the exposure period Tsh and a predetermined time and the period of medium illumination is considered to be between the predetermined time and another predetermined time. Furthermore, the period of low illumination is considered to be between the other predetermined time and the end time point of the exposure period Tsh.

Among the respective periods of high illumination, medium illumination, and low illumination, the luminance value code generating unit 20' generates the luminance value code Lc at an interval in accordance with a highest update cycle with respect to the period of high illumination. In addition, the luminance value code generating unit 20' generates the luminance value code Lc in discontinuous values during the period of high illumination. For example, in the period of high illumination, the luminance value code generating unit 20' generates the luminance value code Lc of which values have been decreased in stages from a position nearest to the start time point of the exposure period Tsh toward a distant position (values "28", "22", "17", and "13" in the example shown in FIG. 55).

Even in the third embodiment, during a period in which the time Tth is extremely short, the predicted luminance value Lpre assumes an extremely large value and the predicted luminance value Lpre within the period assumes a realistically meaningless value in a similar manner to the second embodiment described earlier. This means that the luminance value code Lc during this period is unnecessary. Therefore, for example, in the period of high illumination, the luminance value code generating unit 20' can set the luminance value code Lc with a largest value at a time point where a predetermined time has elapsed from the start time point of the period and choose not to set the luminance value code Lc in a period prior to the time point. In the example shown in FIG. 55, for example, the luminance value code generating unit 20' does not set values at time points before the luminance value code Lc="28" or, in other words, luminance value codes Lc that exceed the value "28" among the luminance value codes Lc shown in the bottom section.

The luminance value code generating unit 20' generates the luminance value code Lc in continuous values during the periods of medium illumination and low illumination. For example, in the period of medium illumination, the luminance value code generating unit 20' generates the luminance value code Lc of which values have been decremented by "1" from a position nearest to the start time point of the exposure period Tsh toward a distant position (values "11", "10", and "9" in the example shown in FIG. 55). Although a specific example will be described later, the luminance value code Lc is generated in continuous values in the period of low illumination in a similar manner to the period of medium illumination.

In addition, in this example, during the period of medium illumination, a period corresponding to each luminance value code Lc is set such that the more distant from the start time point of the exposure period Tsh, the longer the period in accordance with the inversely proportional relationship between the expected time $Tth_{ev}$, and the luminance value Lx having been described using equation (6) or the like in the second embodiment described earlier. This is similarly applicable in the periods of high illumination and low illumination. Alternatively, in the period of high illumination, since the values of the respective luminance value codes Lc change in stages, lengths of periods corresponding to the respective luminance value codes Lc can be set the same.

In FIG. 55, in the case of medium illumination, seven photons Ph(31), Ph(32), ..., Ph(37) are counted within the exposure period Tsh and the counter overflows upon a time point of a next detection of an eighth photon Ph(38). Therefore, the timing of detection of the eighth photon Ph(38) is a time Tth_m at which the count value exceeds the threshold Nth. When the counter overflows, using the write signal WRen, the counting unit 11 instructs the acquiring unit 13 to write the luminance value code Lc having been generated by the luminance value code generating unit 20'. In the example shown in FIG. 55, a value "9" of the luminance value code Lc that corresponds to the time Tth_m is acquired by the acquiring unit 13 and written into the memory in accordance with the write signal WRen.

Similarly, in the case of high illumination, seven photons Ph(41), Ph(42), ... Ph(47) are counted within the exposure period Tsh and the counter overflows upon a time point of a next detection of an eighth photon Ph(48). Therefore, the timing of detection of the eighth photon Ph(38) is a time Tth_h at which the count value exceeds the threshold Nth. When the counter overflows, using the write signal WRen, the counting unit 11 instructs the acquiring unit 13 to write the luminance value code Lc having been generated by the luminance value code generating unit 20'. In the example shown in FIG. 55, a value "13" of the luminance value code Lc that corresponds to the time Tth_h is acquired by the acquiring unit 13 and written into the memory in accordance with the write signal WRen.

It is assumed that time values corresponding to the time Tth_h in the case of high illumination and the time Tth_m in the case of medium illumination are, respectively, values "11" and "127".

Figure 56:
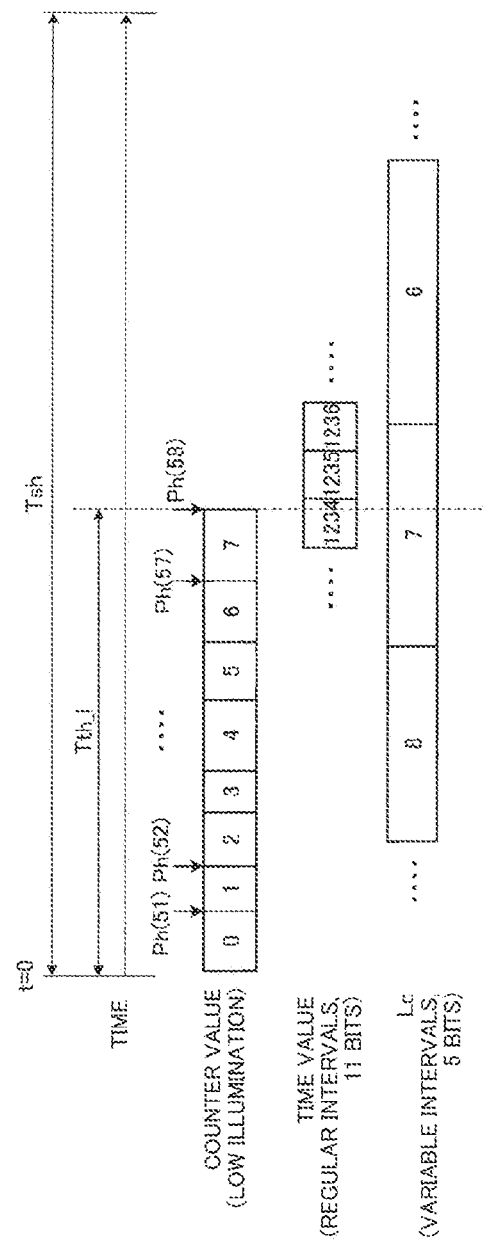
FIG. 56 is a diagram for explaining generation of the luminance value code Lc in a case of low illumination according to the third embodiment.

FIG. 56 is a diagram for explaining generation of the luminance value code Lc in a case of low illumination according to the third embodiment. In FIG. 56, the passage of time, an example of a count value in the case of low illumination, a time value, and an example of the luminance value code Lc are respectively shown from top to bottom.

In FIG. 56, seven photons Ph(51), Ph(52), ..., Ph(57) are counted within the exposure period Tsh and the counter overflows upon a time point of a next detection of an eighth photon Ph(58). Therefore, the timing of detection of the eighth photon Ph(58) is a time Tth_l at which the count value exceeds the threshold Nth. When the counter overflows, using the write signal WRen, the counting unit 11 instructs the acquiring unit 13 to write the luminance value code Lc having been generated by the luminance value code generating unit 20'. In the example shown in FIG. 56, a value "7" of the luminance value code Lc that corresponds to the time Tth_1 is acquired by the acquiring unit 13 and written into the memory in accordance with the write signal WRen.

In the case of low illumination, the average photon reach interval Ta is significantly longer than the cases of high illumination and medium illumination described above and the time value at the time point where the eight photon Ph (38) is detected and the counter overflows ends up being an extremely large value. In the example shown in FIG. 56, the time value is a value "1234" that requires 11 bits. Furthermore, in the case of low illumination, the photon number may not always reach the threshold Nth before the end time point of the exposure period Tsh and, in such a case, the time value ends up being an even larger value that is counted until the end time point of the exposure period Tsh. In other words, when time is to be counted at a constant frequency and the acquiring unit 13 is to acquire count values thereof, a memory with an extremely large bit width is required in order to accommodate low illumination and a large area is necessary for a memory circuit.

Conversely, the value of the luminance value code Lc based on the predicted luminance value Lpre becomes smaller as more time elapses from the start time point of the exposure period Tsh. Therefore, even when the luminance value code Lc is acquired at the end time point of the exposure period Tsh, the acquired luminance value code Lc does not become a large value, a bit width of the memory can be suppressed, and an area of the memory circuit can be reduced.

In addition, even in the third embodiment, the predicted luminance value Lpre that is predicted in the exposure period Tsh can be directly obtained based on the time Tth at which the photon number Pn incident to the photoelectric conversion element 110 had attained the threshold Nth in a similar manner to the second embodiment described earlier. Accordingly, the light-receiving apparatus 1c according to the third embodiment is capable of reducing a load of processing for converting the time code Tc into a luminance value as compared to the light-receiving apparatus 1a according to the first embodiment.

It should be noted that the configurations of the respective pixel circuits 100a' to 100d' according to the second embodiment and respective modifications described earlier and the respective arrangement examples described using FIGS. 43 to 48 can be applied to the third embodiment.

4. Fourth Embodiment

Next, a fourth embodiment of the present disclosure will be described. The fourth embodiment is configured so as to execute counting of a photon number in a period that differs from those of the first to third embodiments described above.

It should be noted that the fourth embodiment can also be applied to any of the first to third embodiments described above. Hereinafter, for the sake of description, it is assumed that the fourth embodiment has been applied with respect to the light-receiving apparatus 1a according to the first embodiment. In addition, in this case, it is assumed that the light-receiving apparatus 1a includes the pixel circuit 100a shown in FIG. 8.

In the first to third embodiments described above, for example, in the first embodiment, as described using FIGS. 2A. 2B, and 3, the predicted count value Npre that is a predicted value of a photon number within the exposure period Tsh is obtained based on the time Tth at which a count value of the photon number from the start time point of the exposure period Tsh had reached the threshold Nth. As described above, since the time at which the photon number is counted differs in accordance with illuminance, there is a risk that correctly obtaining the predicted count value Npre may become difficult with respect to, for example, an object moving at high speed.

As an example, when there is a portion of high illumination and a portion of low illumination in an object moving at high speed, while the count value reaches the threshold Nth in a short period of time (the time Tth_h) in the portion of high illumination, in the portion of low illumination, counting of the photon number is performed until, for example, the end time point of the exposure period Tsh. Therefore, if the object moves significantly between the time Tth_h at which the count value reaches the threshold Nth in the portion of high illumination and the end time point of the exposure period Tsh, a large difference ends up being created between measurement results of the respective portions in the object. This means that a suitable measurement result may not be obtained with respect to the object.

In consideration thereof, the fourth embodiment is configured so as to execute counting of a photon number in a period that differs from those of the first to third embodiments described above. More specifically, in the first to third embodiments described above, counting of a photon number is performed based on a single exposure period Tsh. By comparison, in the fourth embodiment, counting of a photon number is executed based on a divided exposure period Tsh_div obtained by dividing the exposure period Tsh.

Processing such as division of the exposure period Tsh can be executed in accordance with, for example, control by the vertical control unit 2013a in response to an instruction from the control unit 1003.

4-1. First Example According to Fourth Embodiment

Figure 57:
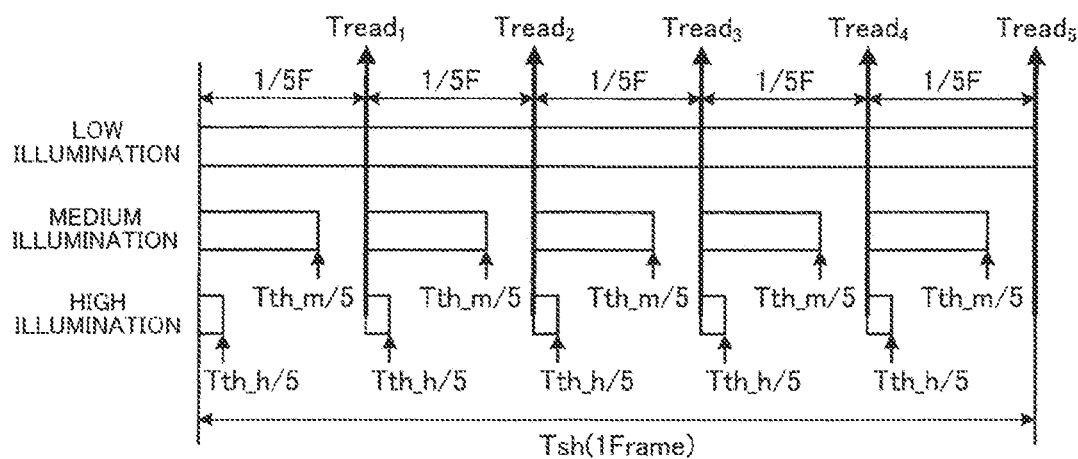
FIG. 57 is a diagram for explaining divided exposure of a first example according to a fourth embodiment.

A first example according to the fourth embodiment will be described. FIG. 57 is a diagram for explaining divided exposure of the first example according to the fourth embodiment. In FIG. 57, the exposure period Tsh is considered a single frame, the exposure period Tsh is divided into five equal parts, and each of the divided parts is assumed to be a divided exposure period Tsh_div. In each divided exposure period Tsh_div, the threshold determining unit 113a makes a determination with respect to the photon information PhInfo based on a threshold Nth_div that is a value that is ⅕ of the threshold Nth with respect to the exposure period Tsh.

Therefore, a time at which the incident photon number attains the threshold Nth_div in the case of medium illumination is a time Tth_m/5 that is ⅕ of the time Tth_m in the exposure period Tsh. In a similar manner, a time at which the incident photon number attains the threshold Nth_div in the case of high illumination is a time Tth_h/5 that is ⅕ of the time Tth_h in the exposure period Tsh. In each divided exposure period Tsh_div, the threshold determining unit 113a outputs the write signal WRen(W) at the time Tth_m/5 and the time Tth_h/5 and writes the time code Tc into the memory 114.

In addition, there may be cases where the photon number incident to the photoelectric conversion element 110 does not reach the threshold Nth_div in each divided exposure period Tsh_div such as in a state of low illumination. In this case, at end time points Tread$_1$, Tread$_2$, Tread$_3$, Tread$_4$, and Tread$_5$ of the respective divided exposure periods Tsh_div, the threshold determining unit 113a outputs the write signal WRen(W) and writes the time code Tc into the memory 114.

In other words, in the first example according to the fourth embodiment, in the exposure period Tsh, the pixel circuit 100a performs exposure five times in the divided exposure periods Tsh_div, each of which is a period that is ⅕ of the exposure period Tsh.

As described above, the time code Tc that is read from the pixel circuit 100a via a signal line 142 is supplied to the signal processing unit 2013c. Based on the time code Tc supplied from the pixel circuit 100a, the signal processing unit 2013c calculates the predicted count value Npre. At this point, with respect to time codes $Tc_1$, $Tc_2$, $Tc_3$, $Tc_4$, and $Tc_5$ having been read in the respective divided exposure periods Tsh_div, the signal processing unit 2013c respectively calculates predicted count values $Npre_1$, $Npre_2$, $Npre_3$, $Npre_4$, and $Npre_5$ based on, for example, equation (1).

The signal processing unit 2013c calculates the predicted count value Npre for the entire exposure period Tsh based on the predicted count values $Npre_1$, $Npre_2$, $Npre_3$, $Npre_4$, and $Npre_5$ in accordance with equation (11) below.

$$Npre = Npre_1 + Npre_2 + Npre_3 + Npre_4 + Npre_5 \quad (11)$$

In this manner, by performing exposure for each divided exposure period Tsh_div created by dividing the exposure period Tsh and reading the time code Tc, a difference in measurement results that is generated in each part of an object that moves within the exposure period Tsh can be suppressed.

4-2. Second Example According to Fourth Embodiment

Next, a second example according to the fourth embodiment will be described. The second example according to the fourth embodiment is an example of determining whether or not divided exposure is to be performed in accordance with illuminance by a photon number incident to the photoelectric conversion element 110.

Figure 58:
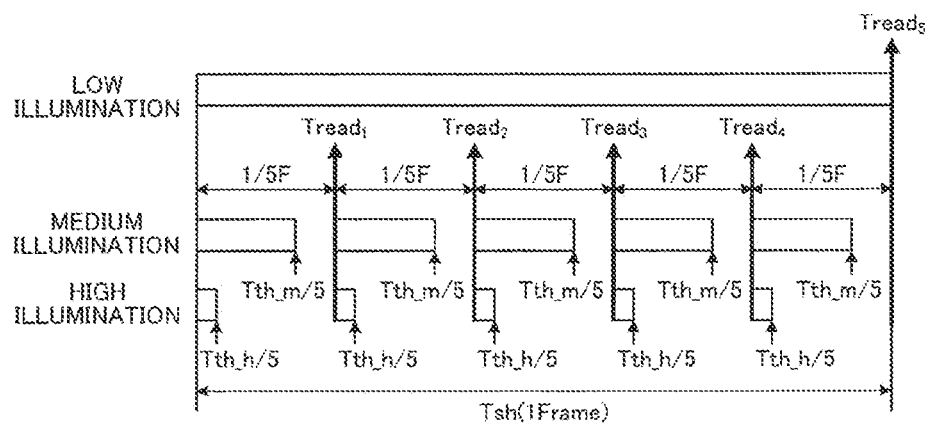
FIG. 58 is a diagram for explaining divided exposure of a second example according to the fourth embodiment.

FIG. 58 is a diagram for explaining divided exposure of the second example according to the fourth embodiment. In FIG. 58, the exposure period Tsh is divided into five equal parts in a similar manner to the first example having been described using FIG. 57. At this point, when illuminance is lower than a predetermined level, the pixel circuit 100a acquires the time code Tc according to the photon number incident within the exposure period Tsh without performing the division of the exposure period Tsh.

In the example shown in FIG. 58, division of the exposure period Tsh is not performed when the illuminance is low illumination but the exposure period Tsh is divided into five divided exposure periods Tsh_div when the illuminance is medium illumination and high illumination.

In other words, the second example according to the fourth embodiment can be configured such that, when the average time interval Ta of photons incident with respect to the photoelectric conversion element 110 is equal to or less than a predetermined time interval, the pixel circuit 100a acquires the time code Tc for each divided exposure period Tsh_div obtained by dividing the exposure period Tsh in plurality.

Figure 59:
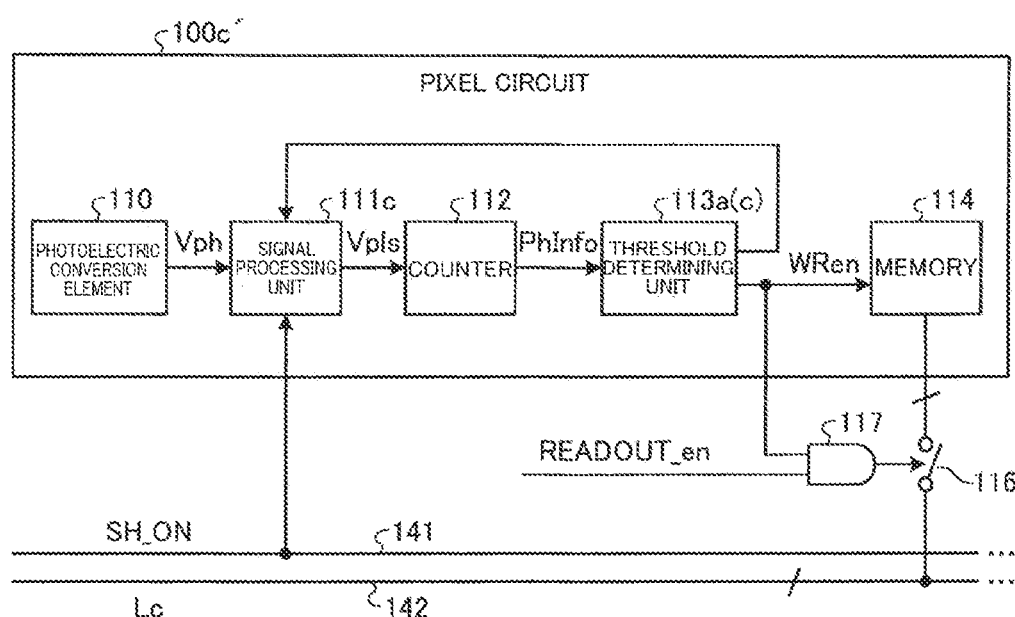
FIG. 59 is a block diagram showing an example configuration of a pixel circuit that is applicable to the second example of the fourth embodiment.

FIG. 59 is a block diagram showing an example configuration of a pixel circuit that is applicable to the second example of the fourth embodiment. In FIG. 59, a pixel circuit 100c' corresponds to the pixel circuit 100c having been described using FIG. 35 and the pixel circuit 100c' controls a signal processing unit 111c in accordance with a determination result of the threshold determining unit 113a(c) and limits an operation of the photoelectric conversion element 110.

In the pixel circuit 100c', the write signal WRen output from the threshold determining unit 113a(c) is supplied to the memory 114 and, at the same time, supplied to one input terminal of an AND circuit 117. A signal READOUT_en is supplied to the other input terminal of the AND circuit 117. In addition, the signal line 142 over which the time code Tc is transmitted is connected to the memory 114 via a switch 116. On (closed) and off (open) of the switch 116 are controlled in accordance with an output of the AND circuit 117.

In this case, it is assumed that the write signal WRen indicates a write instruction in a high state. In addition, it is assumed that the switch 116 is controlled to on when the output from the AND circuit 117 is "1" (high) and controlled to off when the output from the AND circuit 117 is "0" (low). The signal READOUT_en is supplied from the vertical control unit 2013a in accordance with, for example, an instruction from the control unit 1003 based on the predicted count value Npre by the signal processing unit 2013c (refer to FIG. 7).

As an example, the control unit 1003 instructs the vertical control unit 2013a to set the signal READOUT_en to a high state by default. Accordingly, due to the write signal WRen (W) being output from the threshold determining unit 113a, the switch 116 is placed in an on state and the time code Tc supplied from the signal line 142 is written into the memory 114.

On the other hand, when the photon number incident to the photoelectric conversion element 110 from the start time point of the exposure period Tsh to, for example, a first divided exposure period Tsh_div does not reach the threshold Nth_div, the control unit 1003 assumes that illumination is low illumination and instructs the vertical control unit 2013a to cause the signal READOUT_en to make a transition to the low state. In addition, for example, at the end time point $Tread_4$ of the divided exposure period $Tsh\_div_4$ that is a last division point of the exposure period Tsh, the control unit 1003 instructs the vertical control unit 2013a to cause the signal READOUT_en to make a transition from the low state to the high state. Accordingly, the time code Tc in the case of low illumination can be written into the memory 114.

4-3. Third Example According to Fourth Embodiment

Next, a third example according to the fourth embodiment will be described. The third example according to the fourth embodiment is an example in which, when dividing the exposure period Tsh into a plurality of divided exposure periods Tsh_div, divided exposure periods Tsh_div with different lengths are to be included.

Figure 60:
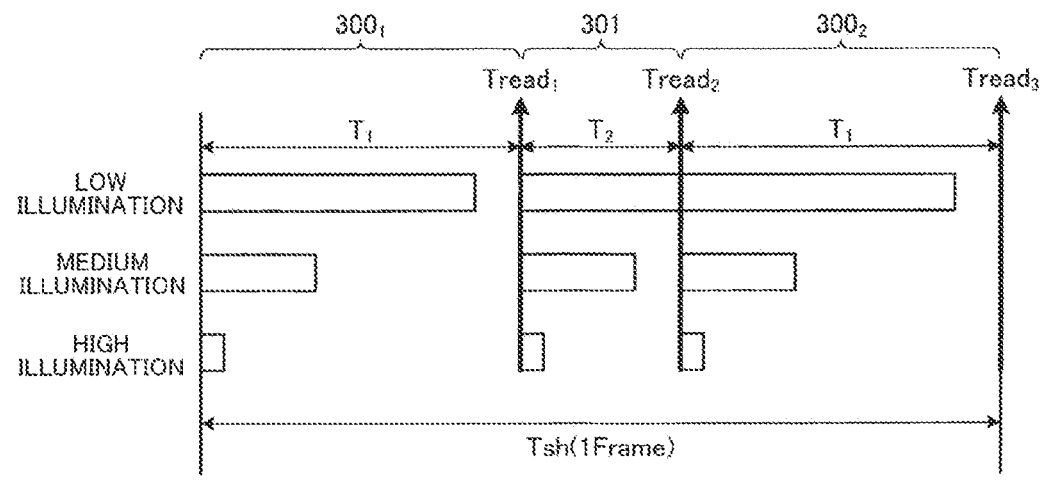
FIG. 60 is a diagram for explaining divided exposure of a third example according to the fourth embodiment.

FIG. 60 is a diagram for explaining divided exposure of the third example according to the fourth embodiment. In the example shown in FIG. 60, the exposure period Tsh is divided into two divided exposure periods $Tsh\_div\ 300_1$ and $300_2$ respectively having a first time $T_1$ and one divided exposure period Tsh_div 301 having a second time $T_2$ that is shorter than the time $T_1$.

While lengths of the respective divided exposure periods $Tsh\_div\ 300_1$ and $300_2$ and 301 are not particularly limited, for example, the lengths of the respective divided exposure periods $Tsh\_div\ 300_1$ and $300_2$ can conceivably be set to twice the length of the divided exposure period Tsh_div 301.

In the example shown in FIG. 60, a calculation number of times of the predicted count value Npre that predicts a photon number and a read number of times of the time code Tc from the memory 114 are both three times and, for example, the number of times the respective processing steps are performed can be reduced as compared to the first example of the fourth embodiment described earlier in which the calculation number of times of the predicted count value Npre and the read number of times of the time code Tc are both five times. In this manner, by including a divided exposure period Tsh_div of a different length when dividing the exposure period Tsh into a plurality of divided exposure periods Tsh_div, power consumption related to calculation processing of the predicted count value Npre and read processing from the memory 114 can be reduced.

4-4. Fourth Example According to Fourth Embodiment

Next, a fourth example according to the fourth embodiment will be described. The fourth example according to the fourth embodiment is an example in which the exposure period Tsh is divided into a plurality of divided exposure periods Tsh_div of equal length but values of the threshold Nth in the respective divided exposure periods Tsh_div are differentiated.

Figure 61:
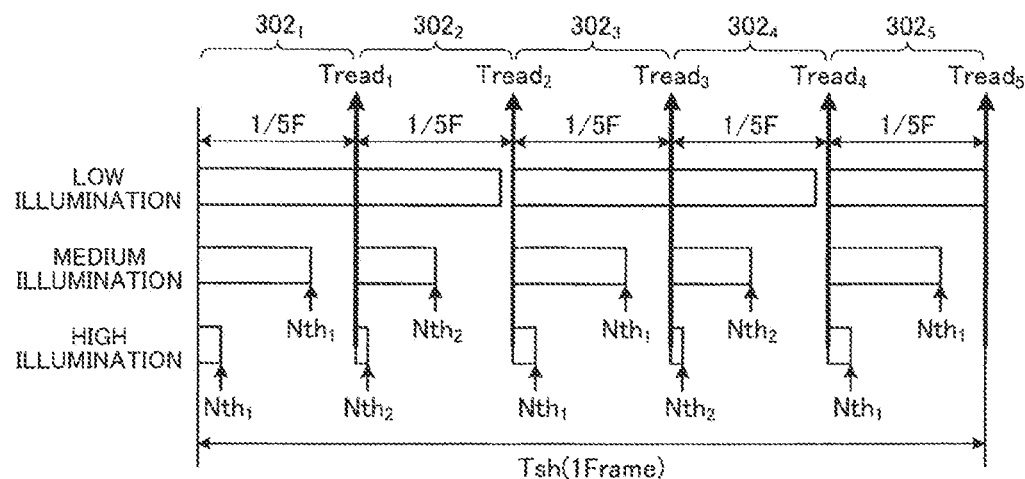
FIG. 61 is a diagram for explaining divided exposure of a fourth example according to the fourth embodiment.

FIG. 61 is a diagram for explaining divided exposure of the fourth example according to the fourth embodiment. In the example shown in FIG. 61, the exposure period Tsh is divided into five divided exposure periods Tsh_div $302_1$, $302_2$, $302_2$, $302_4$, and $302_5$ of equal length. In addition, a threshold $Nth_1$ is set with respect to the divided exposure periods Tsh_div $302_1$, $302_3$, and $302_5$ but a threshold $Nth_2$ with a smaller value than the threshold $Nth_1$ is set with respect to the divided exposure periods Tsh_div $302_2$ and $302_4$.

As described above, the time code Tc output from the pixel circuit 100a via a signal line 142 is supplied to the signal processing unit 2013c. Based on the time code Tc supplied from the pixel circuit 100a, the signal processing unit 2013c calculates the predicted count value Npre. At this point, with respect to time codes $Tc_{11}$, $Tc_{12}$, $Tc_{13}$, $Tc_{14}$, and $Tc_{15}$ having been read in the respective divided exposure periods Tsh_div $302_1$ to $302_5$, the signal processing unit 2013c respectively calculates predicted count values $Npre_{11}$, $Npre_{12}$, $Npre_{13}$, $Npre_{14}$, and $Npre_{15}$ based on, for example, equation (1).

In this case, the predicted count values $Npre_{11}$, $Npre_{13}$, and $Npre_{15}$ are values calculated based on a determination result using the threshold $Nth_1$. On the other hand, the predicted count values $Npre_{12}$ and $Npre_{14}$ are values calculated based on a determination result using the threshold $Nth_2$ with a different value from that of the threshold $Nth_1$. When the threshold $Nth_1$ and the threshold $Nth_2$ have a relationship expressed as $Nth_1 = k \times Nth_2$ using a predetermined coefficient k, the signal processing unit 2103c calculates the predicted count value Npre over the entire exposure period Tsh in accordance with equation (12) below.

$$Npre = Npre_{11} + k \times Npre_{12} + Npre_{13} + k \times Npre_{14} + Npre_{15} \quad (12)$$

In this manner, by setting thresholds $Nth_1$ and $Nth_2$ with different values to the respective divided exposure periods Tsh_div $302_1$ to $302_5$ obtained by dividing the exposure period Tsh, multiple exposure under different exposure conditions can be realized.

4-5. Fifth Example According to Fourth Embodiment

Next, a fifth example according to the fourth embodiment will be described. The fifth example according to the fourth embodiment is an example in which, when dividing the exposure period Tsh into a plurality of divided exposure periods Tsh_div, divided exposure periods Tsh_div with different lengths are to be included. In the fifth example according to the fourth embodiment, the exposure period Tsh is divided such that lengths of the respective divided exposure periods Tsh_div are sequentially multiplied by a predetermined multiple (for example, doubled) from the start time point toward the end time point of the exposure period Tsh.

Figure 62:
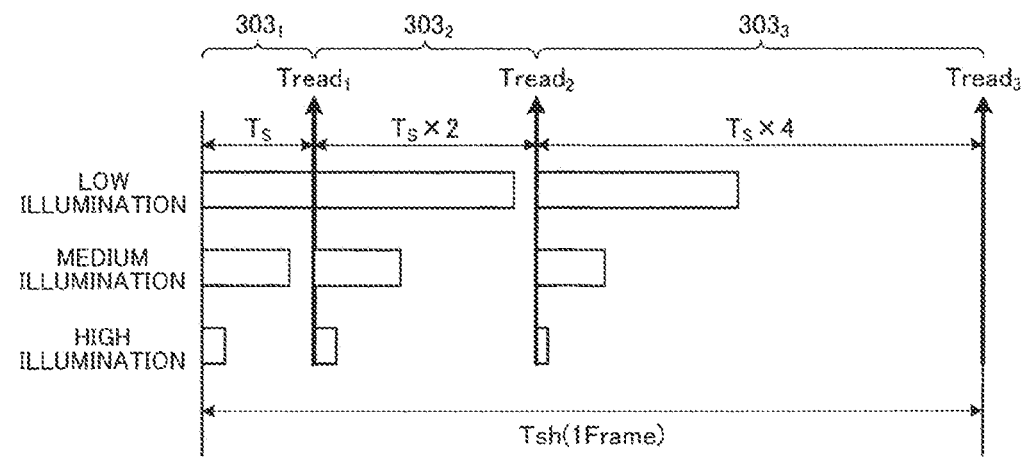
FIG. 62 is a diagram for explaining divided exposure of a fifth example according to the fourth embodiment.

FIG. 62 is a diagram for explaining divided exposure of the fifth example according to the fourth embodiment. In the example shown in FIG. 62, in order from the start time point of the exposure period Tsh, the exposure period Tsh is divided into three divided exposure periods Tsh_div $303_1$, $303_2$, and $303_3$. Among the three divided exposure periods Tsh_div $303_1$, $303_2$, and $303_3$, if the length of the head divided exposure period Tsh_div $303_1$ is denoted by a time $T_1$, then the length of the next divided exposure period Tsh_div $303_2$ is to be $T_8 \times 2$. In addition, the length of the divided exposure period Tsh_div $303_3$ on the side of the end time point of the exposure period Tsh is to be $T_8 \times 4$.

The division method of the exposure period Tsh according to the fifth example according to the fourth embodiment can be applied to digital overlapping which is one method of realizing a high dynamic range (HDR) function that enables clear images to be obtained in an environment with significant differences in illuminance. In the case of imaging, digital overlapping is a technique for expanding a dynamic range using, for example, information of a plurality of frames with different charge accumulation times (exposure times).

In the three divided exposure periods Tsh_div $303_1$, $303_2$, and $303_3$, a predicted count value $Npre_{Ts}$ based on an exposure time Ts is calculated based on the time code Tc having been read from the plurality of pixel circuits 100a arranged in a two-dimensional grid pattern in the pixel array unit 2001 (and the logic array unit 2011). In a similar manner, a predicted count value $Npre_{Ts2}$ based on an exposure time $T_8 \times 2$ and a predicted count value $Npre_{Ts4}$ based on an exposure time $T_8 \times 4$ are calculated based on the time code Tc read from the plurality of pixel circuits 100a. Applying processing in accordance with the technique of digital overlapping to the predicted count values $Npre_{Ts}$, $Npre_{Ts2}$, and $Npre_{Ts4}$ enables a dynamic range related to incident photon detection to be expanded.

4-6. Sixth Example According to Fourth Embodiment

Next, a sixth example according to the fourth embodiment will be described. The sixth example according to the fourth embodiment is an example in which the order of the respective divided exposure periods Tsh_div $303_1$, $303_2$, and $303_3$ in the fifth example according to the fourth embodiment described above has been changed.

Figure 63:
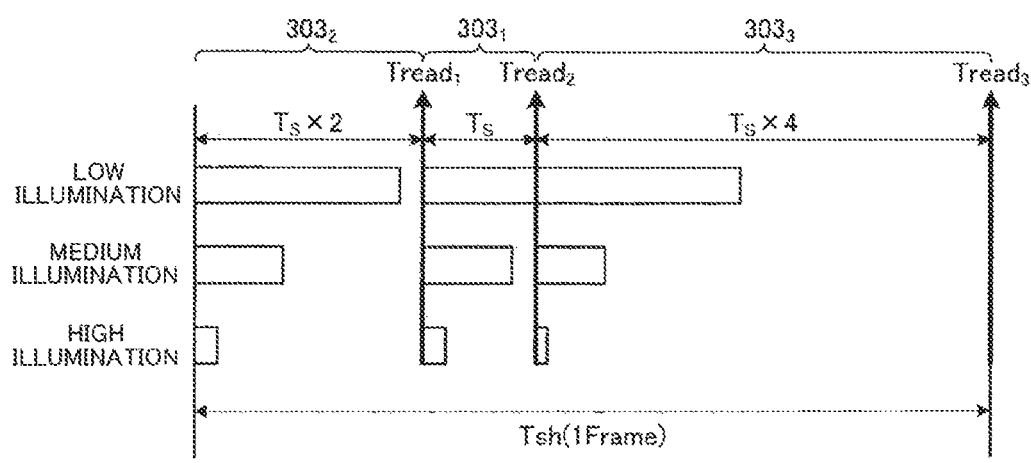
FIG. 63 is a diagram for explaining divided exposure of a sixth example according to the fourth embodiment.

FIG. 63 is a diagram for explaining divided exposure of the sixth example according to the fourth embodiment. In the fifth example according to the fourth embodiment described using FIG. 62, the respective divided exposure periods Tsh_div $303_1$ to $303_3$ are arranged in an order of monotonous increase of lengths from the start time point of the exposure period Tsh.

By comparison, in the sixth example according to the fourth embodiment shown in FIG. 63, the respective divided exposure periods Tsh_div $303_1$ to $303_3$ are arranged in an order that differs from an order of monotonous increase or monotonous decrease of lengths. In other words, in the example shown in FIG. 63, three divided exposure periods Tsh_div $303_1$ to $303_3$ of which lengths are respectively the time $T_8$, the time $T_8 \times 2$, and the time $T_8 \times 4$ are arranged in an order of the divided exposure period Tsh_div $303_2$, the divided exposure period Tsh_div $303_1$, and the divided exposure period Tsh_div $303_3$ from the start time point of the exposure period Tsh.

In this manner, in the sixth example according to the fourth embodiment, the three respective divided exposure periods Tsh_div $303_1$ to $303_3$ of which lengths are respectively the time $T_8$, the time $T_8 \times 2$, and the time $T_8 \times 4$ are arranged in an order that differs from an order of monotonous increase or monotonous decrease of lengths. Even in this case, processing in accordance with the technique of digital overlapping can be applied to the predicted count values $Npre_{Ts}$, $Npre_{Ts2}$, and $Npre_{Ts4}$ respectively calculated in the divided exposure periods Tsh_div $303_1$ to $303_3$ and, accordingly, an expansion of a dynamic range related to incident photon detection can be achieved.

5. Fifth Embodiment

Figure 64:
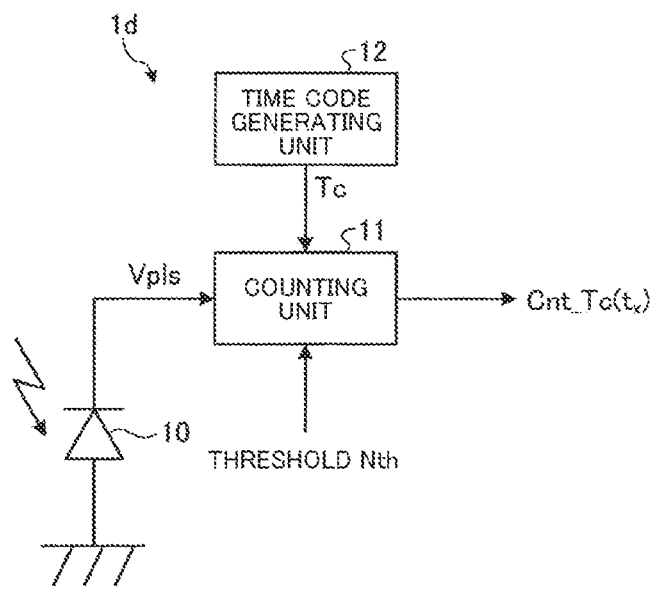
FIG. 64 is a diagram showing a schematic configuration example of a light-receiving apparatus according to a fifth embodiment.

Next, a fifth embodiment of the present disclosure will be described. FIG. 64 is a diagram showing a schematic configuration example of a light-receiving apparatus according to the fifth embodiment. In FIG. 64, a light-receiving apparatus 1d includes a pixel 10, a counting unit 11, and a time code generating unit 12.

In the light-receiving apparatus 1d, the counting unit 11 counts a pulse Vpls output from the pixel 10 when a designated exposure period Tsh starts. When the number of the counted pulses Vpls reaches a threshold Nth at, for example, a time $t_x$, the counting unit 11 switches a counted object from the pulse Vpls to a time code Tc. When the exposure period Tsh ends, the counting unit 11 outputs a time code number $Cnt\_Tc(t_x)$ that represents the number of time codes having been counted from the time $t_x$.

Since an update cycle of the time code Tc generated by the time code generating unit 12 is known, the time $t_x$ can be obtained from the time code number $Cnt\_Tc(t_x)$ and, based on the obtained time $t_x$, a photon number to be incident within the exposure period Tsh can be predicted.

According to the configuration of the fifth embodiment, the time code Tc itself need not be stored and, consequently, a memory into which the time code Tc is to be written can be omitted. In the example shown in FIG. 64, in the light-receiving apparatus 1d, the acquiring unit 13 which is included in the light-receiving apparatuses 1a to 1c described earlier and which includes the memory is omitted. In addition, according to the configuration of the fifth embodiment, the time code Tc need not include a value that changes time-sequentially and, for example, a pulse for each update cycle can be used as the time code Tc. In this case, the time code number $Cnt\_Tc(t_x)$ is a counted value obtained by counting the number of pulses.

Hereinafter, unless otherwise noted, a description will be given on the assumption that the time code Tc is a pulse for each update cycle.

It should be noted that prediction of a photon number based on the time code number $Cnt\_Tc(t_x)$ is to be performed in a circuit in a subsequent stage such as a signal processing unit 2013c (refer to FIG. 7). The prediction of a photon number is not limited to this example and may be performed inside the light-receiving apparatus 1d or outside the light-receiving apparatus 1d.

Figure 65:
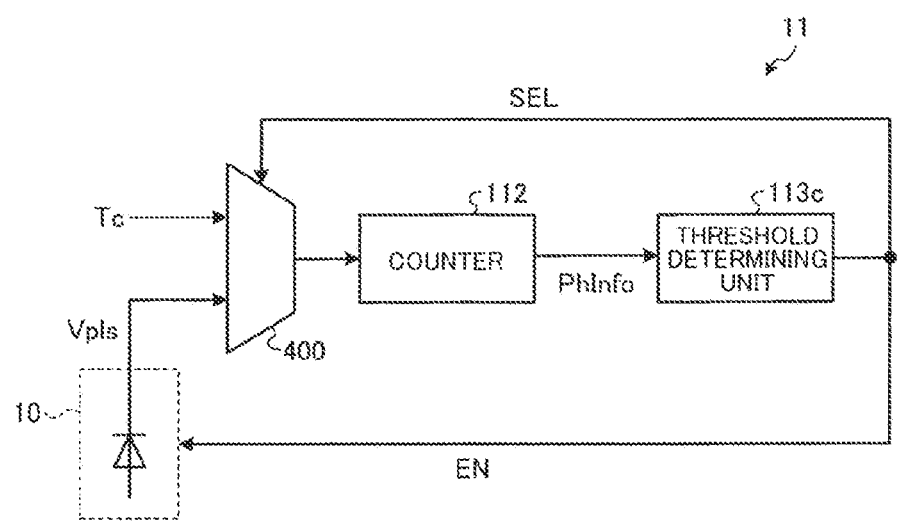
FIG. 65 is a block diagram schematically showing an example of a configuration of a counting unit according to the fifth embodiment.

FIG. 65 is a block diagram schematically showing an example of a configuration of the counting unit 11 according to the fifth embodiment. In FIG. 65, the counting unit 11 includes a counter 112, a threshold determining unit 113c, and a selector 400.

Of the selector 400, the pulse Vpls output from the pixel 10 is input to one input terminal and the time code Tc having been generated by the time code generating unit 12 is input to another input terminal. In accordance with a selection signal SEL that is output from the threshold determining unit 113c, the selector 400 selects and outputs one of the input pulse Vpls and the input time code Tc. An output of the selector 400 is input to the counter 112. The counter 112 counts the number of pulses Vpls or time codes Tc that are output from the selector 400 and outputs a count result as photon information PhInfo.

The threshold determining unit 113c makes a determination based on the threshold Nth with respect to the photon information PhInfo having been output from the counter 112. More specifically, the threshold determining unit 113c determines whether or not the count result included in the photon information PhInfo or, in other words, the number of pulses Vpls or time codes Tc has reached the threshold Nth.

It should be noted that values of the threshold Nth and the time code Tc are set so that the number of counted time codes Tc is smaller than the threshold Nth even when the time code Tc is continuously counted from start to end of the exposure period Tsh. Therefore, the threshold determining unit 113c is to make a determination based on the threshold Nth with respect to the number of pulses Vpls among the pulse Vpls and the time code Tc.

The threshold determining unit 113c outputs a selector selection signal SEL and an enable signal EN. When the threshold determining unit 113c determines that the counted number has reached the threshold Nth, the threshold determining unit 113c respectively causes the selection signal SEL and the enable signal EN to make a transition to a predetermined state.

Hereinafter, the selection signal SEL and the enable signal EN when the counted number reaches the threshold Nth will be respectively described as a selection signal SEL(Nth) and an enable signal EN (Nth), and respectively causing the selection signal SEL and the enable signal EN to make a transition to the selection signal SEL(Nth) and the enable signal EN (Nth) will be described as outputting the selection signal SEL(Nth) and outputting the enable signal EN (Nth) or the like.

In accordance with the selection signal SEL (Nth), the selector 400 selects the time code Tc from one of the input pulse Vpls and the input time code Tc. In other words, when the threshold determining unit 113c determines that the counted number of the pulse Vpls has reached the threshold Nth, information that is input to the counter 112 from the selector 400 is switched from the pulse Vpls to the time code Tc. The counter 112 counts the number of input time codes Tc.

In addition, the pixel 10 stops an operation of the photoelectric conversion element 110 in response to the enable signal EN (Nth). For example, referring to FIG. 9, a switch controlled to open and close by the enable signal EN is inserted at least on a side of one end of a resistor $110_1$. More specifically, the switch is inserted at least either between the resistor $110_1$ and a power supply potential VDD or between the resistor $110_1$ and a connection point where the photoelectric conversion element 110 and an inverter $110_2$ are connected. These positions are not restrictive and the switch may be inserted to at least a side of one end of the photoelectric conversion element 110.

The pixel 10 changes the switch into an open state in accordance with the enable signal EN (Nth) and stops application of a voltage of the power supply potential VDD with respect to the photoelectric conversion element 110. The pixel 10 outputs the enable signal EN upon a start of a next exposure period Tsh, changes the switch into a closed state, and starts application of the power supply potential VDD with respect to the photoelectric conversion element 110. Accordingly, power consumption by the photoelectric conversion element 110 can be reduced.

Figure 66:
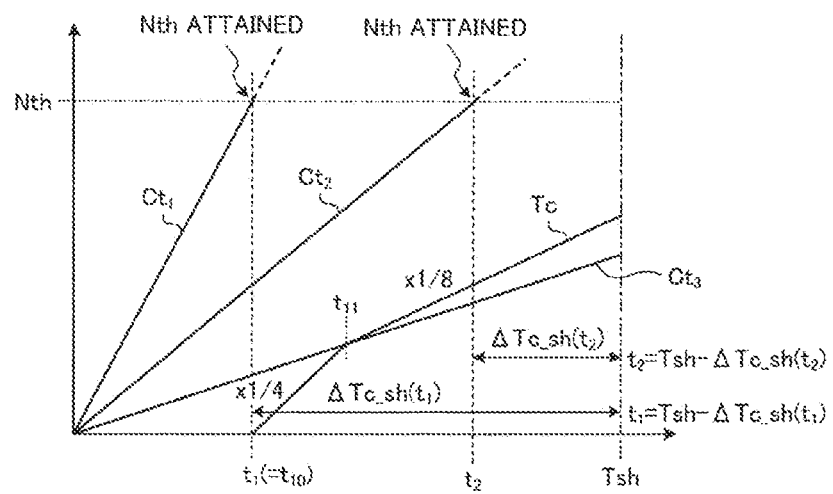
FIG. 66 is a diagram for explaining prediction of a photon number that is applicable to the fifth embodiment.

FIG. 66 is a diagram for explaining prediction of a photon number that is applicable to the fifth embodiment. In FIG. 66, an abscissa represents passage of time from the start of the exposure period Tsh. An ordinate represents a photon number or the number of pulses Vpls with respect to straight lines $Ct_1$ to $Ct_3$ and a change in the time code Tc with respect to a polygonal line Tc.

As an example, it is assumed that the time code generating unit 120 is to update the time code Tc at the update cycle shown in FIG. 12. Specifically, the exposure period Tsh is assumed to have a length corresponding to 128 clock cycles (0th clock cycle to 127th clock cycle), and during a period (0th clock cycle to 31st clock cycle) corresponding to 32 clock cycles from the start of the exposure period Tsh, the time code Tc is updated using 2 clock cycles as an update cycle. During a next period (32nd clock cycle to 63rd clock cycle) corresponding to 32 clock cycles, the time code Tc is updated using 4 clock cycles as an update cycle, and during a further next period (64th clock cycle to 127th clock cycle) corresponding to 64 clock cycles, the time code Tc is updated using 8 clock cycles as an update cycle.

In the example shown in FIG. 66, 2 clock cycles is used as an update cycle from the start of the exposure period Tsh to a time $t_{10}$, 4 clock cycles is used as an update cycle from the time $t_{10}$ to a time $t_{11}$, and 8 clock cycles is used as an update cycle from the time $t_{11}$ to the end of the exposure period Tsh.

In FIG. 66, the straight line $Ct_1$ indicates that the counted photon number had attained the threshold Nth at a time $t_1$. In addition, the straight line $Ct_2$ indicates that the counted photon number had attained the threshold Nth at a time $t_2$ that is later than the time $t_1$. In this case, since an update number of times of the time code Tc at the end of the exposure period Tsh from the start time point of the exposure period Tsh is known and the update cycle at each time point of the time code Tc is also known, the times $t_1$ and $t_2$ can be respectively obtained by back calculation based on time code numbers $Cnt\_Tc(t_1)$ and $Cnt\_Tc(t_2)$ having been respectively counted from the times $t_1$ and $t_2$.

Here, a time from a time $t_x$ to the end time point (denoted as a time Tsh) of the exposure period Tsh is assumed to be a time $\Delta Tc\_sh(t_x)$. In this case, the time $t_x$ is expressed by equation (13) below.

$$t_x = Tsh \cdot \Delta Tc\_sh(t_x) \tag{13}$$

The time $\Delta Tc\_sh(t_x)$ is obtained based on a time code number $Cnt\_Tc(t_x)$ having been counted from the time $t_x$. In other words, when the update cycle of the time code Tc is as shown in FIG. 12, the time $\Delta Tc\_sh(t_x)$ can be obtained by equations (14) to (16) below based on a value of the time code number $Cnt\_Tc(t_x)$. In each equation, ": (colon)" indicates that a preceding description is a condition with respect to the time code number $Cnt\_Tc(t_x)$. In addition, [Ck] indicates that an immediately preceding numerical value is a clock number.

$$Cnt\_Tc(t_x) < 8 : \Delta Tc\_sh(t_x) = Cnt\_Tc(t_x) \times 8[Ck] \tag{14}$$

$$8 < Cnt\_Tc(t_x) \leq 16 : \Delta Tc\_sh(t_x) = 64[Ck] + (Cnt\_Tc(t_x) - 8[Tc]) \times 4[Ck] \tag{15}$$

$$Cnt\_Tc(t_x) > 16 : \Delta Tc\_sh(t_x) = 96[Ck] + (Cnt\_Tc(t_x) - 16[Tc]) \times 2[Ck] \tag{16}$$

For example, the signal processing unit 2013c executes the calculations of equations (13) to (16) based on the time code number $Cnt\_Tc(t_x)$ output from the counter 112 to obtain the time $t_x$ at which the photon number had reached the threshold Nth. In addition, according to equation (1) described earlier, the time $t_x$ is used as the time Tth in equation (1) to obtain the predicted count value Npre.

As indicated by the straight line $Ct_3$ in FIG. 66, when illumination is low and the photon number does not reach the threshold Nth even after the exposure period Tsh elapses, the selection signal SEL (Nth) is not output and the time code Tc is not selected as input by the selector 400. Therefore, counting of the time code number $Cnt\_Tc(t_x)$ is not performed and time code number $Cnt\_Tc(t_x) = 0$ is obtained. In this case, the photon number having been counted at the time point where the exposure period Tsh elapses can be used as the predicted count value Npre.

Figure 67:
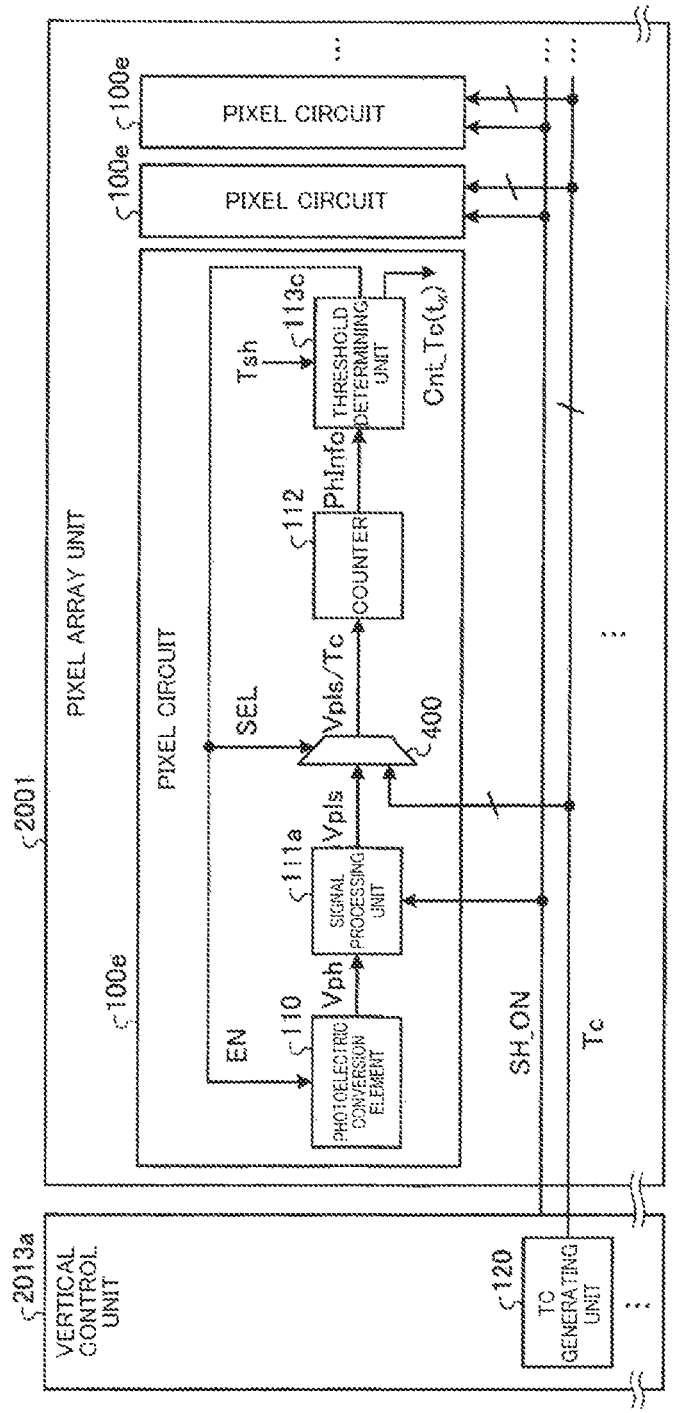
FIG. 67 is a block diagram showing an example configuration of a pixel circuit according to the fifth embodiment.

FIG. 67 is a block diagram showing an example configuration of a pixel circuit according to the fifth embodiment. In FIG. 67, since a configuration similar to that of the vertical control unit 2013a described using FIG. 8 can be applied to the vertical control unit 2013a, a description thereof will be omitted here. In FIG. 67, the pixel array unit 2001 includes a plurality of pixel circuits 100e. It should be noted that FIG. 67 extracts and shows the respective pixel circuits 100e included in one row among the respective pixel circuits 100e that are arranged in a two-dimensional grid pattern in the pixel array unit 2001 in a similar manner to the example shown in FIG. 8.

The pixel circuit 100e includes the photoelectric conversion element 110, a signal processing unit 111a, the selector 400, the counter 112, and a threshold determining unit 113c. The following description will be given with a focus on portions that differ from FIG. 8 described earlier.

An operation of the photoelectric conversion element 110 is controlled in accordance with the enable signal EN that is output from the threshold determining unit 113c. The photoelectric conversion element 110 outputs a signal Vph in accordance with an incidence of a photon, and the signal processing unit 111a shapes the signal Vph output from the photoelectric conversion element 110 and outputs the shaped signal Vph as a pulse Vpls. The pulse Vpls is input to one input terminal of the selector 400. The time code Tc having been generated by the time code generating unit 120 is input to another input terminal of the selector 400.

In accordance with a selection signal SEL that is output from the threshold determining unit 113c, the selector 400 outputs one of the input pulse Vpls having been input to the one input terminal and the time code Tc having been input to the other input terminal. An output of the selector 400 is input to the counter 112.

A signal indicating the exposure period Tsh such as a signal that is placed in a high state during the exposure period Tsh and placed in a low state during other periods is input to the counter 112. The counter 112 counts the pulse Vpls or the time code Tc output from the selector 400 in the exposure period Tsh and outputs a count value (a photon number or a time code number $Cnt\_Tc(t_x)$) as photon information PhInfo.

The threshold determining unit 113c makes a threshold determination based on the photon information PhInfo having been output from the counter 112. In addition, the threshold determining unit 113c outputs the selection signal SEL and the enable signal EN. When the threshold determining unit 13c determines that the photon number has reached the threshold Nth based on the photon information PhInfo, the threshold determining unit 113c causes the selection signal SEL to make a transition to a selection signal SEL(Nth) and the enable signal EN to make a transition to an enable signal EN(Nth). Furthermore, at the end of the exposure period Tsh, the threshold determining unit 113c outputs a count value (for example, the time code number Cnt_Tc($t_x$)) supplied from the counter 112 and supplies the count value to, for example, the signal processing unit 2013c.

Figure 68:
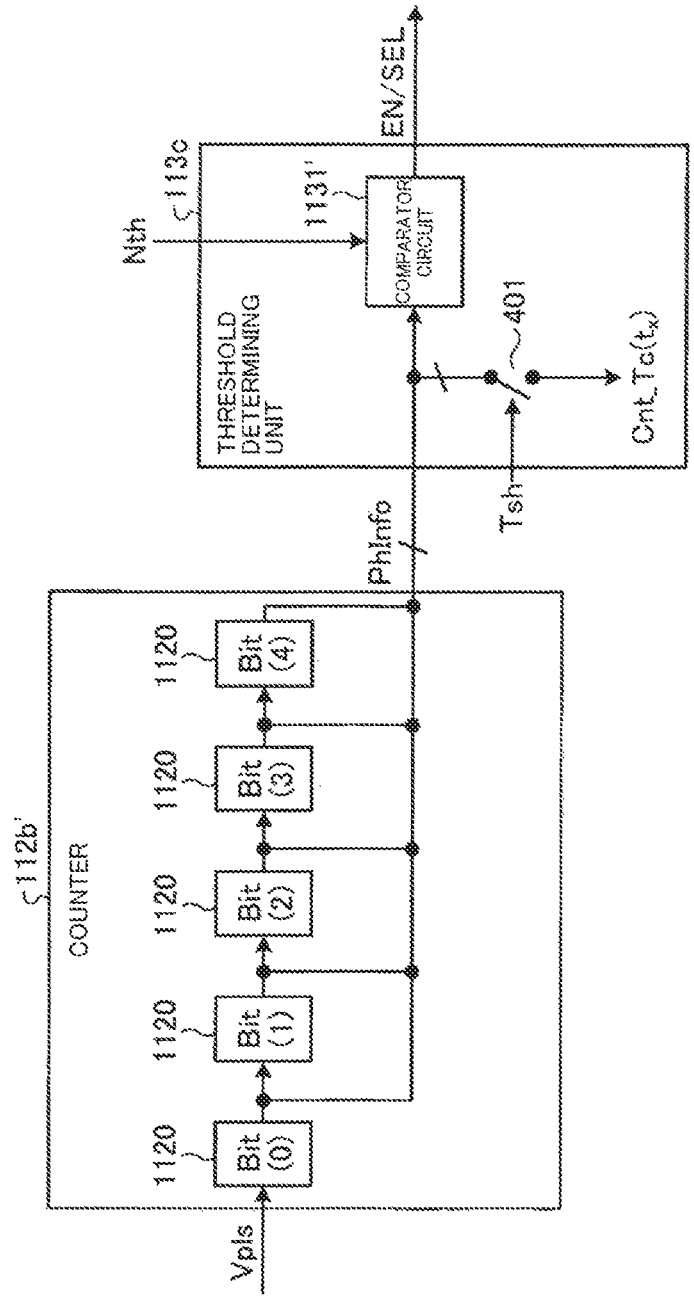
FIG. 68 is a block diagram showing an example configuration of a counter that is applicable to the fifth embodiment.

FIG. 68 is a block diagram showing an example configuration of the counter 112 and the threshold determining unit 113c that are applicable to the fifth embodiment. In this case, the counter 112b which has been described using FIG. 17 and which is capable of outputting a bit sequence is applied as the counter 112. Since a basic counting operation of the counter 112b is similar to that of the counter 112b having been described using FIG. 17, a description thereof will be omitted here.

The photon information PhInfo output from the counter 112 is input to the threshold determining unit 113c. The threshold determining unit 113c includes a comparator circuit 1131' and outputs the selector selection signal SEL and the enable signal EN. The comparator circuit 1131' compares the photon information PhInfo with the threshold Nth, and when a value indicated by the photon information PhInfo and the threshold Nth match each other, causes the selection signal SEL and the enable signal EN to respectively make a transition to the selection signal SEL(Nth) and the enable signal EN (Nth).

Of a switch 401 included in the threshold determining unit 113c, one end is connected to an input path along which a bit sequence is input from the counter 112 and another end is connected to the outside (for example, a vertical signal line). In this case, the vertical signal line is a signal line that is connected to respective pixel circuits 100e arranged in a column direction among the respective pixel circuits 100e arranged in a two-dimensional grid pattern in the pixel array unit 2001 and, for example, the vertical signal line is connected to the signal processing unit 2013c via a horizontal control unit 2013b.

The switch 401 is controlled to open and close by a signal indicating the exposure period Tsh. For example, the switch 401 is controlled by the signal to an open state within the exposure period Tsh and to a closed state from the open state at a timing where the exposure period Tsh ends. Accordingly, a count value (for example, the time code number Cnt_Tc($t_x$)) that is input to the threshold determining unit 113c from the counter 112 is output to the outside from the threshold determining unit 113c.

As described above, when a counted photon number reaches the threshold Nth, light-receiving apparatus 1d according to the fifth embodiment switches a counted object from the photon number to the time code Tc. In addition, the predicted count value Npre is obtained based on the time code number Cnt_Tc($t_x$) at the end time point of the exposure period Tsh. Therefore, a memory for storing the time code Tc can be omitted.

It should be noted that the light-receiving apparatus 1d obtains the time $t_x$ at which the photon number had reached the threshold Nth based on the time code number Cnt_Tc($t_x$) output from the threshold determining unit 113c. Therefore, the time code number Cnt_Tc($t_x$) is time information indicating the time required to reach the time $t_x$ at which the photon number had reached the threshold Nth and the threshold determining unit 113c functions as an acquiring unit that acquires the time information.

5-1. First Modification of Fifth Embodiment

Next, a first modification of the fifth embodiment will be described. The first modification of the fifth embodiment is an example in which a 1-bit counter is provided at one input terminal to which the pulse Vpls is input of the selector 400 according to the fifth embodiment. The counting unit 11 according to the first modification of the fifth embodiment will now be described using FIGS. 69A and 69B.

Figure 69A:
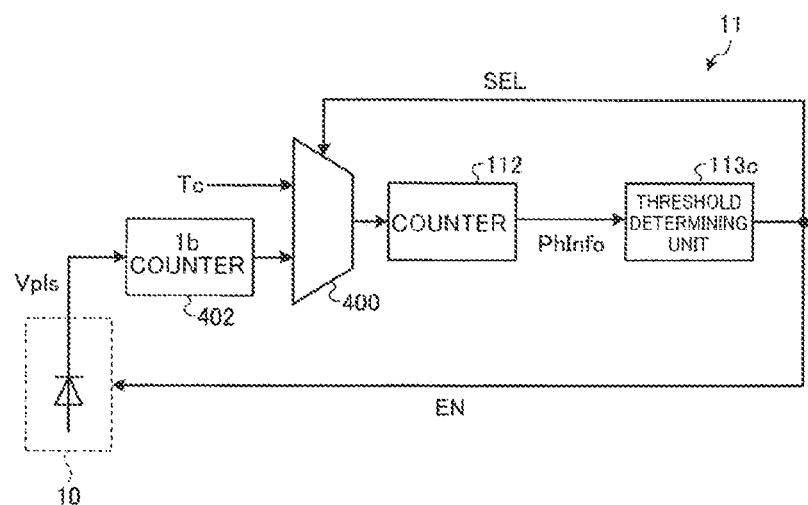
FIG. 69A is a block diagram schematically showing an example of a configuration of a counting unit according to a first modification of the fifth embodiment.

FIG. 69A is a block diagram schematically showing an example of a configuration of the counting unit 11 according to the first modification of the fifth embodiment. In the example shown in FIG. 69A, a 1-bit counter 402 (described as a 1b counter 402 in the drawing) is inserted between the pixel 10 and one input terminal of the selector 400 with respect to the configuration shown in FIG. 65. In this configuration, the pulse Vpls output from the pixel 10 is input to the 1-bit counter 402 and an output of the 1-bit counter 402 is input to one input terminal of the selector 400. The time code Tc is input to another input terminal of the selector 400.

Figure 69B:
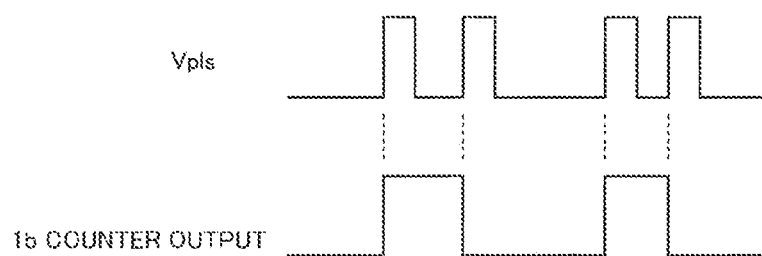
FIG. 69B is a sequence diagram showing an operation example of a 1-bit counter that is applicable to the first modification of the fifth embodiment.

In the example shown in FIG. 69A, the 1-bit counter 402 has a single input terminal and a state of an output signal is inverted every time an input signal that is input to the input terminal rises. FIG. 69B is a sequence diagram showing an operation example of a 1-bit counter that is applicable to the first modification of the fifth embodiment. In the example shown in FIG. 69B, for every rise of the pulse Vpls, an output (described as a 1b counter output in the drawing) of the 1-bit counter 402 transitions between a high state and a low state. In other words, the 1-bit counter 402 performs one count for every two pulses of the pulse Vpls. In addition, the output of the 1-bit counter 402 respectively indicates an even-number count value in a same state as an initial state and an odd-number count value in an inverted state with respect to the initial state. Therefore, a resolution of the count value of the pulse Vpls is the same as in a case where the 1-bit counter 402 is not used.

Such a 1-bit counter 402 can be constructed using, for example, a flip-flop circuit.

In this manner, by inputting an output of a count of the pulse Vpls by the 1-bit counter 402 to the counter 112, a counting operation of the pulse Vpls by the counter 112 can be reduced by ½ as compared to a case where the 1-bit counter 402 is not used and power consumption by the counter 112 can be reduced. In addition, a drop in resolution due to the use of the 1-bit counter 402 does not occur.

Since a prediction method according to the fifth embodiment having been described using FIG. 66 can be applied to the prediction of a photon number in the first modification of the fifth embodiment, a description thereof will be omitted here.

5-2. Second Modification of Fifth Embodiment

Next, a second modification of the fifth embodiment will be described. In the second modification of the fifth embodiment, a synthesized pulse SynPls obtained by synthesizing the pulse Vpls output from the pixel 10 and the time code Tc supplied from the time code generating unit 120 is counted by the counter 112. Here, as described earlier, a description will be given on the assumption that the time code Tc is a pulse for each update cycle. Since the number and an update cycle of the time codes Tc within the exposure period Tsh are known, the number of pulses Vpls within a count period can be obtained by subtracting the number of time codes Tc included in the count period from a count value obtained by the counter 112 by counting the synthesized pulse SynPls.

Figure 70:
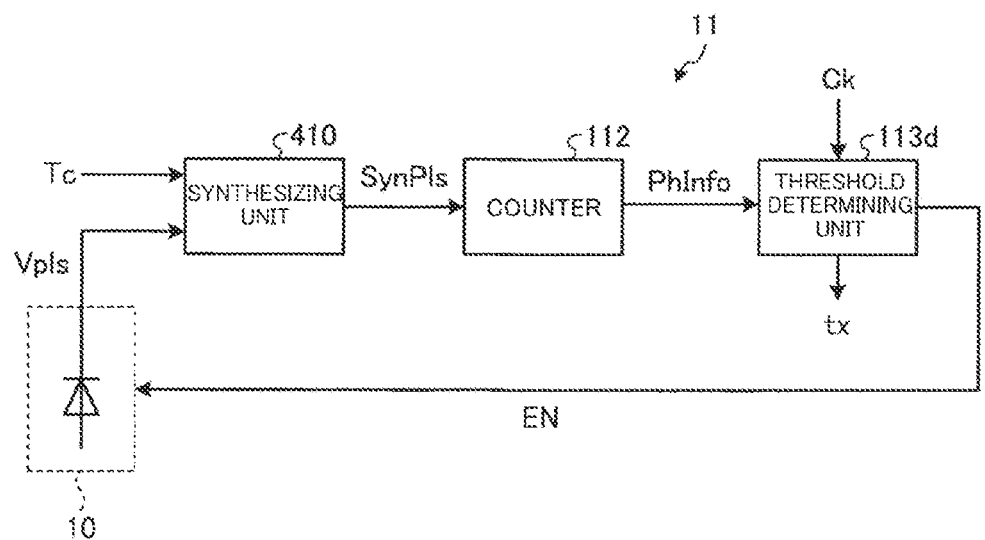
FIG. 70 is a block diagram schematically showing an example of a configuration of a counting unit according to a second modification of the fifth embodiment.

FIG. 70 is a block diagram schematically showing an example of a configuration of the counting unit 11 according to the second modification of the fifth embodiment. In FIG. 70, the counting unit 11 includes a synthesizing unit 410, a counter 112, and a threshold determining unit 113d. In this manner, unlike the fifth embodiment and the first modification of the fifth embodiment described above, the counting unit 11 according to the second embodiment of the fifth embodiment does not include the selector 400.

In addition, the threshold determining unit 113d according to the second modification of the fifth embodiment is supplied a clock Ck based on a reference clock and, at the same time, outputs an enable signal EN(Nth) when a count value that is counted by the counter 112 attains the threshold Nth. Furthermore, the threshold determining unit 113d outputs information indicating a time $t_x$ at which the count value had attained the threshold Nth. The information indicating the time $t_x$ can be expressed using, for example, the clock Ck based on the reference clock as a unit.

The pulse Vpls output from the pixel 10 and the time code Tc having been generated by the time code generating unit 120 are input to the synthesizing unit 410. The synthesizing unit 410 synthesizes the pulse Vpls and the time code Tc and outputs a synthesized pulse SynPls. The counter 112 counts the synthesized pulse SynPls and outputs the counted synthesized pulse number CntSp as photon information PhInfo.

The threshold determining unit 113d determines whether or not the photon information PhInfo or, in other words, the synthesized pulse number CntSp has reached the threshold Nth. When the threshold determining unit 113d determines that the synthesized pulse number CntSp has attained the threshold Nth, the threshold determining unit 113d outputs an enable signal EN(Nth) and stops an operation of the photoelectric conversion element 110. Furthermore, the threshold determining unit 113d outputs information indicating a time $t_x$ at which the synthesized pulse number CntSp had attained the threshold Nth. The information indicating the time $t_x$ is supplied from the threshold determining unit 113d to, for example, the signal processing unit 2013c.

Alternatively, the second modification of the fifth embodiment may be configured so that the pulse Vpls is input with respect to the synthesizing unit 410 via a 1-bit counter 402 having been described in the first modification of the fifth embodiment.

Figure 71:
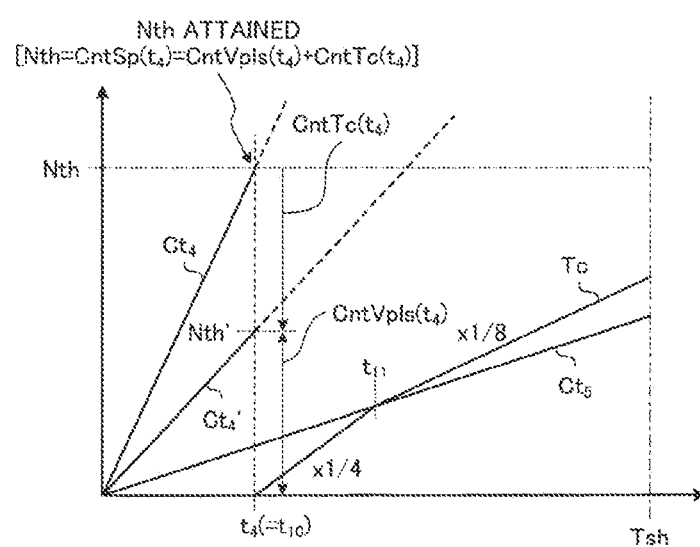
FIG. 71 is a diagram for explaining prediction of a photon number that is applicable to the second modification of the fifth embodiment.

FIG. 71 is a diagram for explaining prediction of a photon number that is applicable to the second modification of the fifth embodiment. Since the meanings of the respective parts shown in FIG. 71 are similar to those shown in FIG. 66 described above, descriptions thereof will be omitted here.

In FIG. 71, a straight line $Ct_4$ indicates a synthesized pulse number $CntSp(t_4)$ that had attained the threshold Nth at a time $t_4$. The synthesized pulse number $CntSp(t_4)$ includes a time code number $CntTc(t_4)$ which is a time code number up to the time t4 in addition to a pulse number $CntVpls(t_x)$ that represents the number of pulses Vpls. Therefore, in order to correctly predict the photon number, as indicated by an arrow in FIG. 71, the pulse number $CntVpls(t_x)$ must be obtained by subtracting the time code number $CntTc(t_4)$ from the synthesized pulse number $CntSp(t_4)$ or, in other words, the threshold Nth.

In the second modification of the fifth embodiment, in accordance with equation (17) below, a value Nth' obtained by subtracting the time code number $CntTc(t_x)$ from the synthesized pulse number $CntSp(t_x)$ having attained the threshold Nth is used as the threshold Nth in equation (1). In addition, the time $t_x$ is used as the time Tth in equation (1). Accordingly, the predicted count value Npre is obtained. It should be noted that the time t, indicates a time at which the synthesized pulse number CntSp had attained the threshold Nth within the exposure period Tsh.

$$Npre=Nth'\times(Tsh/t_x) \qquad (17)$$

In this case, the time code number $CntTc(t_x)$ at the time $t_x$ can be obtained by respective equations (18) to (20) below. In a similar manner to equations (14) to (16) described earlier, it is assumed that an update cycle of the time code Tc is that shown in FIG. 12 and that the time $t_x$ is measured in clock (denoted as Ck) units from the start time point of the exposure period Tsh. In equations (18) to (20). $Cnt(t_x)$ is information indicating the time $t_x$ and is assumed to be a counted number of the clock Ck at the time $t_x$. It should be noted that decimal points are subjected to truncation processing in the respective equations (18) to (20) below.

$$0[Ck]<Cnt(t_x)\leq 31[Ck]:CntTc(t_x)=Cnt(t_x)/2 \qquad (18)$$

$$31[Ck]<Cnt(t_x)\leq 63[Ck]:CntTc(t_x)=32[Ck]/2+(Cnt(t_x)-32[Ck])/4 \qquad (19)$$

$$63[Ck]<Cnt(t_x)\leq 127[Ck]:CntTc(t_x)=32[Ck]/2+32[Ck]/4+(Cnt(t_x)-64[Ck])/8 \qquad (20)$$

For example, the signal processing unit 2013c calculates the time code number $CntTc(t_x)$ using equations (18) to (20) described above based on the time $t_x$ supplied from the threshold determining unit 113d. Furthermore, the signal processing unit 2013c obtains the value Nth' by subtracting the time code number $CntTc(t_x)$ calculated as described above from the threshold Nth as shown in equation (21) below.

$$Nth'=Nth-CntTc(t_x) \qquad (21)$$

The signal processing unit 2013c obtains the predicted count value by applying the value Nth' obtained using equation (21) to equation (17) described earlier.

As described above, in the second modification of the fifth embodiment, the time code Tc itself need not be stored and, consequently, a memory into which the time code Tc is to be written can be omitted.

5-2-1. Output of Photoelectric Conversion Element

Next, a configuration example of the synthesizing unit 410 that is applicable to the second modification of the fifth embodiment will be described. The synthesizing unit 410 according to the second modification of the fifth embodiment can be constructed using a logic circuit.

Figure 72A:
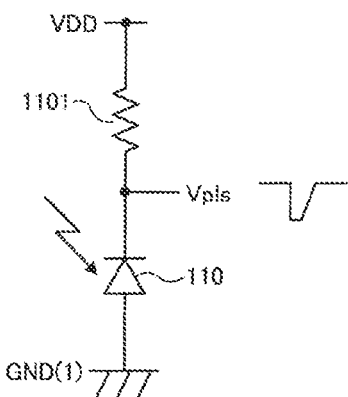
FIG. 72A is a diagram for explaining a connection method of a photoelectric conversion element that outputs a negative pulse.
Figure 72B:
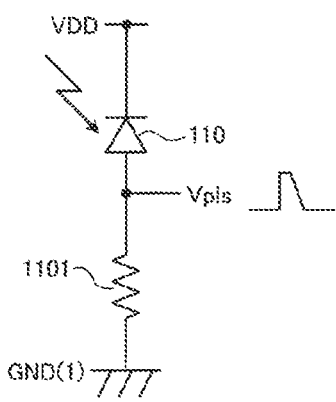
FIG. 72B is a diagram for explaining a connection method of a photoelectric conversion element that outputs a positive pulse.

In this case, the pixel 10 outputs the pulse Vpls constituted by any of a positive pulse and a negative pulse depending on a connection method of the photoelectric conversion element 110 that is included in the pixel 10. FIGS. 72A and 72B are diagrams for explaining a connection method of the photoelectric conversion element 110 that outputs the pulse Vpls as a positive pulse and a negative pulse. It should be noted that FIGS. 72A and 72B focus on a connection of the photoelectric conversion element 110 and a resistor 1101 for a quenching operation and a description of the signal processing unit 111a is omitted.

FIG. 72A is a diagram that corresponds to FIG. 9 described earlier and shows an example of a connection method of the photoelectric conversion element 110 that outputs the pulse Vpls as a negative pulse. As shown in FIG. 72A, a cathode of the photoelectric conversion element 110 is connected to the power supply potential VDD via the resistor 1101, and an anode of the photoelectric conversion element 110 is connected to, for example, a potential GND (1) that is a ground potential. By extracting an output from a connection point between the cathode of the photoelectric conversion element 110 and the resistor 1101, the pulse Vpls as a negative pulse of which a pulse portion is in a low state and a non-pulse portion is in a high state is output.

On the other hand, FIG. 72B shows an example of a connection method of the photoelectric conversion element 110 that outputs the pulse Vpls as a positive pulse. As shown in FIG. 72B, by extracting an output from a connection point between an anode of the photoelectric conversion element 110, of which a cathode is connected to the power supply potential VDD and the anode is connected to, for example, a potential GND(1) that is a ground potential via the resistor 1101, and the resistor 1101, the pulse Vpls as a positive pulse of which a pulse portion is in a high state and a non-pulse portion is in a low state is output.

It should be noted that the time code Tc is generated by the time code generating unit 120 that is outside of the pixel 10. Therefore, whether the time code Tc is to be generated using a positive pulse or a negative source can be selected by a design of the time code generating unit 120.

5-2-2. First Example of Configuration of Synthesizing Unit

Figure 73A:
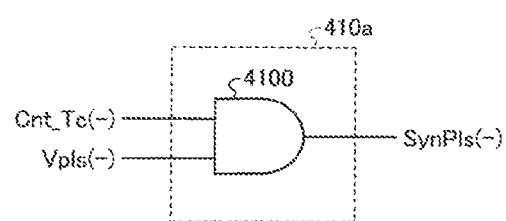
FIG. 73A is a diagram for explaining a first example of a configuration of a synthesizing unit that is applicable to the second modification of the fifth embodiment.
Figure 73B:
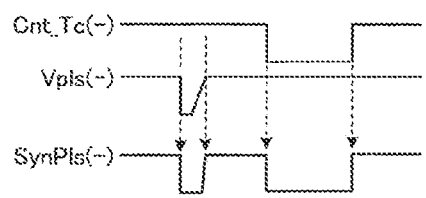
FIG. 73B is a diagram for explaining the first example of a configuration of the synthesizing unit that is applicable to the second modification of the fifth embodiment.

FIGS. 73A and 73B are diagrams for explaining a first example of a configuration of the synthesizing unit 410 that is applicable to the second modification of the fifth embodiment. In FIGS. 73A and 73B and in similar subsequent drawings, a sign (+) added to each signal indicates that the signal is a signal created by a positive pulse and a sign (−) added to each signal indicates that the signal is a signal created by a negative pulse.

As shown in FIG. 73A, a synthesizing unit 410a according to the first example is constructed using an AND circuit 4100. A time code Tc(−) created by a negative pulse is input to one input terminal of the AND circuit 4100 and a pulse Vpls(−) created by a negative pulse is input to another input terminal of the AND circuit 4100. As shown in FIG. 73B, the AND circuit 4100 outputs a synthesized pulse SynPls(−) which becomes a negative pulse in a period where non-pulse portions of the time code Tc(−) and the pulse Vpls(−) match each other. The counter 112 counts this negative pulse.

5-2-3. Second Example of Configuration of Synthesizing Unit

Figure 74A:
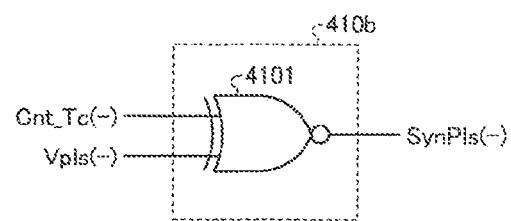
FIG. 74A is a diagram for explaining a second example of a configuration of the synthesizing unit that is applicable to the second modification of the fifth embodiment.
Figure 74B:
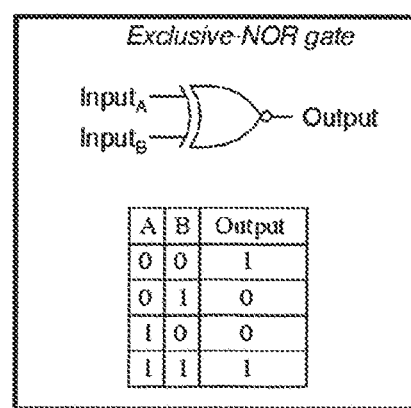
FIG. 74B is a diagram for explaining the second example of a configuration of the synthesizing unit that is applicable to the second modification of the fifth embodiment.

FIGS. 74A and 74B are diagrams for explaining a second example of a configuration of the synthesizing unit 410 that is applicable to the second modification of the fifth embodiment. As shown in FIG. 74A, a synthesizing unit 410b according to the second example is constructed using an XNOR (eXclusive NOR) circuit 4101. FIG. 74B represents a truth value table of the XNOR circuit 4101. As shown in FIG. 74B, an output of the XNOR circuit 4101 becomes "1" when input values of two inputs $Input_A$ and $Input_B$ match each other and becomes "0" when input values of the two inputs $Input_A$ and $Input_B$ do not match each other.

The time code Tc(−) is input to one of the inputs $Input_A$ and $Input_B$ of the XNOR circuit 4101 and the pulse Vpls(−) is input to the other. Accordingly, the synthesizing unit 410b is capable of obtaining the synthesized pulse SynPls(−) created by a negative pulse that is more or less similar to that obtained by the synthesizing unit 410a using the AND circuit 4100 according to the first example having been described using FIGS. 73A and 73B.

5-2-4. Third Example of Configuration of Synthesizing Unit

Figure 75A:
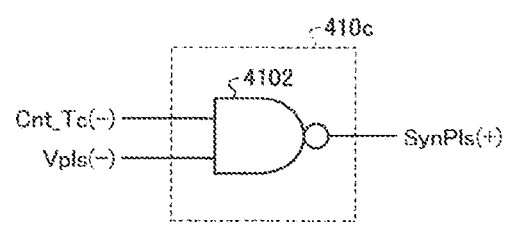
FIG. 75A is a diagram for explaining a third example of a configuration of the synthesizing unit that is applicable to the second modification of the fifth embodiment.
Figure 75B:
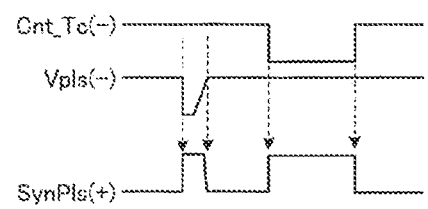
FIG. 75B is a diagram for explaining the third example of a configuration of the synthesizing unit that is applicable to the second modification of the fifth embodiment.

FIGS. 75A and 75B are diagrams for explaining a third example of a configuration of the synthesizing unit 410 that is applicable to the second modification of the fifth embodiment. As shown in FIG. 75A, a synthesizing unit 410c according to the third example is constructed using a NAND circuit 4102. A time code Tc (−) created by a negative pulse is input to one input terminal of the NAND circuit 4102 and a pulse Vpls (−) created by a negative pulse is input to another input terminal of the NAND circuit 4102. As shown in FIG. 75B, the NAND circuit 4102 outputs a synthesized pulse SynPls(+) which becomes a positive pulse in a period where a non-pulse portion and a pulse portion overlap with each other between the time code Tc(−) and the pulse Vpls(−). The counter 112 counts this positive pulse.

5-2-5. Fourth Example of Configuration of Synthesizing Unit

Figure 76A:
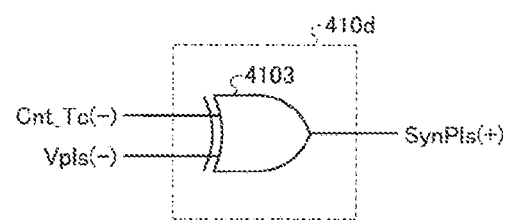
FIG. 76A is a diagram for explaining a fourth example of a configuration of the synthesizing unit that is applicable to the second modification of the fifth embodiment.
Figure 76B:
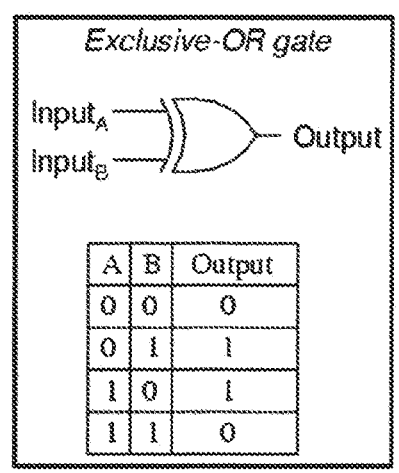
FIG. 76B is a diagram for explaining the fourth example of a configuration of the synthesizing unit that is applicable to the second modification of the fifth embodiment.

FIGS. 76A and 76B are diagrams for explaining a fourth example of a configuration of the synthesizing unit 410 that is applicable to the second modification of the fifth embodiment. As shown in FIG. 76A, a synthesizing unit 410d according to the fourth example is constructed using an XOR (eXclusive OR) circuit 4103. FIG. 76B represents a truth value table of the XOR circuit 4103. As shown in FIG. 76B, an output Output of the XOR circuit 4103 becomes "0" when input values of two inputs $Input_A$ and $Input_B$ match each other and becomes "1" when input values of the two inputs $Input_A$ and $Input_B$ do not match each other.

The time code Tc(−) is input to one of the inputs $Input_A$ and Inputs of the XOR circuit 4103 and the pulse Vpls(−) is input to the other. Accordingly, the synthesizing unit 410d is capable of obtaining the synthesized pulse SynPls(+) created by a positive pulse that is more or less similar to that obtained by the synthesizing unit 410c using the NAND circuit 4102 according to the third example having been described using FIGS. 75A and 75B.

5-2-6. Fifth Example of Configuration of Synthesizing Unit

Figure 77A:
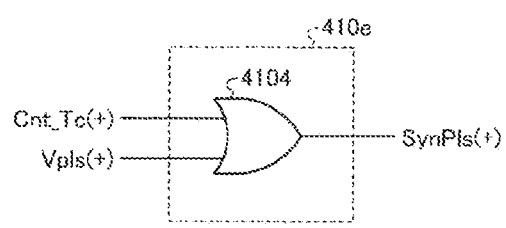
FIG. 77A is a diagram for explaining a fifth example of a configuration of the synthesizing unit that is applicable to the second modification of the fifth embodiment.
Figure 77B:
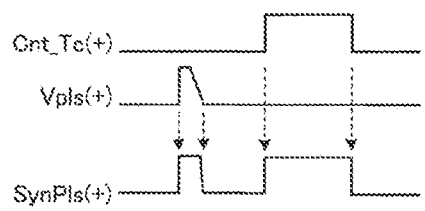
FIG. 77B is a diagram for explaining the fifth example of a configuration of the synthesizing unit that is applicable to the second modification of the fifth embodiment.

FIGS. 77A and 77B are diagrams for explaining a fifth example of a configuration of the synthesizing unit 410 that is applicable to the second modification of the fifth embodiment. As shown in FIG. 77A, a synthesizing unit 410e according to the fifth example is constructed using an OR circuit 4104. A time code Tc (+) created by a positive pulse is input to one input terminal of the OR circuit 4104 and a pulse Vpls (+) created by a positive pulse is input to another input terminal of the OR circuit 4104. As shown in FIG. 77B, the OR circuit 4104 outputs a synthesized pulse SynPls(+) which becomes a positive pulse in a period where at least one of the time code Tc(+) and the pulse Vpls(+) becomes a positive pulse. The counter 112 counts this positive pulse.

5-2-7. Sixth Example of Configuration of Synthesizing Unit

Figure 78:
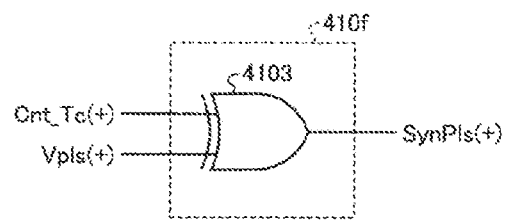
FIG. 78 is a diagram for explaining a sixth example of a configuration of the synthesizing unit that is applicable to the second modification of the fifth embodiment.

FIG. 78 is a diagram for explaining a sixth example of a configuration of the synthesizing unit 410 that is applicable to the second modification of the fifth embodiment. As shown in FIG. 78, a synthesizing unit 410f according to the sixth example is constructed using an XOR circuit 4103. In the synthesizing unit 410f, the time code Tc(+) is input to one of the inputs Input$_A$ and Inputs of the XOR circuit 4103 and the pulse Vpls(+) is input to the other. Accordingly, the synthesizing unit 410f is capable of obtaining the synthesized pulse SynPls(+) created by a positive pulse that is more or less similar to that obtained by the synthesizing unit 410e using the OR circuit 4104 according to the fifth example having been described using FIGS. 77A and 77B.

5-2-8. Seventh Example of Configuration of Synthesizing Unit

Figure 79A:
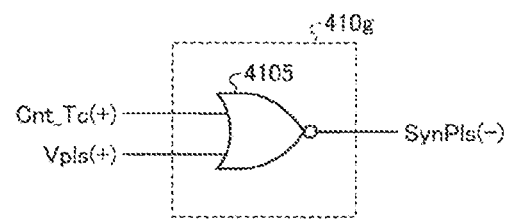
FIG. 79A is a diagram for explaining a seventh example of a configuration of the synthesizing unit that is applicable to the second modification of the fifth embodiment.
Figure 79B:
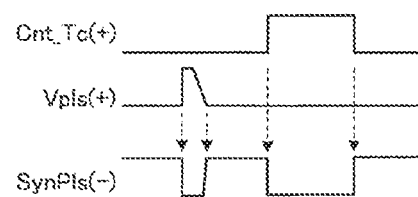
FIG. 79B is a diagram for explaining the seventh example of a configuration of the synthesizing unit that is applicable to the second modification of the fifth embodiment.

FIGS. 79A and 79B are diagrams for explaining a seventh example of a configuration of the synthesizing unit 410 that is applicable to the second modification of the fifth embodiment. As shown in FIG. 79A, a synthesizing unit 410g according to the seventh example is constructed using a NOR circuit 4105. A time code Tc (+) created by a positive pulse is input to one input terminal of the NOR circuit 4105 and a pulse Vpls (+) created by a positive pulse is input to another input terminal of the MOR circuit 4105. As shown in FIG. 79B, the NOR circuit 4105 outputs a synthesized pulse SynPls(−) which becomes a negative pulse in a period where at least one of the time code Tc(+) and the pulse Vpls(+) becomes a positive pulse. The counter 112 counts this negative pulse.

5-2-9. Eighth Example of Configuration of Synthesizing Unit

Figure 80:
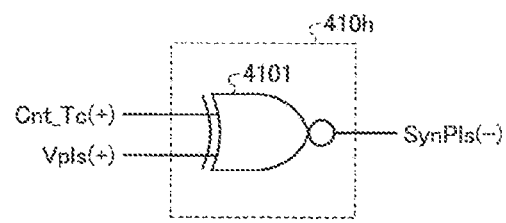
FIG. 80 is a diagram for explaining an eighth example of a configuration of the synthesizing unit that is applicable to the second modification of the fifth embodiment.

FIG. 80 is a diagram for explaining an eighth example of a configuration of the synthesizing unit 410 that is applicable to the second modification of the fifth embodiment. As shown in FIG. 80, a synthesizing unit 410h according to the eighth example is constructed using an XNOR circuit 4101. In the synthesizing unit 410h, the time code Tc(+) is input to one of the inputs Input$_A$ and Input$_B$ of the XNOR circuit 4101 and the pulse Vpls(+) is input to the other. Accordingly, the synthesizing unit 410h is capable of obtaining the synthesized pulse SynPls(−) created by a negative pulse that is more or less similar to that obtained by the synthesizing unit 410g using the NOR circuit 4105 according to the seventh example having been described using FIGS. 79A and 79B.

As described above, in the second modification of the fifth embodiment, a predicted count value is obtained based on a synthesized pulse SynPls obtained by synthesizing the time code Tc and the pulse Vpls using the synthesizing unit 410 that is constituted by a logic circuit. Therefore, the counting unit 11 according to the second modification of the fifth embodiment enables the selector 400 that is included in the counting unit 11 in the fifth embodiment and the first modification of the fifth embodiment described above to be omitted and is capable of reducing circuit area.

6. Sixth Embodiment

Next, a sixth embodiment of the present disclosure will be described. The sixth embodiment is an example of a case where the respective light-receiving apparatuses 1a to 1d according to the first to fourth embodiments described earlier are applied to an apparatus (a ranging apparatus) for measuring distance.

Figure 81:
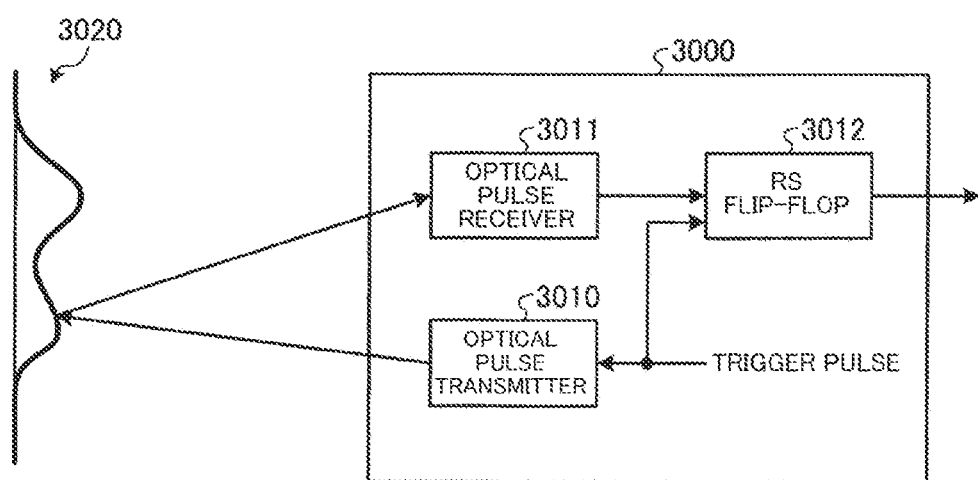
FIG. 81 is a block diagram showing an example configuration of a ranging apparatus according to a sixth embodiment.

FIG. 81 is a block diagram showing an example configuration of a ranging apparatus according to the sixth embodiment. In FIG. 81, a ranging apparatus 3000 includes an optical pulse transmitter 3010, an optical pulse receiver 3011, and an RS flip-flop 3012.

A description will now be given using, as an example, a case where a ToF (Time of Flight) method is used as a method of measuring distance. A ToF sensor measures a distance to an object 3020 by measuring a time taken by light having been emitted from a position in proximity to the ToF sensor so as to irradiate the object 3020 to bounce off the object 3020 and return to the position of emission.

Figure 82:
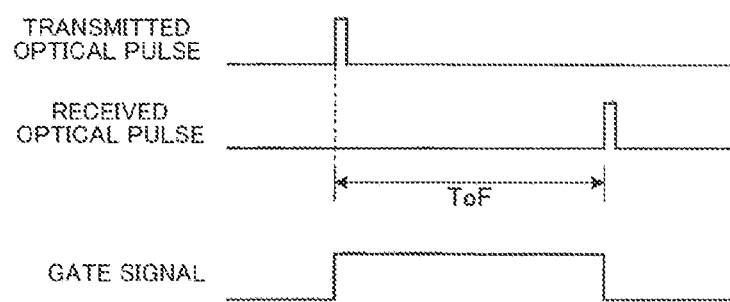
FIG. 82 is a timing chart showing example operation timings of a ToF sensor that is applicable to the sixth embodiment.

FIG. 82 is a timing chart showing example operation timings of a ToF sensor that is applicable to the sixth embodiment. An operation of the ranging apparatus 3000 will now be described with reference to FIG. 82.

The optical pulse transmitter 3010 emits light (optical transmission pulse) based on a supplied trigger pulse. The optical pulse receiver 3011 receives reflected light that is the emitted light having been irradiated toward the object 3020 and reflected by the object 3020. Any of the light-receiving apparatuses 1a, 1b, and 1c described earlier can be applied as the optical pulse receiver 3011. Here, for convenience's sake, a description will be given on the assumption that the light-receiving apparatus 1a is applied as the optical pulse receiver 3011.

A difference between a time of day of emission of a transmitted optical pulse and a time of day of reception of a received optical pulse corresponds to a time in accordance with a distance to an object or, in other words, a time of flight ToF of light.

A trigger pulse is supplied to the optical pulse transmitter 3010 and the RS flip-flop 3012. Supplying of the trigger pulse to the optical pulse transmitter 3010 causes an optical pulse to be transmitted for a short period of time. In addition, the RS flip-flop 3012 is reset by the trigger pulse.

When the light-receiving apparatus 1a is applied to the optical pulse receiver 3011, when a received optical pulse is received by (incident to) the photoelectric conversion element 110 included in the light-receiving apparatus 1a, a photon is generated in the photoelectric conversion element 110. The RS flip-flop 3012 is reset by, for example, the pulse Vpls based on the generated photon.

Due to such an operation, a gate signal having a pulse width that corresponds to the time of flight ToF of light can be generated in the RS flip-flop 3012. The time of flight ToF of light can be calculated by counting the generated gate signal using a clock signal or the like. The calculated time of flight ToF of light is output from the ranging apparatus 300 as a digital signal of distance information that indicates a distance.

7. Seventh Embodiment

Figure 83:
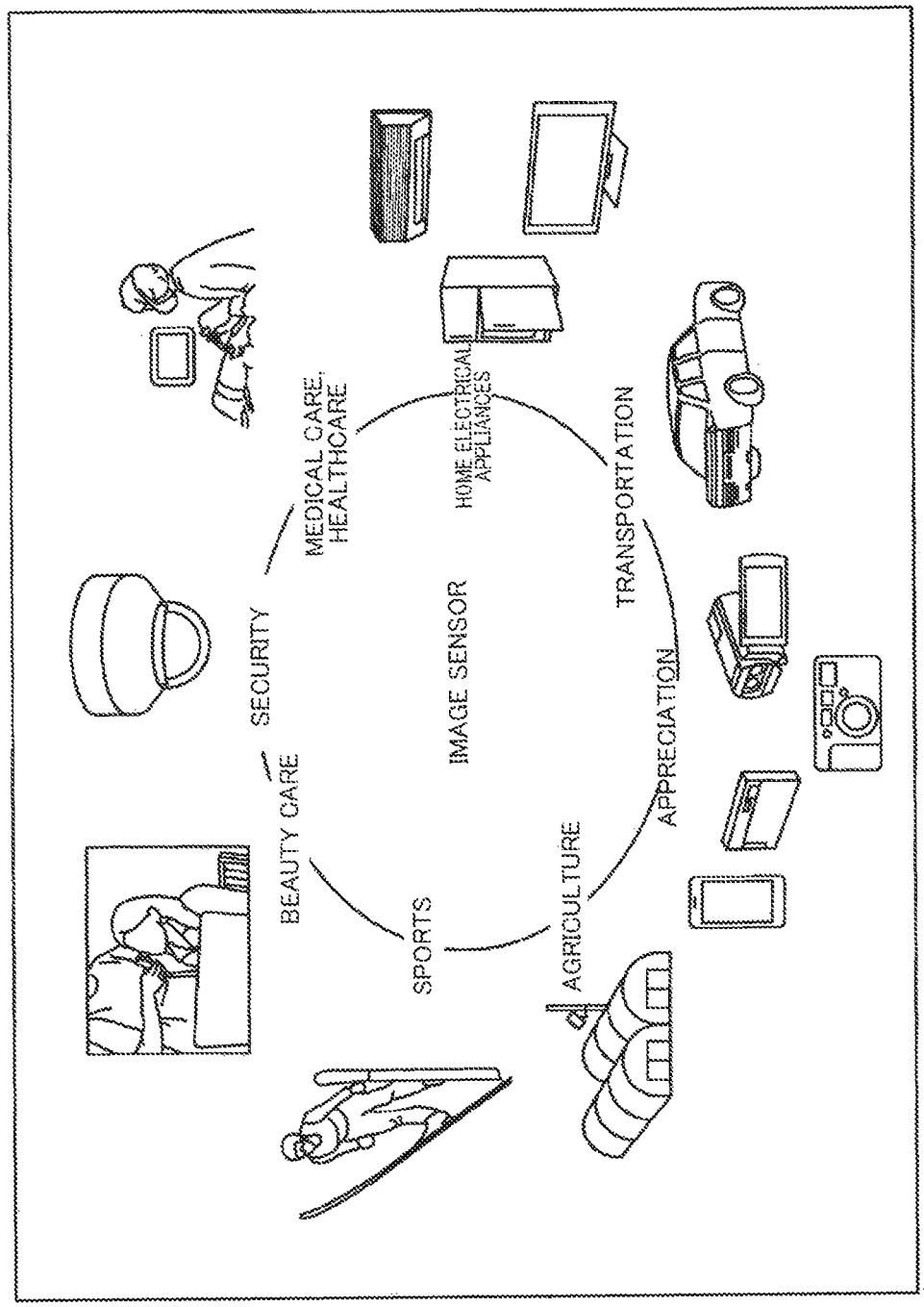
FIG. 83 is a diagram showing usage examples of using, according to a seventh embodiment, light-receiving apparatuses according to the first to fifth embodiments and respective modifications thereof.

Next, as a seventh embodiment of the present disclosure, an application example of the light-receiving apparatuses according to the first to fourth embodiments of the present disclosure and respective modifications thereof will be described. FIG. 83 is a diagram showing usage examples of using, according to a seventh embodiment, light-receiving apparatuses 1a, 1b, and 1c according to the first to fourth embodiments and respective modifications thereof described earlier.

For example, as described below, the light-receiving apparatuses 1a, 1b, and 1c described earlier can be used in various cases where sensing of light such as visible light, infrared light, ultraviolet light, or X-rays is performed.

- Apparatuses for photographing images to be used for applications for appreciation such as a digital camera and a mobile device with a camera function
- Apparatuses for applications in transportation such as a vehicle-mounted sensor that photographs the front, the rear, a periphery, an interior, or the like of an automobile for purposes of safe driving including automatic braking and recognition of a state of a driver, a monitoring camera that monitors traveling vehicles or a road, and a ranging sensor that measures distances between vehicles and the like.
- Apparatuses to be used in home electrical appliances such as a TV, a refrigerator, and an air conditioner which photograph a gesture made by a user and perform device operation in accordance with the gesture
- Apparatuses for applications in medical care and healthcare such as an endoscope and an apparatus that performs angiography by receiving infrared light
- Apparatuses for applications in security such as a surveillance camera for crime-prevention applications and a camera for person authentication applications
- Apparatuses for applications in beauty care such as a skin measuring device that photographs skin and a microscope that photographs the scalp
- Apparatuses for applications in sports such as an action camera or a wearable camera for sports applications
- Apparatuses for applications in agriculture such as a camera for monitoring a state of a field or crops Further Application Example of Technique According to Present Disclosure Application Example to Mobile Body The technique according to the present disclosure may be further applied with respect to an apparatus to be mounted to any of various types of mobile bodies including an automobile, an electric vehicle, a hybrid electric vehicle, a motorcycle, a bicycle, personal mobility, an airplane, a drone, an ocean vessel, and a robot.

Figure 84:
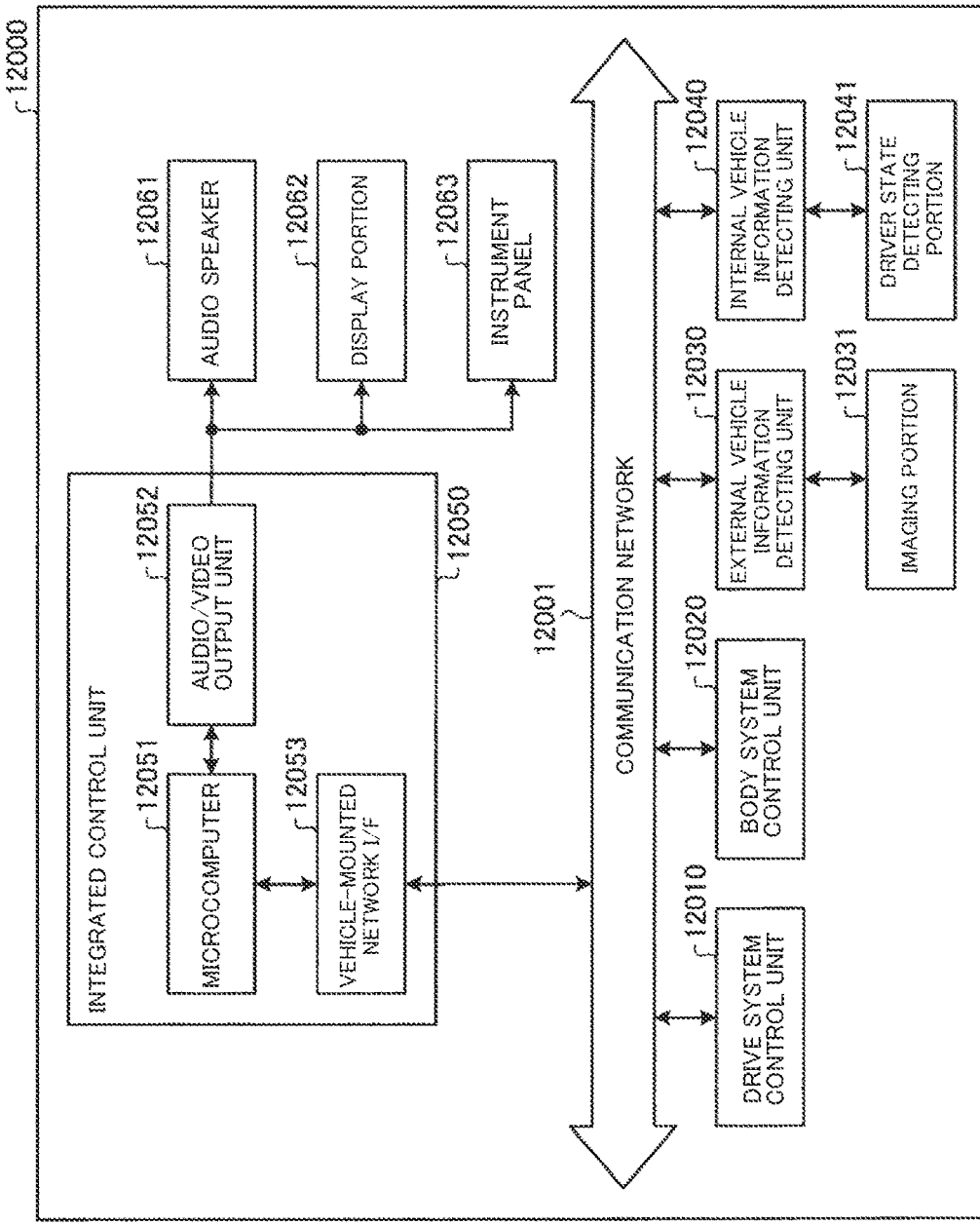
FIG. 84 is a block diagram showing a schematic configuration example of a vehicle control system that represents an example of a mobile body control system to which the technique according to the present disclosure may be applied.

FIG. 84 is a block diagram showing a schematic configuration example of a vehicle control system that represents an example of a mobile body control system to which the technique according to the present disclosure may be applied.

The vehicle control system 12000 includes a plurality of electronic control units that are connected via a communication network 12001. In the example shown in FIG. 84, the vehicle control system 12000 includes a drive system control unit 12010, a body system control unit 12020, an external vehicle information detecting unit 12030, an internal vehicle information detecting unit 12040, and an integrated control unit 12050. In addition, as functional components of the integrated control unit 12050, a microcomputer 12051, an audio/video output portion 12052, and a vehicle-mounted network I/F (interface) 12053 are illustrated.

The drive system control unit 12010 controls operations of apparatuses related to a drive system of a vehicle in accordance with various programs. For example, the drive system control unit 12010 functions as a control apparatus of a drive force generation apparatus for generating a drive force of the vehicle such as an internal engine or a drive motor, a control apparatus of a drive force transmission mechanism for transmitting the drive force to wheels, a control apparatus of a steering mechanism for adjusting a steering angle of the vehicle, and a control apparatus of a braking apparatus that generates a brake force of the vehicle.

The body system control unit 12020 controls operations of various apparatuses mounted to the vehicle body in accordance with various programs. For example, the body system control unit 12020 functions as a control apparatus of a key-less entry system, a smart key system, a power window apparatus, or various lamps such as head lamps, tail lamps, brake lamps, turn indicators, and fog lamps. In this case, radio waves or signals of various switches which are transmitted from a portable device that substitutes as a key may be input to the body system control unit 12020. The body system control unit 12020 accepts input of the radio waves or signals and controls a door lock apparatus, the power window apparatus, the lamps, and the like of the vehicle.

The external vehicle information detecting unit 12030 detects information on an exterior of the vehicle that is mounted with the vehicle control system 12000. For example, an imaging portion 12031 is connected to the external vehicle information detecting unit 12030. The external vehicle information detecting unit 12030 causes the imaging portion 12031 to capture an image of the exterior of the vehicle and receives the captured image. Based on the received image, the external vehicle information detecting unit 12030 may perform object detection processing or distance detection processing with respect to people, vehicles, obstacles, signs, letters on road surfaces, and the like. For example, the external vehicle information detecting unit 12030 applies image processing on a received image and performs object detection processing and distance detection processing based on a result of the image processing.

The imaging portion 12031 is a light sensor which receives light and which outputs an electric signal in accordance with an amount of the received light. The imaging portion 12031 can output the electric signal as an image or as ranging information. In addition, the light received by the imaging portion 12031 may be visible light or invisible light such as infrared light.

The internal vehicle information detecting unit 12040 detects information on an interior of the vehicle. For example, a driver state detecting portion 12041 that detects a state of a driver is connected to the internal vehicle information detecting unit 12040. For example, the driver state detecting portion 12041 includes a camera for capturing an image of the driver and, based on detection information that is input from the driver state detecting portion 12041, the internal vehicle information detecting unit 12040 may calculate a degree of fatigue or a degree of concentration of the driver or may determine whether or not the driver has fallen asleep.

Based on information on the exterior or the interior of the vehicle acquired by the external vehicle information detecting unit 12030 or the internal vehicle information detecting unit 12040, the microcomputer 12051 can calculate a control target value of the drive force generation apparatus, the steering mechanism, or the brake apparatus and output a control command to the drive system control unit 12010. For example, the microcomputer 12051 can perform cooperative control for the purpose of realizing functions of an ADAS (Advanced Driver Assistance System) including collision avoidance or crash mitigation of the vehicle, headway control based on an inter-vehicular distance, cruise control, a collision warning of the vehicle, and a lane departure warning of the vehicle.

In addition, by controlling the drive force generation apparatus, the steering mechanism, the brake apparatus, or the like based on information on a periphery of the vehicle acquired by the external vehicle information detecting unit 12030 or the internal vehicle information detecting unit 12040, the microcomputer 12051 can perform cooperative control for the purpose of automated driving or the like that enables the vehicle to travel autonomously without having to rely on operations by the driver.

Furthermore, based on information on the exterior of the vehicle acquired by the external vehicle information detecting unit 12030, the microcomputer 12051 can output a control command to the body system control unit 12020. For example, the microcomputer 12051 can perform cooperative control for the purpose of controlling the head lamps in accordance with a position of a vehicle ahead or an oncoming vehicle as detected by the external vehicle information detecting unit 12030 and realizing antidazzle by switching a high beam to a low beam or the like.

The audio/video output portion 12052 transmits an output signal of at least one of sound and an image to an output apparatus that is capable of audibly or visually notifying a passenger of the vehicle or the outside of the vehicle with information. In an example shown in FIG. 84, an audio speaker 12061, a display portion 12062, and an instrument panel 12063 are exemplified as output apparatuses. For example, the display portion 12062 may include at least one of an on-board display and a head-up display.

Figure 85:
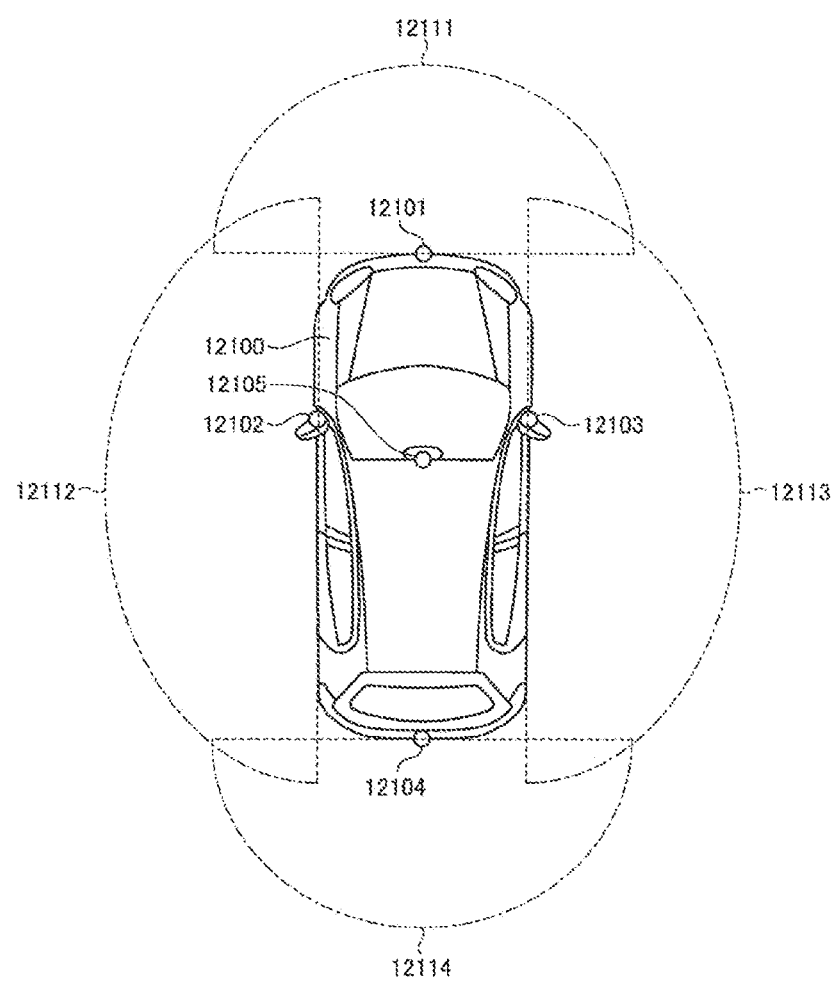
FIG. 85 is a diagram showing an example of an installation position of an imaging portion.

FIG. 85 is a diagram showing an example of an installation position of the imaging portion 12031. In FIG. 85, as the imaging portion 12031, a vehicle 12100 has imaging portions 12101, 12102, 12103, 12104, and 12105.

For example, the imaging portions 12101, 12102, 12103, 12104, and 12105 are provided at positions such as a front nose, side mirrors, a rear bumper, a rear door, and an upper part of a front glass inside a cabin of the vehicle 12100. The imaging portion 12101 that is provided on the front nose and the imaging portion 12105 that is provided in the upper part of the front glass inside the cabin mainly acquire an image of the front of the vehicle 12100. The imaging portions 12102 and 12103 that are provided on the side mirrors mainly acquire an image of the sides of the vehicle 12100. The imaging portion 12104 that is provided on the rear bumper or the rear door mainly acquires an image of the rear of the vehicle 12100. The front image that is acquired by the imaging portions 12101 and 12105 is mainly used to detect vehicles ahead, pedestrians, obstacles, traffic lights, traffic signs, lanes, and the like.

FIG. 85 shows an example of photographic ranges of the imaging portions 12101 to 12104. An imaging range 12111 represents an imaging range of the imaging portion 12101 that is provided on the front nose, imaging ranges 12112 and 12113 respectively represent imaging ranges of the imaging portions 12102 and 12103 that are provided on the side mirrors, and an imaging range 12114 represents an imaging range of the imaging portion 12104 that is provided on the rear bumper or the rear door. For example, by superimposing image data captured by the imaging portions 12101 to 12104, a bird's-eye view image of the vehicle 12100 as viewed from above is obtained.

At least one of the imaging portions 12101 to 12104 may have a function of acquiring distance information. For example, at least one of the imaging portions 12101 to 12104 may be a stereo camera constituted by a plurality of imaging elements or an imaging element having pixels for phase difference detection.

For example, by obtaining a distance to each solid object in the imaging ranges 12111 to 12114 and a temporal variation of the distance (a relative speed with respect to the vehicle 12100) based on the distance information obtained from the imaging portions 12101 to 12104, particularly, the microcomputer 12051 can extract, as a vehicle ahead, a solid object which is closest to the vehicle 12100 on a path of the vehicle 12100 and which is traveling at a predetermined speed (for example, 0 km/h or higher) in approximately the same direction as the vehicle 12100. In addition, the microcomputer 12051 can set an inter-vehicular distance to be secured in advance behind a vehicle ahead and perform automatic brake control (including cruise stop control), automatic acceleration control (including cruise start control), and the like. As described above, cooperative control for the purpose of automated driving or the like that enables autonomous travel without having to rely on operations by the driver can be performed.

For example, based on the distance information obtained from the imaging portions 12101 to 12104, the microcomputer 12051 can extract solid object data related to solid objects by classifying the solid objects into motorcycles, ordinary vehicles, large vehicles, pedestrians, utility poles, and other solid objects and use the solid object data for automatic obstacle avoidance. For example, the microcomputer 12051 distinguishes obstacles around the vehicle 12100 between obstacles that are visible from the driver of the vehicle 12100 and obstacles that are hardly visible. In addition, the microcomputer 12051 can perform driving support for collision avoidance by determining a collision risk that indicates a degree of danger of a collision with each obstacle, and in a situation where the collision risk is equal to or higher than a set value and where there is a possibility of a collision, issuing a warning to the driver via the audio speaker 12061 or the display portion 12062 or performing forced braking or evasive steering via the drive system control unit 12010.

At least one of the imaging portions 12101 to 12104 may be an infrared camera that detects infrared light. For example, the microcomputer 12051 can recognize a pedestrian by determining whether or not a pedestrian is present in a captured image of the imaging portions 12101 to 12104. The recognition of a pedestrian is performed by a step of extracting a feature point in a captured image of the imaging portions 12101 to 12104 as an infrared camera and a step of performing pattern matching on a series of feature points indicating a contour of an object to determine whether or not the object is a pedestrian. When the microcomputer 12051 determines that a pedestrian is present in a captured image of the imaging portions 12101 to 12104 and recognizes the pedestrian, the audio/video output portion 12052 controls the display portion 12062 so that a rectangular contour line for highlighting is superimposed and displayed on the recognized pedestrian. In addition, the audio/video output portion 12052 may control the display portion 12062 so that an icon or the like which represents a pedestrian is displayed at a desired position.

This concludes the description of an example of a vehicle control system to which the technique according to the present disclosure may be applied. The technique according to the present disclosure may be applied to, for example, the imaging portion 12031 among the configuration described above. Specifically, the light-receiving apparatuses 1*a* to 1*c* according to the first to fourth embodiments and the respective modifications of the present disclosure described earlier can be applied to the imaging portion 12031. Applying the technique according to the present disclosure to the imaging portion 12031 enables ranging from a traveling vehicle to be executed with higher accuracy.

The advantageous effects described in the present specification are merely exemplary and are not restrictive, and other advantageous effects may be produced.

The present technique can also be configured as follows.

(1)

A light-receiving apparatus, including:

a counting unit configured to measure a detection number of times that represents the number of times incidence of a photon to a light-receiving element has been detected within an exposure period and to output a counted value;

a setting unit configured to set a cycle of updating time information in accordance with an elapsed time during the exposure period; and an acquiring unit configured to acquire the time information indicating a time at which the counted value reaches a threshold before the exposure period elapses.

(2)

The light-receiving apparatus according to (1) described above, wherein the setting unit is configured to start setting the cycle at a time point where a prescribed time has elapsed from a start time of the exposure period and set the cycle at the time point to a shortest cycle within the exposure period.

(3)

The light-receiving apparatus according to (1) or (2) described above, wherein the setting unit is configured to output a code that changes in accordance with the cycle as the time information.

(4)

The light-receiving apparatus according to any one of (1) to (3) described above, wherein the acquiring unit is configured to acquire the time information when the counted value reaches the threshold.

(5)

The light-receiving apparatus according to any one of (1) to (3) described above, wherein the acquiring unit is configured to acquire the time information indicating a time at which the counted value had reached the threshold based on a time from a time point at which the counted value had reached the threshold to a time point of an end of the exposure period.

(6)

The light-receiving apparatus according to (5) described above, wherein the counting unit is configured to count an update number of times that represents the number of times the time information is updated from a time point at which the counted value had reached the threshold to a time point of an end of the exposure period, and the acquiring unit is configured to acquire the time information indicating a time at which the counted value had reached the threshold based on the update number of times.

(7)

The light-receiving apparatus according to (5) described above, wherein the counting unit is configured to output a synthesized counted value obtained by counting the number of times an update number of times that represents the number of times the time information is updated and the detection number of times are synthesized by a synthesizing unit, and the acquiring unit is configured to obtain, based on a time required by the synthesized counted value to reach the threshold, the detection number of times during the time by subtracting the update number of times from the synthesized counted value.

(8)

The light-receiving apparatus according to any one of (5) to (7) described above, wherein the counting unit is configured to output the counted value based on a value obtained by having a counter count the detection number of times, the counter being configured to perform counting for every plurality of pulse inputs that are input to one input terminal.

(9)

The light-receiving apparatus according to (7) described above, wherein the synthesizing unit is configured to synthesize the update number of times and the detection number of times using a logic circuit.

(10)

The light-receiving apparatus according to any one of (1) to (9) described above, wherein the counting unit is configured to perform the counting for every divided exposure period obtained by dividing the exposure period, and the acquiring unit is configured to acquire, when the counted value reaches the threshold in each of the divided exposure periods, each time that the threshold is reached as the time information for each divided exposure period.

(11)

The light-receiving apparatus according to (10) described above, wherein the counting unit is configured to perform the counting for each of the divided exposure periods obtained by dividing the exposure period so as to include periods with different lengths.

(12)

The light-receiving apparatus according to (10) or (11) described above, wherein the counting unit is configured to perform the counting for each of the divided exposure periods when an average time interval of incidence of the photon to the light-receiving element is equal to or less than a predetermined time interval.

(13)

The light-receiving apparatus according to any one of (10) to (12) described above, wherein the acquiring unit is configured to acquire the time information using the threshold that differs between at least two divided exposure periods among the divided exposure periods.

(14)

The light-receiving apparatus according to any one of (1) to (13) described above, wherein the acquiring unit is configured to stop an operation of the detection by the light-receiving element when the counted value reaches the threshold before the exposure period elapses.

(15)

The light-receiving apparatus according to any one of (1) to (4) described above, wherein the counting unit includes a function for acquiring the time information by the acquiring unit and is configured to execute a function for counting and the function for acquiring by switching between the functions.

(16)
The light-receiving apparatus according to any one of (1) to (15) described above, wherein
the light-receiving element is arranged in a two-dimensional grid pattern, and the setting unit is
provided in each of the light-receiving elements being arranged in the two-dimensional grid pattern.

(17)
The light-receiving apparatus according to any one of (1) to (15) described above, wherein
the light-receiving element is arranged in a two-dimensional grid pattern, and the setting unit is
provided in each group that includes a plurality of the light-receiving elements in an array of the two-dimensional grid pattern.

(18)
The light-receiving apparatus according to (17) described above, wherein the setting unit is
provided in each of the groups in row units of the array.

(18)
The light-receiving apparatus according to (17) described above, wherein the setting unit is
provided in each of the groups that include a plurality of rows of the array.

(19)
The light-receiving apparatus according to (17) described above, wherein
the setting unit is
provided in each of the groups in a region having been divided in plurality in a row direction of the array.

(20)
The light-receiving apparatus according to (17) described above, wherein
the light-receiving element is provided with a color filter, and
the setting unit is
provided in each of the groups that include the light-receiving elements provided with the color filter of a same color.

(21)
The light-receiving apparatus according to (17) described above, wherein
the setting unit is
provided with respect to the group that includes all of the light-receiving elements arranged in the two-dimensional grid pattern.

(22)
The light-receiving apparatus according to any one of (1) to (21) described above, wherein
the light-receiving element is a single photon avalanche diode.

(23)
The light-receiving apparatus according to any one of (1) to (22) described above, wherein
the counting unit has
a plurality of counters respectively configured to perform counting of each bit, and each counter configured to perform counting of each bit that equals or exceeds a predetermined bit among the plurality of counters is shared by a plurality of the light-receiving elements.

(24)
The light-receiving apparatus according to (23) described above, including
a first substrate and a second substrate to be stacked on the first substrate,
the light-receiving element being arranged on the first substrate,
at least the counting unit being arranged on the second substrate, wherein
in the counting unit,
each counter that performs counting of each bit that is less than a predetermined bit among the plurality of counters is arranged at a position that corresponds to the light-receiving element on the second substrate.

(25)
The light-receiving apparatus according to any one of (1) to (4) described above, wherein
the setting unit is configured to
express the time information using a Gray code.

(26)
A light-receiving apparatus, including:
a counting unit configured to measure the number of times incidence of a photon to a light-receiving element has been detected within an exposure period and to output a counted value;
a luminance value updating unit configured to update a luminance value; and
an acquiring unit configured to acquire, when the counted value reaches a threshold before the exposure period elapses, the luminance value that corresponds to a reach time at which the threshold had been reached.

(27)
The light-receiving apparatus according to (26) described above, wherein the acquiring unit is configured to
acquire, as the luminance value, a value of luminance by the photon that is incident from a time point at which a predetermined time has elapsed from a start time of the exposure period to an end time of the exposure period, the value having been predicted based on the reach time.

(28)
The light-receiving apparatus according to (26) or (27) described above, wherein the luminance value updating unit is configured to
update the luminance value in accordance with an illuminance in the exposure period and an elapsed time from a start time of the exposure period.

(29)
The light-receiving apparatus according to (28) described above, wherein the luminance value updating unit is configured to
update the luminance value for each cycle and start update of the luminance value at a time point where a prescribed time has elapsed from a start time of the exposure period and update the luminance value at the time point in a shortest cycle within the exposure period.

(30)
The light-receiving apparatus according to any one of (26) to (29) described above, wherein
the counting unit is configured to
perform the counting for every divided exposure period obtained by dividing the exposure period, and
the acquiring unit is configured to
acquire, when the counted value reaches the threshold in each of the divided exposure periods, each of the luminance values that corresponds to the reach time in each of the divided exposure periods as the time information for each divided exposure period.

(31)
The light-receiving apparatus according to (30) described above, wherein
the counting unit is configured to
perform the counting for each of the divided exposure periods obtained by dividing the exposure period so as to include periods with different lengths.

(32)

The light-receiving apparatus according to (30) described above, wherein the counting unit is configured to perform the counting for each of the divided exposure periods when an average time interval of incidence of the photon to the light-receiving element is equal to or less than a predetermined time interval.

(33)

The light-receiving apparatus according to any one of (30) to (32) described above, wherein the acquiring unit is configured to acquire the time information using the threshold that differs between at least two divided exposure periods among the divided exposure periods.

(34)

The light-receiving apparatus according to any one of (26) to (33) described above, wherein the acquiring unit is configured to stop an operation of the detection by the light-receiving element when the counted value reaches the threshold before the exposure period elapses.

(35)

The light-receiving apparatus according to any one of (26) to (34) described above, wherein the counting unit includes a function for acquiring the luminance value by the acquiring unit and is configured to execute a function for counting and the function for acquiring by switching between the functions.

(36)

The light-receiving apparatus according to any one of (26) to (35) described above, wherein the light-receiving element is arranged in a two-dimensional grid pattern, and the luminance value updating unit is provided in each of the light-receiving elements being arranged in the two-dimensional grid pattern.

(37)

The light-receiving apparatus according to any one of (26) to (35) described above, wherein the light-receiving element is arranged in a two-dimensional grid pattern, and the luminance value updating unit is provided in each group that includes a plurality of the light-receiving elements in an array of the two-dimensional grid pattern.

(38)

The light-receiving apparatus according to (37) described above, wherein the luminance value updating unit is provided in each of the groups in row units of the array.

(39)

The light-receiving apparatus according to (37) described above, wherein the luminance value updating unit is provided in each of the groups that include a plurality of rows of the array.

(40)

The light-receiving apparatus according to (37) described above, wherein the luminance value updating unit is provided in each of the groups in a region having been divided in plurality in a row direction of the array.

(41)

The light-receiving apparatus according to (37) described above, wherein the light-receiving element is provided with a color filter, and the luminance value updating unit is provided in each of the groups that include the light-receiving elements provided with the color filter of a same color.

(42)

The light-receiving apparatus according to (37) described above, wherein the luminance value updating unit is provided with respect to the group that includes all of the light-receiving elements arranged in the two-dimensional grid pattern.

(43)

The light-receiving apparatus according to any one of (26) to (42) described above, wherein the light-receiving element is a single photon avalanche diode.

(44)

The light-receiving apparatus according to any one of (26) to (43) described above, wherein the counting unit has a plurality of counters respectively configured to perform counting of each bit, and each counter configured to perform counting of each bit that equals or exceeds a predetermined bit among the plurality of counters is shared by a plurality of the light-receiving elements.

(45)

The light-receiving apparatus according to (44) described above, including a first substrate and a second substrate to be stacked on the first substrate, the light-receiving element being arranged on the first substrate, at least the counting unit being arranged on the second substrate, wherein in the counting unit, each counter that performs counting of each bit that is less than a predetermined bit among the plurality of counters is arranged at a position that corresponds to the light-receiving element on the second substrate.

REFERENCE SIGNS LIST

1$a$, 1$b$, 1$c$, 1$d$ Light-receiving apparatus
10 Pixel
11 Counting unit
12 Time code generating unit
13 Acquiring unit
20, 20 Luminance value code generating unit
100, 100$a$, 100$b$, 100$c$, 100$d$, 100$a$', 100$b$', 100$c$', 100$d$', 100R, 100G, 100$G_1$, 100$G_2$, 100B, 100', 100R', 100G', 100$G_1$', 100$G_2$', 100B' Pixel circuit
110 Photoelectric conversion element
111$a$, 111$b$, 111$b$', 111$c$ Signal processing unit
112, 112$a$, 112$b$, 112$c$, 112$d$, 112$e$, 112$f_1$, 112$f_2$, 112$f_3$, 112$g$, 112$h$, 112$i$, 112$k$, 1120, 1120', 1120$a_1$, 1120$a_2$, 1120$a_3$, 1120$b_1$, 1120$b_2$, 1130 Counter
112$j$ Digital counter
113$a$, 113$a$-1, 113$a$-2, 113$a$-3, 113$a(a)$, 113$a(b)$, 113$a(c)$, 113$a(d)$, 113$b$, 113$b$-1, 113$b$-2, 113$b$-3, 113$c$ Threshold determining unit
114 Memory
120, 120' TC generating unit 121 Time counter
122 Frequency division set value storage unit
123 Frequency determining unit
124, 127 Code generating unit
125 Clock generating unit
126 PLL circuit
141, 142 Signal line
150, 150', 150R$_1$, 150G$_{11}$, 150G$_{12}$, 150G$_{21}$, 150G$_{22}$, 150B$_1$, 150B$_2$, 150R$_1$', 150G$_{11}$', 150G$_{12}$', 150G$_{21}$', 150G$_{22}$', 150B$_1$', 150B$_2$ Group
200 LC generating unit
300$_1$, 300$_2$, 301, 302$_1$, 302$_2$, 302$_3$, 302$_4$, 302$_5$, 303$_1$, 303$_2$, 303$_3$ Divided exposure period Tsh_div
400 Selector
402 1-bit counter
410, 410a, 410b, 410c, 410d, 410e, 410f, 410g, 410h Synthesizing unit
1003 Control unit
1125a, 1125b Analog counter
1126 Digital counter
1131, 1131' Comparator circuit
1132 AND circuit
2000 Light-receiving chip
2001 Pixel array unit
2010 Logic chip
2011 Logic array unit
2013 Element control unit
2013a, 2013a', 2013a" Vertical control unit
2013b Horizontal control unit
2013c Signal processing unit
2014 Logic circuit

The invention claimed is:

1. A light-receiving apparatus, comprising:
a counting unit configured to measure a detection number of times that represents the number of times incidence of a photon to a light-receiving element has been detected within an exposure period and to output a counted value;
a time code generating unit configured to set a cycle of updating time information in accordance with an elapsed time during the exposure period, the cycle being one of a plurality of cycles respectively corresponding to illumination categories; and
an acquiring unit configured to acquire the time information indicating a time at which the counted value reaches a threshold before the exposure period elapses.

2. The light-receiving apparatus according to claim 1, wherein the time code generating unit is configured to set the cycle according to a time point where a prescribed time has elapsed from a start time of the exposure period to a time point of a shortest cycle of the plurality of cycles within which the counted value reaches the threshold during the exposure period.

3. The light-receiving apparatus according to claim 1, wherein the time code generating unit is configured to output a code that changes in accordance with the cycle as the time information.

4. The light-receiving apparatus according to claim 1, wherein the acquiring unit is configured to acquire the time information when the counted value reaches the threshold.

5. The light-receiving apparatus according to claim 1, wherein the acquiring unit is configured to acquire the time information indicating a time at which the counted value had reached the threshold based on a time from a time point at which the counted value had reached the threshold to a time point of an end of the exposure period.

6. The light-receiving apparatus according to claim 5, wherein
the counting unit is configured to count an update number of times that represents the number of times the time information is updated from a time point at which the counted value had reached the threshold to a time point of an end of the exposure period, and
the acquiring unit is configured to acquire the time information indicating a time at which the counted value had reached the threshold based on the update number of times.

7. The light-receiving apparatus according to claim 5, wherein
the counting unit is configured to output a synthesized counted value obtained by counting the number of times an update number of times that represents the number of times the time information is updated and the detection number of times are synthesized by a synthesizing unit, and
the acquiring unit is configured to obtain, based on a time required by the synthesized counted value to reach the threshold, the detection number of times during the time by subtracting the update number of times from the synthesized counted value.

8. The light-receiving apparatus according to claim 5, wherein the counting unit is configured to output the counted value based on a value obtained by having a counter count the detection number of times, the counter being configured to perform counting for every plurality of pulse inputs that are input to one input terminal.

9. The light-receiving apparatus according to claim 7, wherein the synthesizing unit is configured to synthesize the update number of times and the detection frequency using a logic circuit.

10. The light-receiving apparatus according to claim 1, wherein
the counting unit is configured to perform the counting for every divided exposure period obtained by dividing the exposure period, and
the acquiring unit is configured to acquire, when the counted value reaches the threshold in each of the divided exposure periods, each time that the threshold is reached as the time information for each divided exposure period.

11. The light-receiving apparatus according to claim 10, wherein the counting unit is configured to perform the counting for each of the divided exposure periods obtained by dividing the exposure period so as to include periods with different lengths.

12. The light-receiving apparatus according to claim 1, wherein the acquiring unit is configured to stop an operation of the detection by the light-receiving element when the counted value reaches the threshold before the exposure period elapses.

13. The light-receiving apparatus according to claim 1, wherein the counting unit includes a function for acquiring the time information by the acquiring unit and is configured to execute a function for counting and the function for acquiring by switching between the functions.

14. The light-receiving apparatus according to claim 1, wherein
the light-receiving element one of a plurality of light-receiving elements arranged in a two-dimensional array, the plurality of light-receiving elements being divided into groups, and the time code generating unit is one of a plurality of time code generating units respectively corresponding to each of the groups of the plurality of light-receiving elements.

15. The light-receiving apparatus according to claim 14, wherein each of the light-receiving elements is provided with a color filter, and the groups are defined according to the light-receiving elements that have the color filter of a same color.

16. The light-receiving apparatus according to claim 1, wherein the light-receiving element is a single photon avalanche diode.

17. A light-receiving apparatus, comprising:

a memory storing program code, and a processor configured to execute the program code to perform operations comprising:

counting a number of times incidence of a photon to a light-receiving element has been detected within an exposure period as a counted value and outputting the counted value;

setting a cycle of updating time information in accordance with an elapsed time during the exposure period, the cycle being one of a plurality of cycles respectively corresponding to illumination categories; and acquiring time information indicating a time at which the counted value reaches a threshold before the exposure period elapses.

18. The light-receiving apparatus according to claim 17, wherein the operations further comprise:

setting the cycle according to a time point where a prescribed time has elapsed from a start time of the exposure period to a time point of a shortest cycle of the plurality of cycles within which the counted value reaches the threshold during the exposure period.

19. A non-transitory computer readable medium storing program code for controlling a light-receiving apparatus, the program code being executable by a processor to perform operations comprising:

counting a number of times incidence of a photon to a light-receiving element has been detected within an exposure period as a counted value and outputting the counted value;

setting a cycle of updating time information in accordance with an elapsed time during the exposure period, the cycle being one of a plurality of cycles respectively corresponding to illumination categories; and acquiring time information indicating a time at which the counted value reaches a threshold before the exposure period elapses.

20. The non-transitory computer readable medium according to claim 19, wherein the operations further comprise:

setting the cycle according to a time point where a prescribed time has elapsed from a start time of the exposure period to a time point of a shortest cycle of the plurality of cycles within which the counted value reaches the threshold during the exposure period.

* * * * *